US012744514B2

(12) United States Patent
Sage et al.

(10) Patent No.: US 12,744,514 B2
(45) Date of Patent: Sep. 22, 2026

(54) MEMS RESONATOR

(71) Applicant: KYOCERA Technologies Oy, Espoo (FI)

(72) Inventors: Eric Sage, Espoo (FI); Aarne Oja, Espoo (FI); Hannu Vesterinen, Espoo (FI)

(73) Assignee: KYOCERA Technologies Oy, Espoo (FI)

( * ) Notice: Subject to any disclaimer, the term of this patent is extended or adjusted under 35 U.S.C. 154(b) by 191 days.

(21) Appl. No.: 18/718,827

(22) PCT Filed: Dec. 21, 2022

(86) PCT No.: PCT/FI2022/050863
§ 371 (c)(1),
(2) Date: Jun. 12, 2024

(87) PCT Pub. No.: WO2023/118664
PCT Pub. Date: Jun. 29, 2023

(65) Prior Publication Data

US 2025/0055440 A1 Feb. 13, 2025

(30) Foreign Application Priority Data

Dec. 23, 2021 (FI) ...................................... 20216347

(51) Int. Cl.
*H03H 9/24* (2006.01)
*H03H 9/02* (2006.01)
*H03H 9/15* (2006.01)

(52) U.S. Cl.
CPC ............ *H03H 9/2452* (2013.01); *H03H 9/15* (2013.01); *H03H 9/02338* (2013.01);
(Continued)

(58) Field of Classification Search
CPC .... H03H 9/2452; H03H 9/15; H03H 9/02338; H03H 2009/02503; H03H 2009/155;
(Continued)

(56) References Cited

U.S. PATENT DOCUMENTS 4,555,682 A * 11/1985 Gounji .................. H03H 9/562 333/186
2011/0121682 A1 5/2011 Mohanty et al.
2011/0187227 A1* 8/2011 Chen ................. H03H 9/02535 29/25.35
2012/0038431 A1* 2/2012 Jaakkola ................ H03H 9/505 257/E21.598
(Continued)

FOREIGN PATENT DOCUMENTS

WO 2019155119 8/2019
WO 2019155120 8/2019

OTHER PUBLICATIONS

Chellasivalingam, M. et al. Ultra-fine Particulate Detection using Mode-localized MEMS Resonators. 2019. IEEE. 978-1-5386-8305-7/19/$31.00.

(Continued)

*Primary Examiner* — Jorge L Salazar, Jr.
(74) *Attorney, Agent, or Firm* — Espatent Oy

(57) ABSTRACT

A MEMS (microelectromechanical system) resonator assembly (100), comprising a support structure (102), a resonator element (101) suspended to the support structure (102), and an actuator for exciting the resonator element (101) to a resonance mode. The resonator element (101) comprises two bulk acoustic resonators (110*a*, 110*b*) and a flexural mode resonator (120). The flexural mode resonator (120) mechanically connects the two bulk acoustic resonators (110*a*, 110*b*), and the MEMS resonator assembly (100) is configured to vibrate in a collective resonance mode in which motions of the two bulk acoustic resonators (110*a*, 110*b*) are substantially in the same or 180 degrees shifted phase with respect to each other.

19 Claims, 42 Drawing Sheets

(52) U.S. Cl.
CPC ............. *H03H 2009/02503* (2013.01); *H03H 2009/155* (2013.01); *H03H 2009/241* (2013.01)

(58) Field of Classification Search
CPC ........... H03H 2009/241; H03H 9/2447; H03H 9/505; H03H 2009/02322; H03H 2009/0233; H03H 2009/02385; H03H 9/02244; H03H 3/0072; H03H 9/2405; B81B 7/00
USPC .......................................................... 333/186
See application file for complete search history.

(56) References Cited

U.S. PATENT DOCUMENTS

| | | | |
|---|---|---|---|
| 2013/0057115 | A1 | 3/2013 | Saito et al. |
| 2016/0047728 | A1 | 2/2016 | Wilson et al. |
| 2020/0304093 | A1 | 9/2020 | Jaakkola |

OTHER PUBLICATIONS

Shalaby, M. M. et al. Design of Spring Coupling for High-Q High-Frequency MEMS Filters for Wireless Applications. IEEE Transactions on Industrial Electronics, vol. 56, No. 4, Apr. 2009, pp. 1022-1030.

Bannon F. D. et al. High-Q HF Microelectromechanical Filters. IEEE Journal of Solid-State Circuits, vol. 35, No. 4 , Apr. 2000, pp. 512-526.

Brand O. et al. Resonant MEMS: fundamentals, implementation and application. In: Advanced Micro & Nanosystems. 2015. Cover page and table of contents.

Demirci M. U. et al. Mechanically corner-coupled square microresonator array for reduced series motional resistance. Dig. of Tech. Papers, the 12th Int. Conf. on Solid-State Sensors & Actuators (Transducers'03), Boston, Massachussets, Jun. 8-12, 2003, pp. 955-958.

Abdolvand R. et al. Micromachined Resonators: A Review. Micromachines 2016, 7, 160; doi:10.3390/mi7090160. pp. 1-56.

Jaakkola A. et al. Second Order Temperature Compensated Piezoelectrically Driven 23 MHz Heavily Doped. Silicon Resonators with ±10 ppm Temperature Stability. Published in: 2015 Joint Conference of the IEEE International Frequency Control Symposium & the European Frequency and Time Forum) DOI: 10.1109/FCS.2015.7138871.

Chen W. et al. A Temperature-Stable and Low Impedance Piezoelectric MEMS Resonator for Drop-in Replacement of Quartz Crystals. IEEE Electron Device Letters, vol. 42, No. 9, Sep. 2021, pp. 1382-1385.

* cited by examiner

MEMS RESONATOR

FIELD OF THE INVENTION

The invention relates to microelectromechanical system, MEMS, resonators.

BACKGROUND OF THE INVENTION

This section illustrates useful background information without admission of any technique described herein representative of the state of the art.

Reaching a low equivalent series resistance (ESR) for a MEMS resonator may challenging and especially so for resonators with a small size. For bulk acoustic resonators, resonance frequency is inversely proportional with some of its lateral dimensions, which can be defined as frequency-defining dimensions. For length-extensional (LE) resonators, beam length is the frequency-defining dimension. To reach high resonance frequencies, the frequency-defining dimensions are shrunk. However, at the same time as the LE resonators become small in their length due to the frequency requirement their width should be extended to reach a sufficiently low equivalent series resistance.

The simultaneous need to shrink in one dimension and to enlarge in the other causes certain design challenges.

SUMMARY

It is an object of certain embodiments of the invention to provide a MEMS resonator with a low equivalent series resistance (ESR) and/or to increase design freedom in the layout of a resonator element on a die, or at least to provide an alternative to existing technology.

According to a first example aspect of the invention there is provided a MEMS (microelectromechanical system) resonator assembly, comprising:

- a support structure;
- a resonator element suspended to the support structure; and
- an actuator for exciting the resonator element to a resonance mode, wherein the resonator element comprises two bulk acoustic resonators and a flexural mode resonator, wherein the flexural mode resonator mechanically connects the two bulk acoustic resonators, and the MEMS resonator assembly is configured to vibrate in a collective resonance mode in which motions of the two bulk acoustic resonators are substantially in the same or 180 degrees shifted phase with respect to each other.

In certain embodiments, at least one of the two bulk acoustic resonators is a length-extensional mode resonator ("LE resonator"), an interconnected length-extensional resonator assembly, a width-extensional mode resonator, a square-extensional mode resonator, or a Lame resonator.

In certain embodiments, one extending end or one extending side of a first of the two bulk acoustic resonators is connected by the flexural mode resonator with one extending end or one extending side of a second of the two bulk acoustic resonators.

In certain embodiments, the bulk acoustic resonators resonate in a direction of vibration, and the flexural mode resonator is a beam resonator the longest dimension of which being oriented perpendicular to said direction of vibration.

In certain embodiments, a Nth overtone frequency of the flexural mode resonator substantially equals the frequency of the said collective resonance mode.

In certain embodiments, the flexural mode resonator is an in-plane flexural beam resonator.

In certain embodiments, the bulk acoustic resonators are in-plane resonators.

In certain embodiments, the flexural mode resonator is mechanically connected to the bulk acoustic resonators at anti-nodal points of the bulk acoustic resonators.

In certain embodiments, the bulk acoustic resonators are mechanically connected to the flexural mode resonator at anti-nodal points of the flexural mode resonator.

In certain embodiments, the flexural mode resonator is mechanically connected to a first of the two bulk acoustic resonators at one or more connection points on a first side of the flexural mode resonator and to a second of the two bulk acoustic resonators at one or more connection points on a second, opposite, side of the flexural mode resonator.

In certain embodiments, the flexural mode resonator is mechanically connected to a first of the two bulk acoustic resonators at one or more connection points on one side of the flexural mode resonator and to a second of the two bulk acoustic resonators at one or more connection points on the same side of the flexural mode resonator. In certain such embodiments, a first end or first side of the first bulk acoustic resonator is connected to the flexural mode resonator, and a first end or first side of the second bulk acoustic resonator is connected to the flexural mode resonator.

In certain embodiments, the resonance mode shape of the flexural mode resonator has two types of anti-nodal points wherein anti-nodal point(s) of the first type has/have a positive displacement along an axis of vibration and at least one of them is a connection point for a mechanical connection to a first of the two bulk acoustic resonators, and anti-nodal point(s) of the second type has/have a negative displacement along the said axis of vibration and at least one of them is a connection point for a mechanical connection to a second of the two bulk acoustic resonators. In certain such embodiments, given the wavelike nature of the flexural vibration, it follows that along the beam length, the position of the connector element (if any) is switched from one side to the other side every $\lambda/2$ where $\lambda$ is the flexural resonance wavelength.

In certain embodiments, the actuator is a piezoelectric or an electrostatic actuator.

In certain embodiments, a distance between the two bulk acoustic resonators is 50 μm or less, such as 20 μm or less.

In certain embodiments, more than 50% of the mass of the resonator element consists of single-crystalline silicon.

In certain embodiments, a first of the two bulk acoustic resonators and the flexural mode resonator are connected by a first number of connector elements and a second of the two bulk acoustic resonators and the flexural mode resonator are connected by a second number of connector elements, wherein the first number deviates from the second number.

In certain embodiments, a first of the two bulk acoustic resonators and the flexural mode resonator are connected by a first number of connector elements and a second of the two bulk acoustic resonators and the flexural mode resonator are connected by a second number of connector elements, wherein the first number is equal to the second number.

In certain embodiments, a cavity separates the resonator element from the support structure.

In certain embodiments, the resonator element comprises a layer of piezoelectric AlN, Sc-doped AlN, ZnO, $LiNbO_3$, or $LiTaO_3$.

In certain embodiments, the resonator element comprises a layer of piezoelectric with the thickness in the range from 0.5 μm to 4 μm, such as from 1 μm to 2 μm.

In certain embodiments, a first of the two bulk acoustic resonators and a second of the two bulk acoustic resonators are tethered to the same support structure which is formed within the plane of the resonator element along a line which is in the middle of the first and second bulk acoustic resonators.

In certain embodiments, a first of the two bulk acoustic resonators resonates in a first direction of vibration and a second of the two bulk acoustic resonators resonates in a second direction of vibration perpendicular to the first direction of vibration.

In certain embodiments, the flexural mode resonator comprises a material portion which has a form of a rectangular frame.

In certain embodiments, the frequency of the said collective resonance mode is in the range from 7 MHz to 160 MHz such as in the range from 15 MHz to 110 MHz.

In certain embodiments, the flexural mode resonator in between a first and a second bulk acoustic resonator (of the two bulk acoustic resonators) mechanically connects the first and the second bulk acoustic resonator via anti-nodal points of the flexural mode resonator.

In certain embodiments, the first and second bulk acoustic resonators comprise interconnected resonator beams, wherein adjacent resonator beams are connected by at least one mechanical connection (or coupling) element.

In certain embodiments, the resonating beams of the first and second bulk acoustic resonators and an elongated resonating element (or beam) of the flexural mode resonator are aligned along a respective <100> crystalline direction of a single-crystalline silicon layer within the resonator element, or deviate at most 15 degrees from said respective <100> direction.

In certain embodiments, the MEMS resonator assembly comprises two bulk acoustic resonators having interconnected resonator beams configured to resonate in in-plane length extensional (LE) resonance mode, and at least one flexural mode resonator mechanically connected to the bulk acoustic resonators via connector elements positioned on some of the anti-nodal points of the flexural mode resonator, and wherein the two bulk acoustic resonators resonate in-phase.

In certain embodiments, the MEMS resonator assembly comprises two bulk acoustic resonators each bulk acoustic resonator being composed of one or more length extensional beams disposed in parallel, side by side along their length dimension, and coupled along their width (thereby forming an interconnected length-extensional resonator assembly).

In certain embodiments, two or more bulk acoustic resonators are disposed in parallel, side by side along their length dimension so that during in-phase vibration two distal edges of each bulk acoustic resonator are cyclically going toward or away from each other.

In certain embodiments, an in-plane flexural mode resonator is positioned between each pair of extensional-mode resonators and its length direction is perpendicular to the vibration direction of the extensional-mode resonators.

In certain embodiments, assuming free boundary conditions, the flexural mode resonator(s) have substantially the same resonance frequency as the extensional-mode resonators. This frequency can be its fundamental resonance frequency or Nth overtone. In certain embodiments, the in-plane flexural vibration features N+1 nodal points and N+2 anti-nodal points. In certain embodiments, frequency matching between the flexural mode resonator(s) and the extensional-mode resonators is achieved through designing appropriate beam lengths and widths.

In certain embodiments, the flexural mode resonator is mechanically coupled to extensional-mode resonators through connector elements placed on at least one connection point along both sides of the flexural mode resonator.

In certain embodiments, connection points of the said flexural mode resonator are at anti-nodal points of the flexural mode resonator and at anti-nodal points of the (connected) bulk acoustic resonators.

In certain embodiments, the distance between one extensional-mode resonator and its neighboring extensional-mode resonator equals the width of the flexural mode resonator plus twice the connector element length.

In certain embodiments, the extensional-mode resonators comprise resonating material portions aligned (substantially) along a <100> crystalline direction (such as [100]) of a single-crystalline silicon layer within the resonator element. Furthermore, in certain embodiments, the flexural coupling elements (flexural mode resonators) are aligned (substantially) along another <100> crystalline direction (such as [010]).

Different non-binding example aspects and embodiments have been presented in the foregoing. The above embodiments and embodiments described later in this description are used to explain selected aspects or steps that may be utilized in implementations of the present invention. It should be appreciated that corresponding embodiments apply to other example aspects as well. Any appropriate combinations of the embodiments can be formed.

BRIEF DESCRIPTION OF THE DRAWINGS

The invention will now be described, by way of example only, with reference to the accompanying drawings, in which.

DETAILED DESCRIPTION

In the following description, like reference signs denote like elements.

In certain embodiments disclosed herein, a MEMS resonator assembly comprises at least two bulk acoustic resonators which are coupled using one or more flexural resonator(s) so that the MEMS resonator assembly can resonate in a collective resonance mode in which the bulk acoustic resonators resonate in the same or 180 degrees shifted phase with respect to each other.

The bulk acoustic resonator(s) which may be members of the MEMS resonator assembly include, e.g., length-extensional (LE), width-extensional (WE), square-extensional (SE), interconnected length-extensional mode resonators, and Lame mode resonators. Synchronization of two or more bulk acoustic resonators makes it possible to improve the properties of the resonator assembly. In particular, ESR (equivalent series resistance) can be reduced and power-handling capacity can be increased.

In certain embodiments, a MEMS resonator assembly comprises at least two extensional-mode resonators which are coupled using one or more flexural resonator(s) so that the MEMS resonator assembly can resonate in a collective resonance mode in which the extensional-mode resonators resonate in the same or 180 degrees shifted phase with respect to each other. The extensional-mode resonators which may be members of these MEMS resonator assembly include, e.g., length-extensional (LE), width-extensional (WE), square-extensional (SE), and interconnected length-extensional mode resonators.

Figure 1:
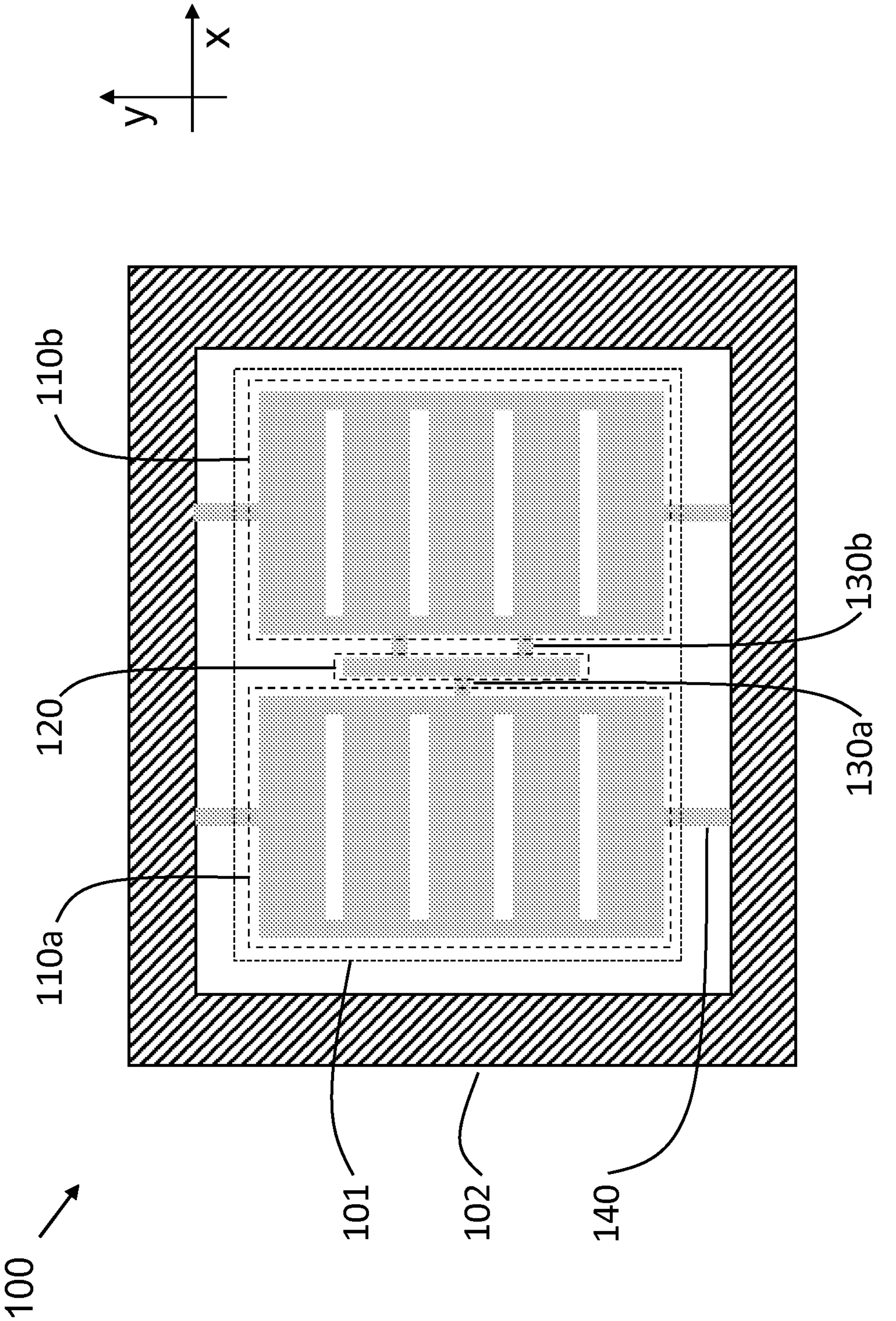
FIG. 1 shows a MEMS resonator assembly according to certain embodiments.

A MEMS resonator assembly 100 according to certain embodiments built on a die or similar is shown in FIG. 1. The resonator assembly 100 comprises a resonator element 101, a support structure 102, and a suspension element 140 which tethers the resonator element 101 to the support structure 102. (In the illustration of FIG. 1 there are four suspension elements.) The resonator element 101 comprises (at least) two extensional-mode resonators (110*a*, 110*b*), and a (one or more) flexural mode resonator 120. Further, the resonator element 101 comprises a (one or more) connector element 130*a* which connects the flexural resonator 120 to the extensional-mode resonator 110*a*, and a (one or more)

connector element 130*b* which connects the flexural resonator 120 to the extensional-mode resonator 110*b*. (In the illustration of FIG. 1 there is one connector element for the extensional-mode resonator 110*a* and two connector elements for the extensional-mode resonator 110*b*.)

In certain embodiments, at least one of the extensional-mode resonators 110*a*, 110*b* of the resonator element 101 comprises a piezoelectric thin-film actuator for exciting the said extensional-mode resonator to a resonance mode and thereby the whole resonator element to a collective resonance due to mechanical coupling of the extensional-mode resonators 110*a*, 110*b*. In certain embodiments, more than 50% of the mass of the resonator element 101 comprise material portions of single-crystalline silicon. In certain embodiments, the MEMS resonator assembly 100 comprises an electrostatic actuator for exciting at least one of the extensional-mode resonators 110*a*, 110*b* to a resonance mode and thereby the whole resonator element to a collective resonance due to mechanical coupling of the extensional-mode resonators 110*a*, 110*b*.

Figure 2A:
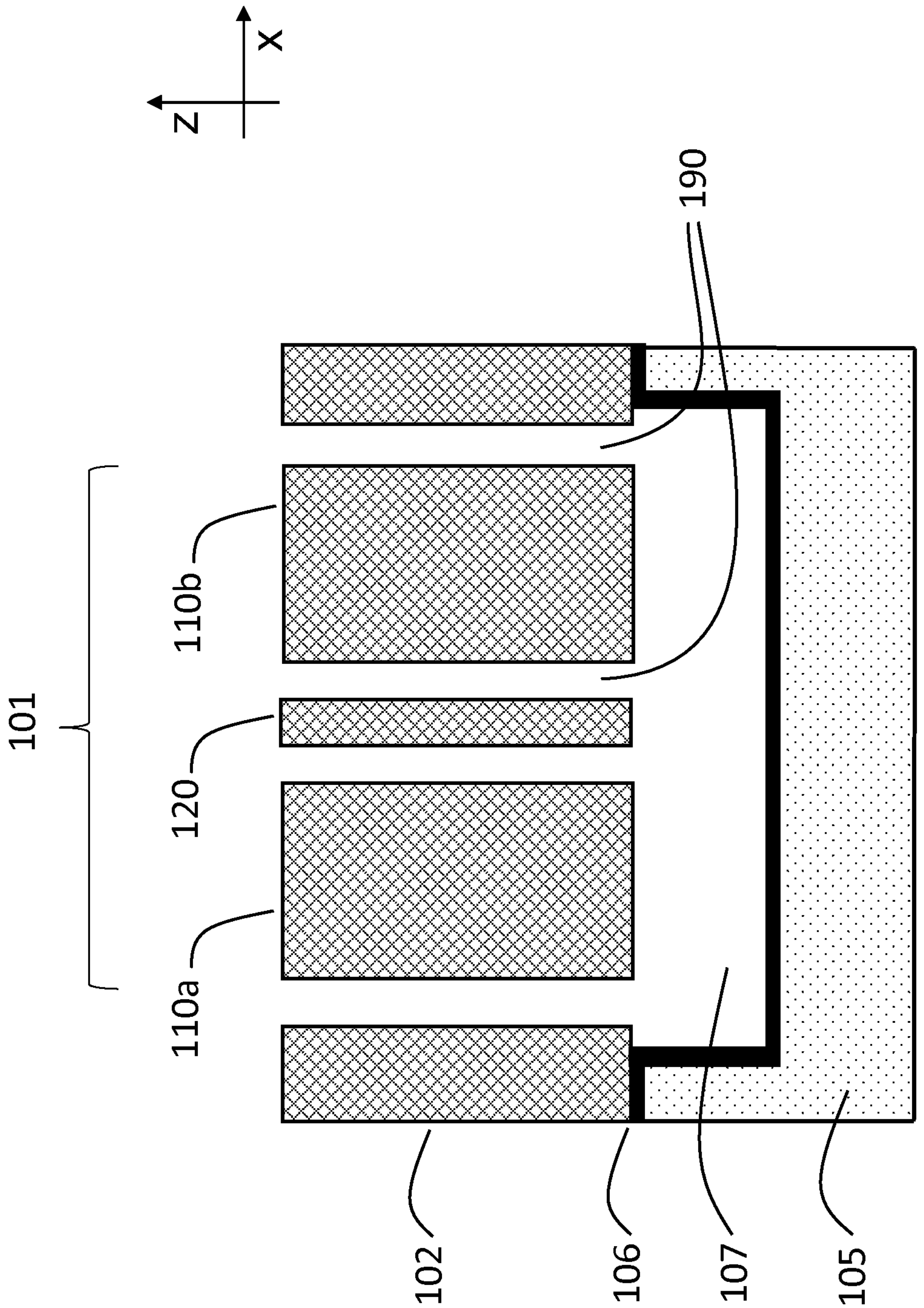
FIG. 2A shows a cross-section of the MEMS resonator assembly formed on a cavity-SOI substrate according to certain embodiments.

In certain embodiments, the MEMS resonator assembly is formed on a silicon-on-insulator substrate (SOI) or cavity-SOI substrate. A cross-section of the latter has been illustrated in FIG. 2A. The support structure 102 and the resonator element 101, comprising extensional mode resonators 110*a* and 110*b* and the flexural resonator 120, are formed in the so-called device layer of a cavity-SOI substrate. The cavity-SOI substrate comprises the handle layer 105 (typically made of single crystalline silicon) and the insulator layer 106 (typically silicon oxide). A recess has been formed in the handle layer to form a cavity 107 between the resonator element 101 and the handle layer 105. Vertical trenches 190 through the material layer(s) forming the resonator element 101 separate the extensional-mode resonators 110*a* and 110*b* from the support structure 102 and from the flexural resonator 120. The support structure 102 is solidly mounted on the handle layer 105 via the insulator layer 106. Suspension elements and connector elements are not illustrated in FIG. 2A.

Figure 2B:
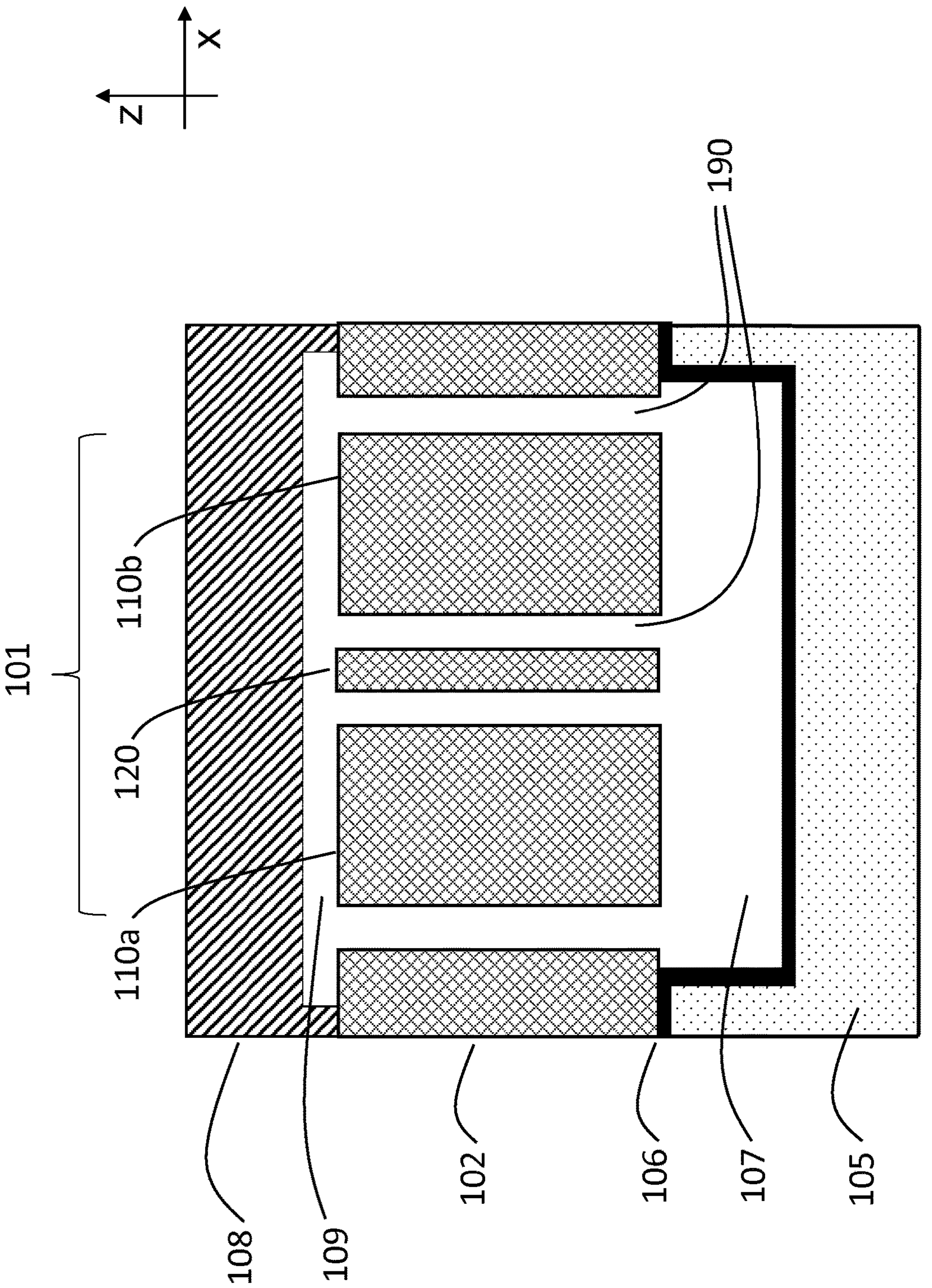
FIG. 2B shows a cross-section of the MEMS resonator assembly, wherein the MEMS resonator assembly forms part of a wafer-level-packaged component according to certain embodiments.

In certain embodiments, the MEMS resonator assembly has been enclosed in a low-pressure cavity within a ceramic package. In certain embodiment, the MEMS resonator assembly is part of a wafer-level-packaged component as illustrated in FIG. 2B. A cap 108 has been mounted on the support structure 102 to create a hermetically sealed low-pressure environment for the resonator element 101 using wafer-level-packaging technologies. A recess 109 has been formed in the cap 108 to provide a cavity between the resonator element 101 and the cap 108. Electrical connections are not shown in the illustrations of FIGS. 2A, 2B.

Figure 3A:
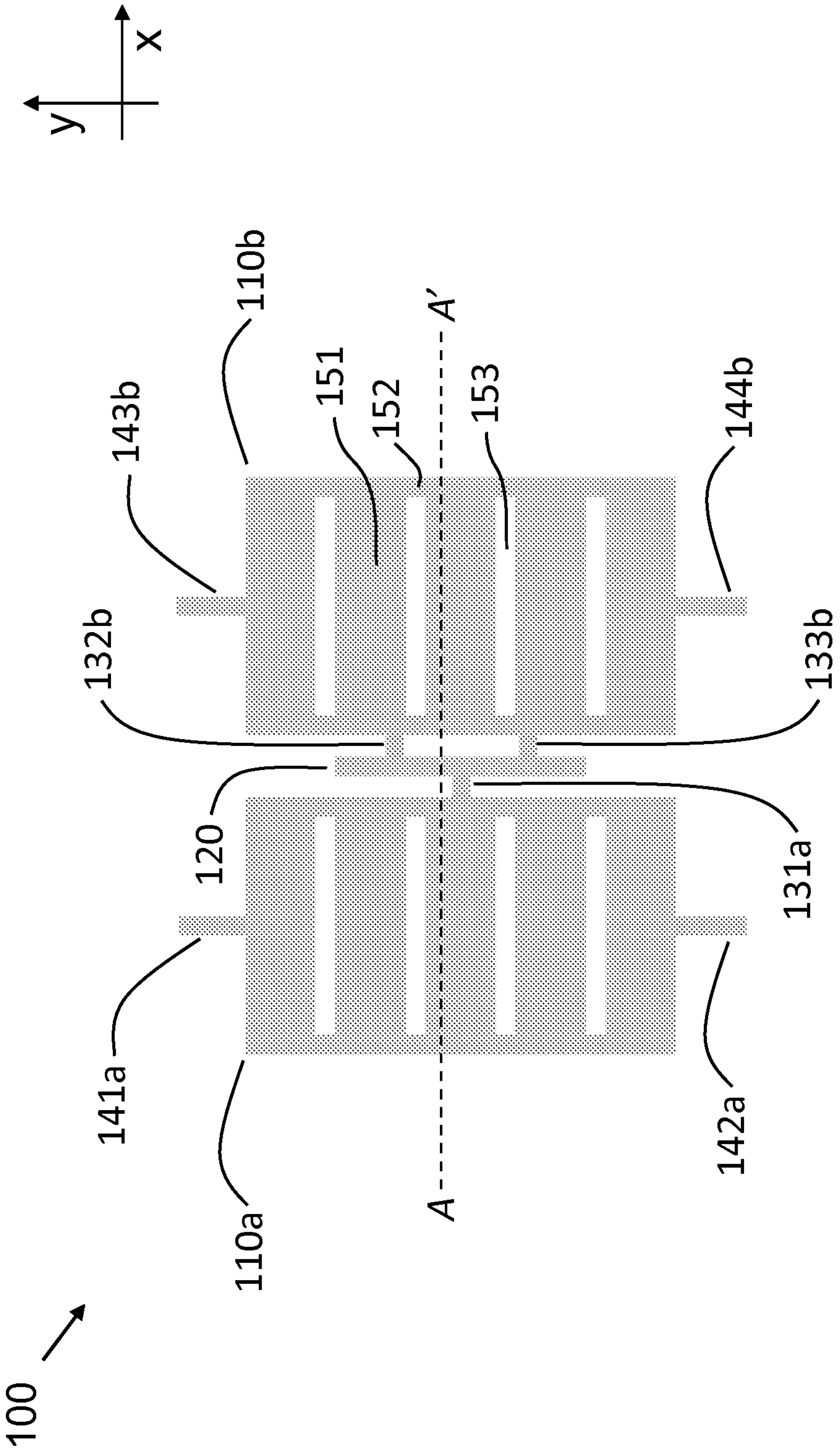
FIG. 3A shows an embodiment of the MEMS resonator assembly composed of two interconnected LE resonator assemblies and one in-plane flexural resonator designed to vibrate in its $3^{rd}$ overtone.
Figure 3B:
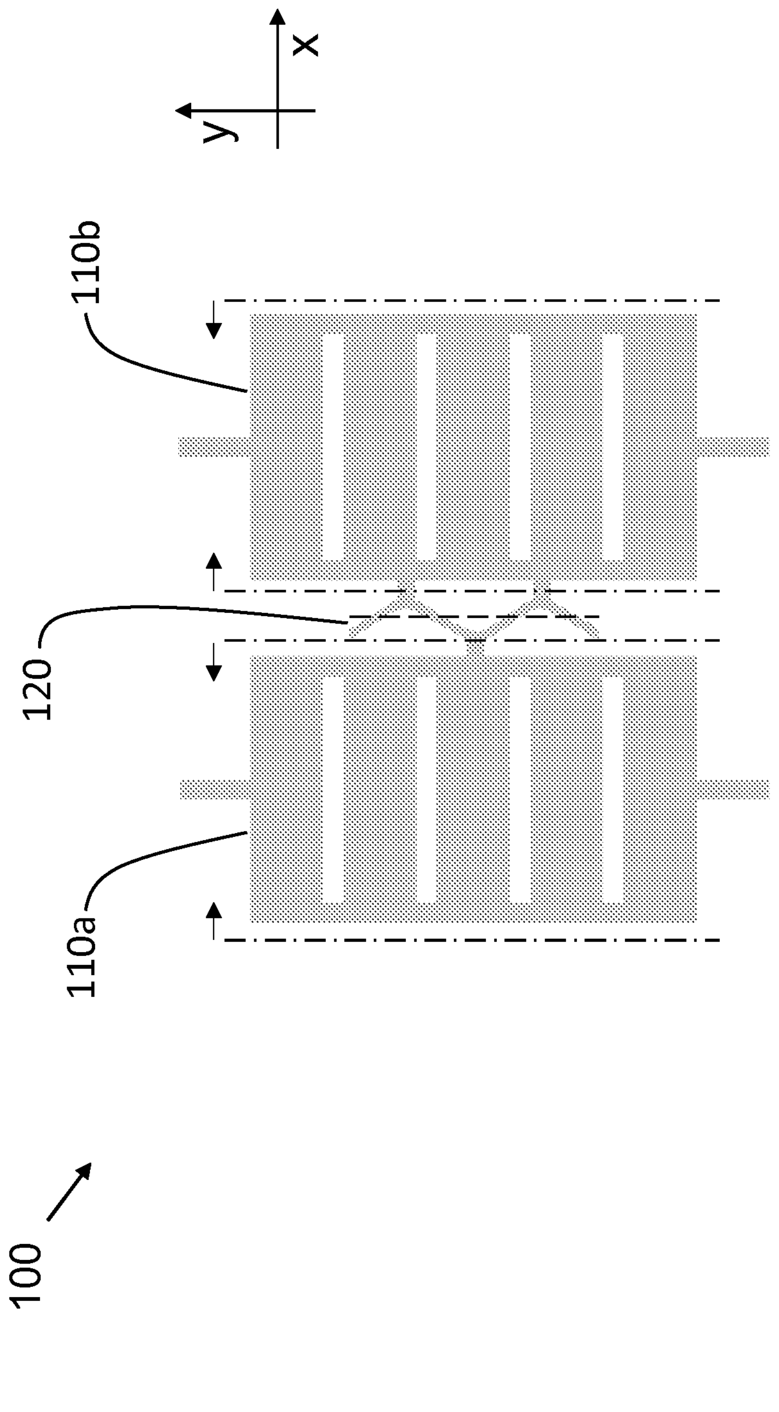
FIG. 3B shows the embodiment of FIG. 3A at maximum displacement of a vibration cycle.
Figure 3D:
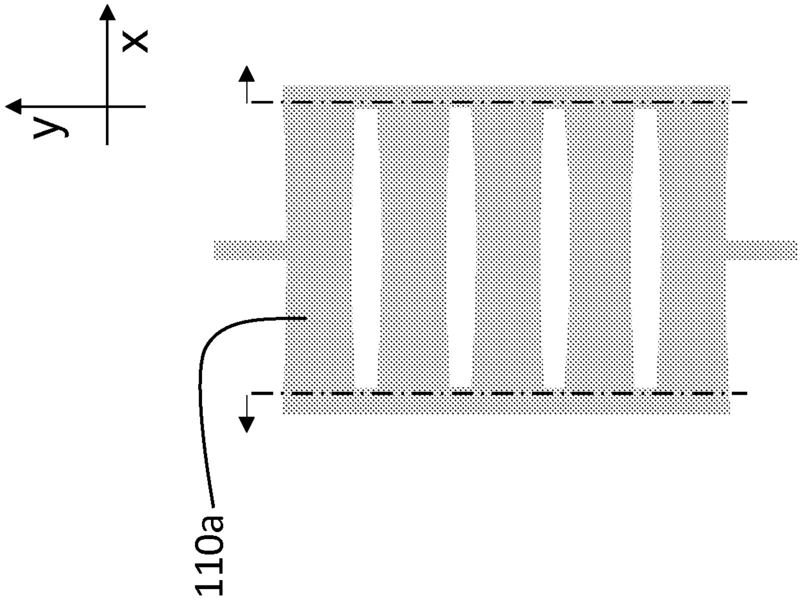
FIG. 3D illustrates the mode shape of the fundamental mode of an interconnected length-extensional mode resonator assembly under extension.
Figure 3C:
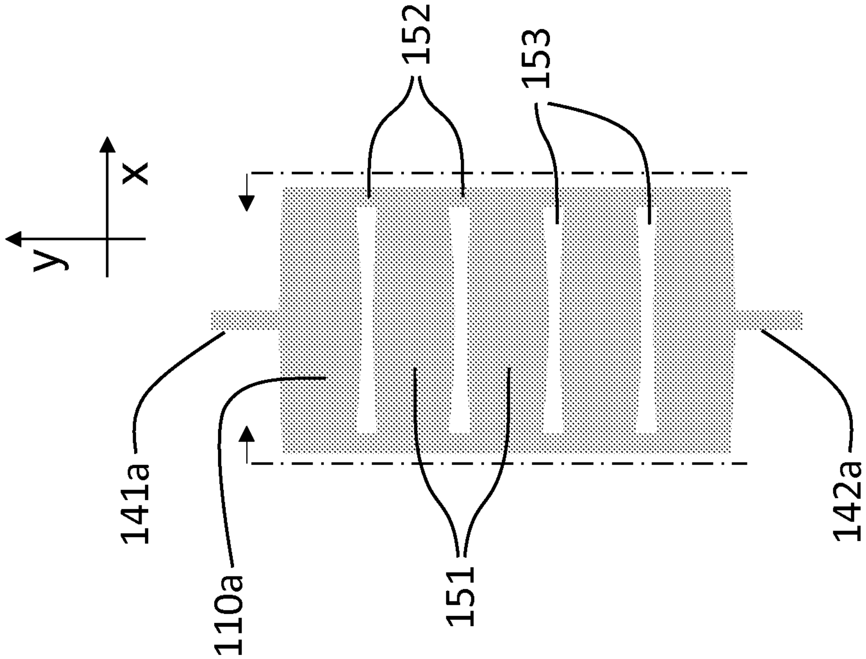
FIG. 3C illustrates the mode shape of the fundamental mode of an interconnected length-extensional mode resonator assembly under contraction.

Further features of the structure and the operation of the MEMS resonator assembly 100 of FIG. 1 are discussed below with reference to FIGS. 3A-3D. The structures illustrated in the figures show the resonator element 101 and the suspension elements 141*a*,142*a*, 143*b*, 144*b* which tether the resonator element 101 to the support structure (not shown in the figures). The shape of the MEMS resonator assembly at the resting position is illustrated in FIG. 3A while FIG. 3B illustrates the shape at maximum displacement of a vibration cycle. The extensional-mode resonators 110*a*, 110*b* illustrated in FIGS. 3A, 3B are interconnected length-extensional (LE) resonator assemblies which comprise of elongated beam-shaped LE-mode resonators 151 (here: five LE resonators 151 in both 110*a* and 110*b*) which are separated by trenches 153 from adjacent LE mode resonators 151 apart from their distal material portions 152 where the adjacent LE resonators are connected. (The material portions 152 connecting two adjacent LE resonators are called herein interconnecting elements. The purpose of the interconnection elements is to ensure that the beam-shaped LE resonators 151 resonate in tandem in the same length-extensional resonance mode at the same frequency.) These two interconnected LE resonator assemblies vibrate in a collective extensional-mode vibration resonance. The dash-dot lines in FIGS. 3B-3D represent the resting positions of the distal ends (or distal side walls) of the interconnected LE resonator assemblies. At the maximum contraction position of the resonance motion illustrated in FIGS. 3B (and 3C), the distal ends of the interconnected LE resonators have moved in the x direction towards their (central) symmetry axes as illustrated by the four arrows next to the four dash-dot lines in FIG. 3B. At the other maximum displacement position, the extension position of the resonance motion, which is 180 degrees off in phase with respect to the position illustrated in FIG. 3B, the distal ends of the interconnected LE resonators have moved in the x direction outwards from their central symmetry axes (as illustrated in FIG. 3D). At the maximum contraction position illustrated in FIG. 3B, the shape of the flexural resonator 120 is such that the material portions close to the connector element 131*a* connecting the flexural resonator 120 to the extensional-mode resonator 110*a*, and the material portions close to the connector elements 132*b*, 133*b* connecting the flexural resonator 120 to the extensional-mode resonator 110*b*, move in opposite directions along the x axis. The material portions of the flexural resonator 120 close to the connector element 131*a* follow the motion of the distal ends of the LE resonators of the extensional-mode resonator 110*a*, and the material portions of the flexural resonator 120 close to the connector element 132*b*, 133*b* follow the motion of the distal ends of the interconnected LE resonators of the extensional-mode resonator 110*b*.

In advantageous embodiments, the flexural resonator 120 has a resonance frequency which is substantially equal to the resonance frequencies of the extensional-mode resonators 110*a* and 110*b*. The mode shape of the flexural resonator 120 is such that the connector elements 131*a*, 132*b*, 133*b* are positioned substantially at anti-nodal points of the eigenmode. The displacement scale in FIG. 3B is magnified for illustrative purposes to highlight the resonance mode shape in comparison to the resting position of the flexural resonator 120 indicated by the dashed line. In the embodiment illustrated in FIG. 3B, the two anti-nodal points at both ends of the flexural resonator 120 are not populated with connector elements.

FIGS. 3C-3D illustrate further features of interconnected LE resonator assemblies (such as the assembly 110*a*) under their fundamental resonance mode. FIG. 3C illustrates (in an exaggerated way) how the extensional-mode vibration of the interconnected LE resonator assembly along the x axis causes the central material portions near nodal points of the resonating LE beams 151 to expand in an orthogonal direction (in y and z direction) when the LE beams 151 are contracted (FIG. 3C) and to contract when the beams are extended (FIG. 3D). In other illustrations herein, the small sidewise contraction and expansion orthogonal to the principal vibration direction of the extensional-mode resonance are ignored as being non-critical for the operation of the embodiments.

The inventors have observed that when the extensional-mode resonators 110*a* and 110*b* are coupled with a flexural resonator 120 vibrating at resonance, the whole resonator element resonates in a collective resonance mode and energy loss resulting from the coupling is minimized. The in-plane resonance frequency $f_{flex-IP}$ of the flexural-mode resonator may be estimated as:

$$f_{flex-IP} = \beta_n^2 \times \frac{W}{L^2}\sqrt{\frac{E}{12\rho}} \tag{1}$$

where E is the Young's modulus of the material of the flexural resonator, ρ is the density, $\beta_n$ the eigenvalue of the Nth overtone depending on boundary conditions, W the beam width, and L the beam length. Typical boundary conditions include free, fixed or pinned. After selection of the overtone order, the beam width W and length L in certain embodiments may be dimensioned using Eq. (1) so that the flexural resonance frequency matches the resonance frequencies of the extensional-mode resonators to be coupled with. In case of piezoelectrically coupled MEMS resonator assembly, there may be several material layers such as the single-crystalline layer, piezoelectric layer, and a top electrode layer, with their respective material parameters and geometrical dimensions and a more general form of Eq. (1) may be used.

Figure 4:
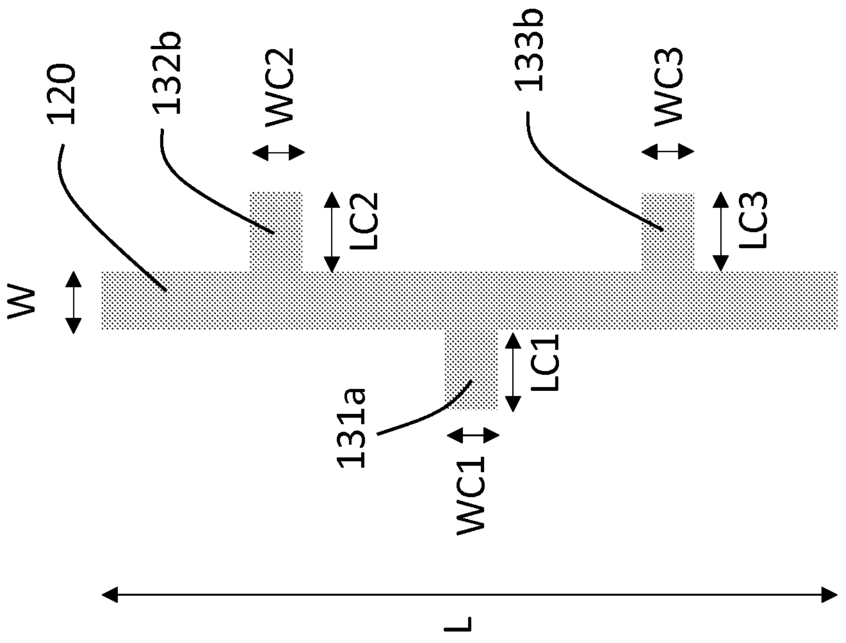
FIG. 4 illustrates the meaning of some parameters related to the embodiment of FIGS. 3A and 3B.

FIG. 4 illustrates the meaning of some parameters of Eq. (1) related to the flexural resonator and the connector elements of FIGS. 3A, 3B. The width W and length L of the resonator 120 are dimensioned so that the third overtone frequency equals to the resonance frequencies of the interconnected LE resonator assemblies 110*a* and 110*b*. The positions and dimensions of the connector elements have some effect on the precise values of the resonance frequencies as well as the node positions. (The widths and lengths of connector elements 131*a*, 132*b*, and 133*b* are denoted in FIG. 4 by WC1 and LC1, WC2 and LC2, and WC3 and LC3, respectively.) FEM simulations may be used to find optimum positions for connector elements and optimum values for the width W and length L of the flexural resonator. As a general rule, a successful coupling has only a small effect on the resonance mode shapes of the coupled extensional-mode resonators and flexural resonators.

The table below lists dimensions of certain exemplary flexural resonators (length L, width W) and connector elements (length LC, width WC) which may be used to mechanically couple extensional-mode resonators vibrating at a collective resonance mode at the frequency $f_0$.

| | Flexural resonator | | | Connector element | |
|---|---|---|---|---|---|
| $f_0$ (MHz) | overtone | L (μm) | W (μm) | LC (μm) | WC (μm) |
| 24 | 3 | 94 | 7 | 3 | 7 |
| 27 | 3 | 88 | 7 | 3 | 7 |
| 40 | 1 | 41 | 8 | 2 | 6 |
| 40 | 2 | 51 | 5 | 2 | 6 |
| 40 | 3 | 76 | 7 | 2 | 6 |
| 40 | 7 | 161 | 7 | 2 | 6 |
| 76.8 | 3 | 55 | 7 | 1 | 3 |

Figure 5A:
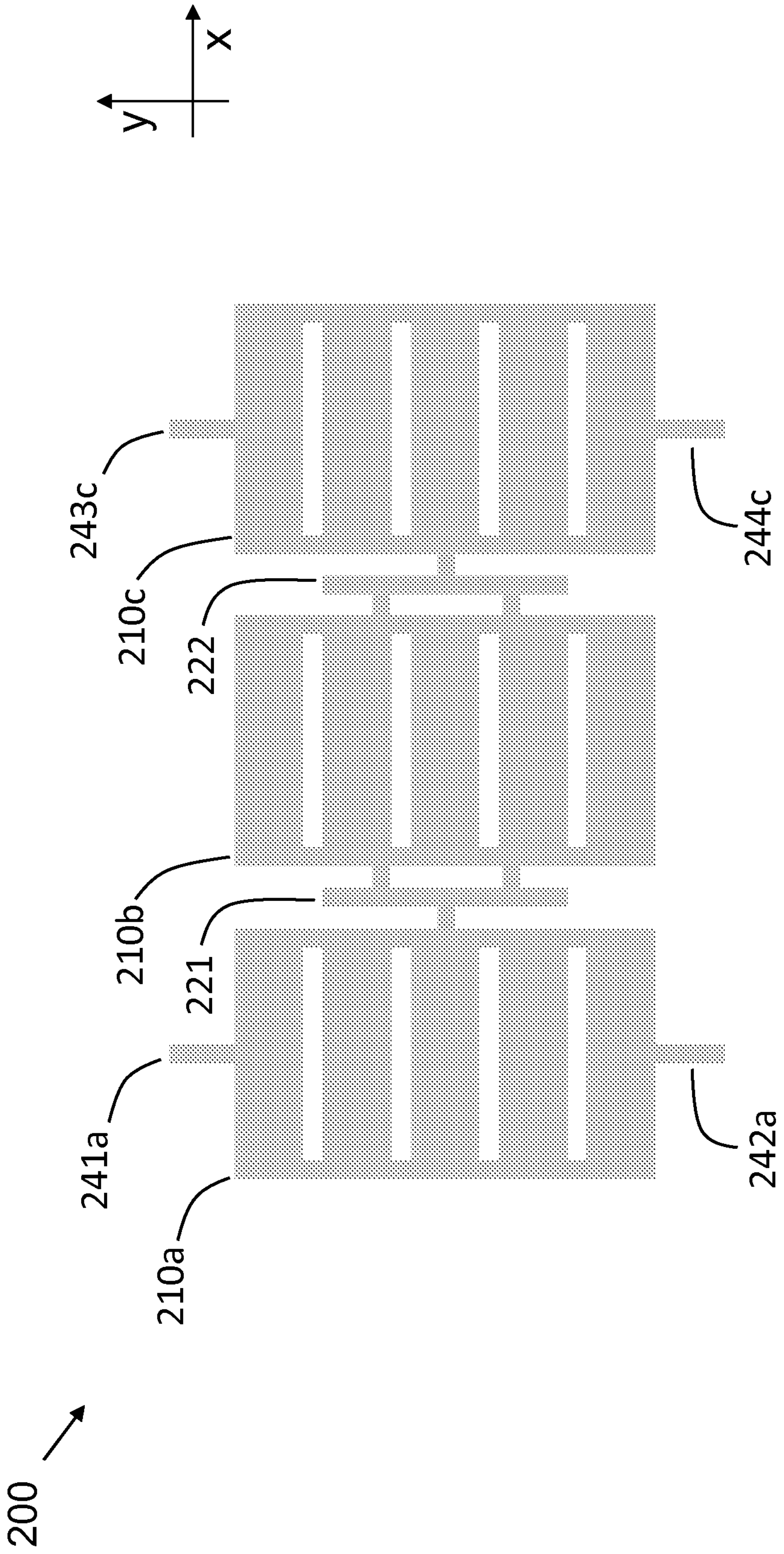
FIG. 5A shows an embodiment composed of three interconnected LE resonator assemblies and two in-plane flexural resonators designed to vibrate in their $3^{rd}$ overtone.

FIG. 5A shows an embodiment composed of three interconnected LE resonator assemblies 210*a*,210*b*,210*c* and two in-plane flexural mode resonators 221, 222 designed to vibrate in their 3$^{rd}$ overtone. The flexural resonator 222 is mirrored along its length with respect to the flexural resonator 221 so that the whole structure is symmetric about both x and y axis. The whole shown structure is a suspended structure. The outermost interconnected LE resonator assemblies 210*a* and 210*c* are tethered to a support structure 120 (not shown) via suspension elements 241*a*, 242*a*, 243*c*, 244*c*. The centermost interconnected LE resonator assembly 210*b* is tethered to the outermost interconnected LE resonator assemblies 210*a*, 210*c* via flexural mode resonators 221 and 222 and the connector elements attached to them. The respective widths W and lengths of the flexural resonators 221, 222 are such that their third overtone resonances substantially equal to each other and to the resonance frequencies of the extensional-mode resonators (here: interconnected LE resonator assemblies) 210*a*,210*b*,210*c*.

Figure 5B:
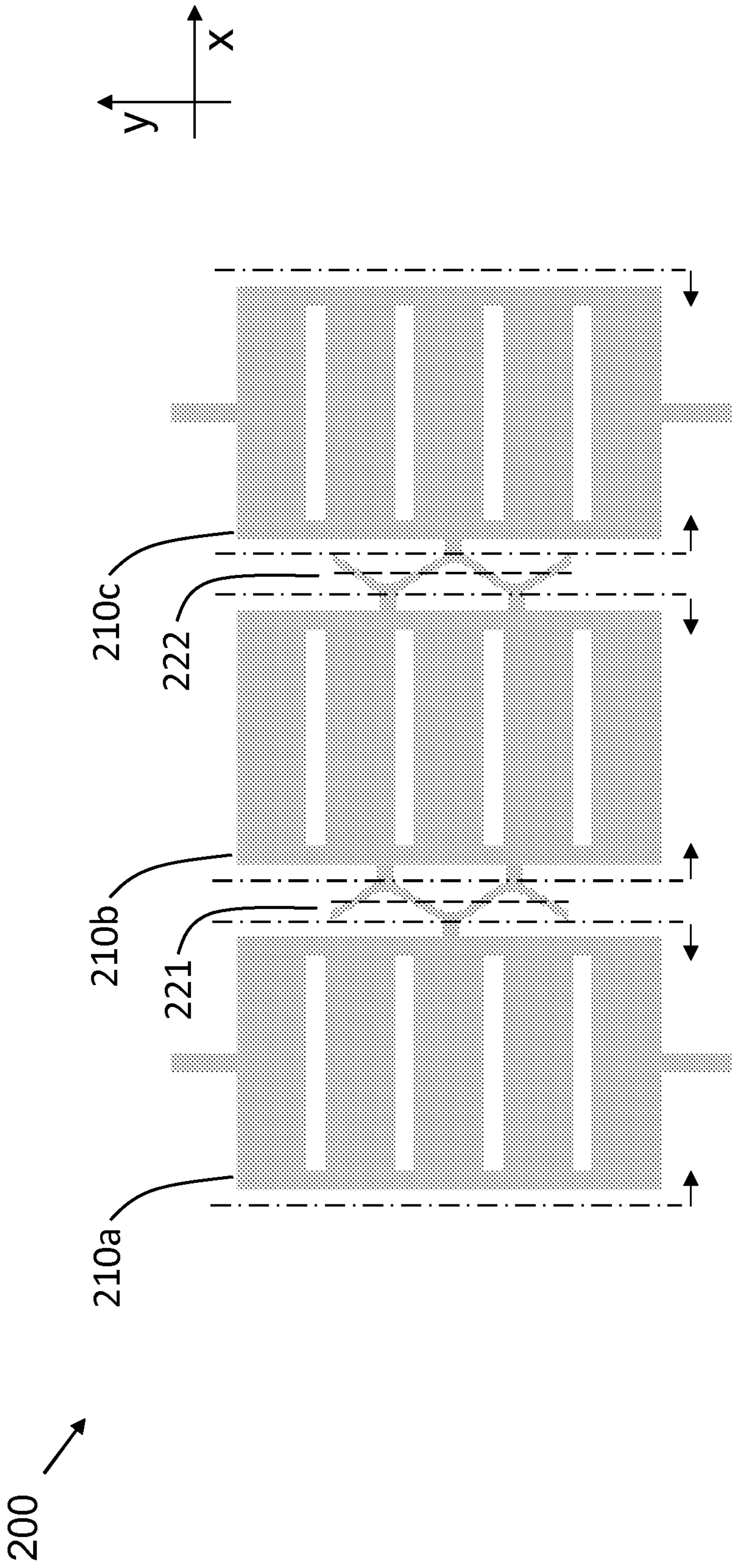
FIG. 5B shows the embodiment of FIG. 5A at maximum displacement of a vibration cycle.

FIG. 5B shows the same embodiment as depicted in FIG. 5A at maximum displacement of a vibration cycle. The dash-dotted lines represent the initial resting position of the interconnected LE resonator assemblies 210*a*,210*b*,210*c*. The flexural mode resonators 221, 222 are shown vibrating at their 3rd overtone. The connector elements placed at the anti-nodal positions of the flexural resonators 221 and 222 effectively couple the flexural vibrations to the extensional-mode vibrations. The displacement scale is magnified for illustrative purposes. The whole MEMS resonator assembly illustrated in FIG. 5B vibrates in a collective resonance mode in which the motions of the extensional-mode resonators 210*a*,210*b*,210*c* are substantially in the same phase with respect to each other.

Figure 6A:
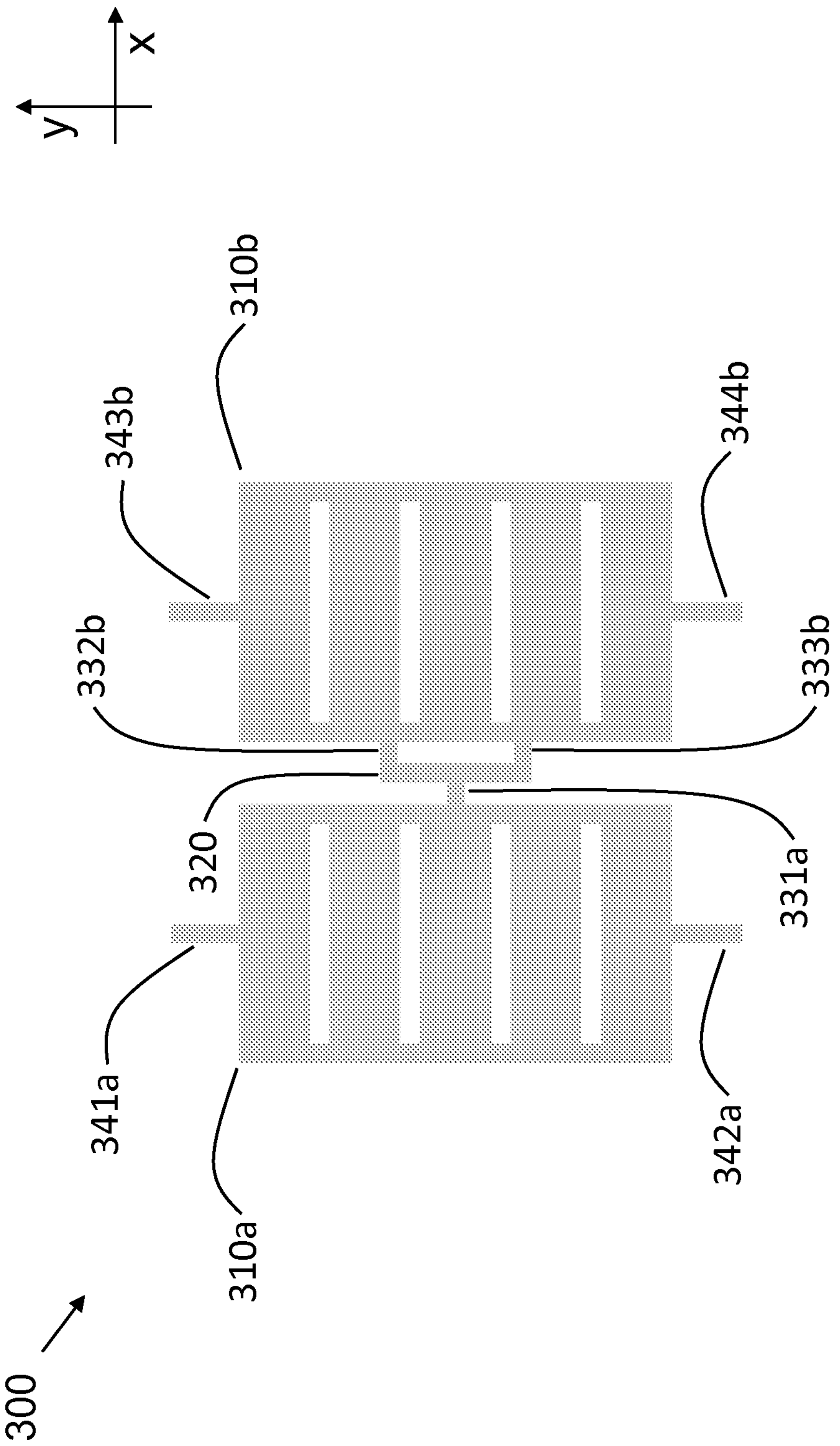
FIG. 6A shows an embodiment composed of two interconnected LE resonator assemblies and one in-plane flexural resonator designed to vibrate in its $1^{st}$ overtone.

In certain embodiments, as illustrated in FIG. 6A, the MEMS resonator assembly 300 comprises two interconnected LE resonator assemblies 310*a*,310*b* and one (in-plane) flexural mode resonator 320 designed to vibrate in its 1$^{st}$ overtone. The whole shown structure is a suspended structure, tethered to the support structure by suspension elements 341*a*, 342*a*, 343*b*, 344*b*. All three anti-nodal points of the flexural resonator 320 are populated with connector elements (331*a*, 332*b*, 333*b*) which couple the anti-nodal points of the flexural mode resonator 320 to the adjacent side walls of the interconnected LE resonator assemblies 310*a*, 310*b*.

Figure 6B:
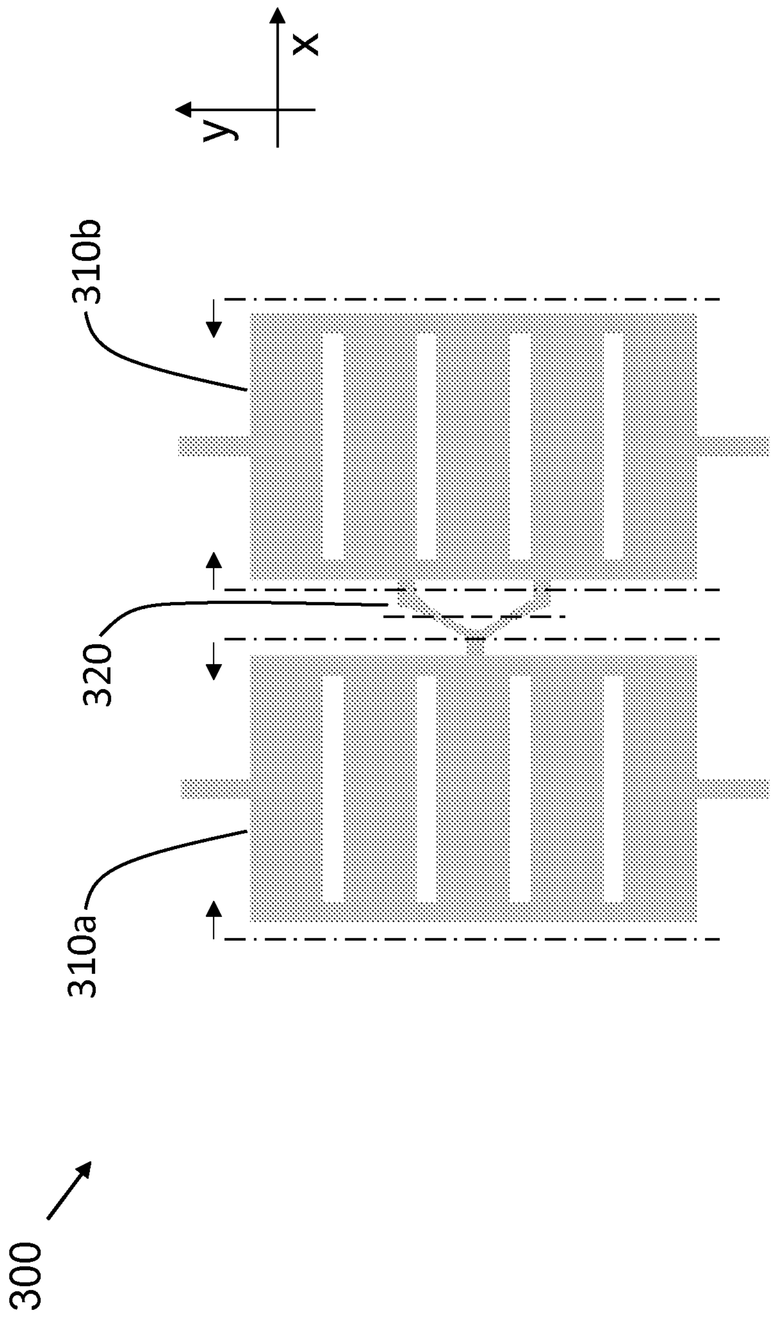
FIG. 6B shows the embodiment of FIG. 6A at maximum displacement of a vibration cycle.

FIG. 6B shows the embodiment of FIG. 6A at the maximum displacement of a vibration cycle. The dash-dotted lines represent the resting positions of the interconnected LE resonator assemblies 310*a*,310*b*. At the 1$^{st}$ overtone resonance of the flexural resonator 320, the anti-nodal point position at the connector element 331*a* moves in the opposite direction with respect to the anti-nodal points positions at the connector elements 332*b*, 333*c*. The width W and length L of the resonator 320 are such that its first overtone resonance frequency substantially equals to the resonance frequencies of the LE resonator assemblies 310*a*,310*b*. The whole MEMS resonator assembly 300 of FIGS. 6A, 6B vibrates in a collective resonance mode in which the motions of the extensional-mode resonators (here: interconnected LE resonator assemblies) 310*a*, 310*b* are substantially in the same phase with respect to each other.

Figure 7A:
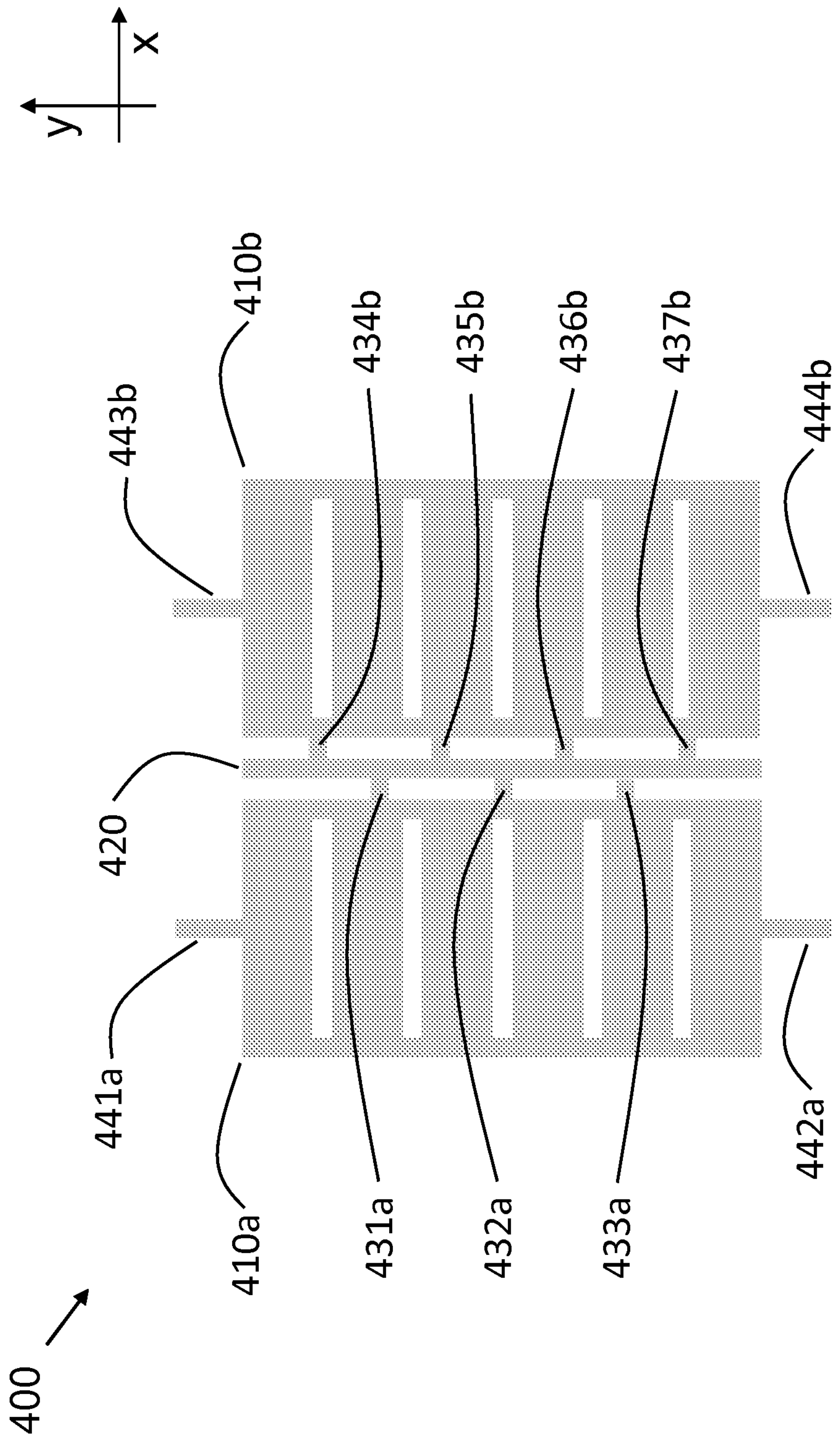
FIG. 7A shows an embodiment composed of two interconnected LE resonator assemblies and one in-plane flexural resonator designed to vibrate in its $7^{th}$ overtone.

FIG. 7A shows an embodiment composed of two interconnected LE resonator assemblies 410*a*, 410*b* and one (in-plane) flexural mode resonator 420 designed to vibrate in its 7th overtone. The whole shown structure is a suspended structure, tethered to the support structure by the suspension elements 441*a*, 442*a*, 443*b*, 444*b*. Seven connector elements 431*a*, 432*a*, 433*a*, 434*b*, 435*b*, 436*b*, 437*b* couple anti-nodal points of the flexural mode resonator 420 to the adjacent side walls of the interconnected LE resonator assemblies 410*a*, 410*b*.

Figure 7B:
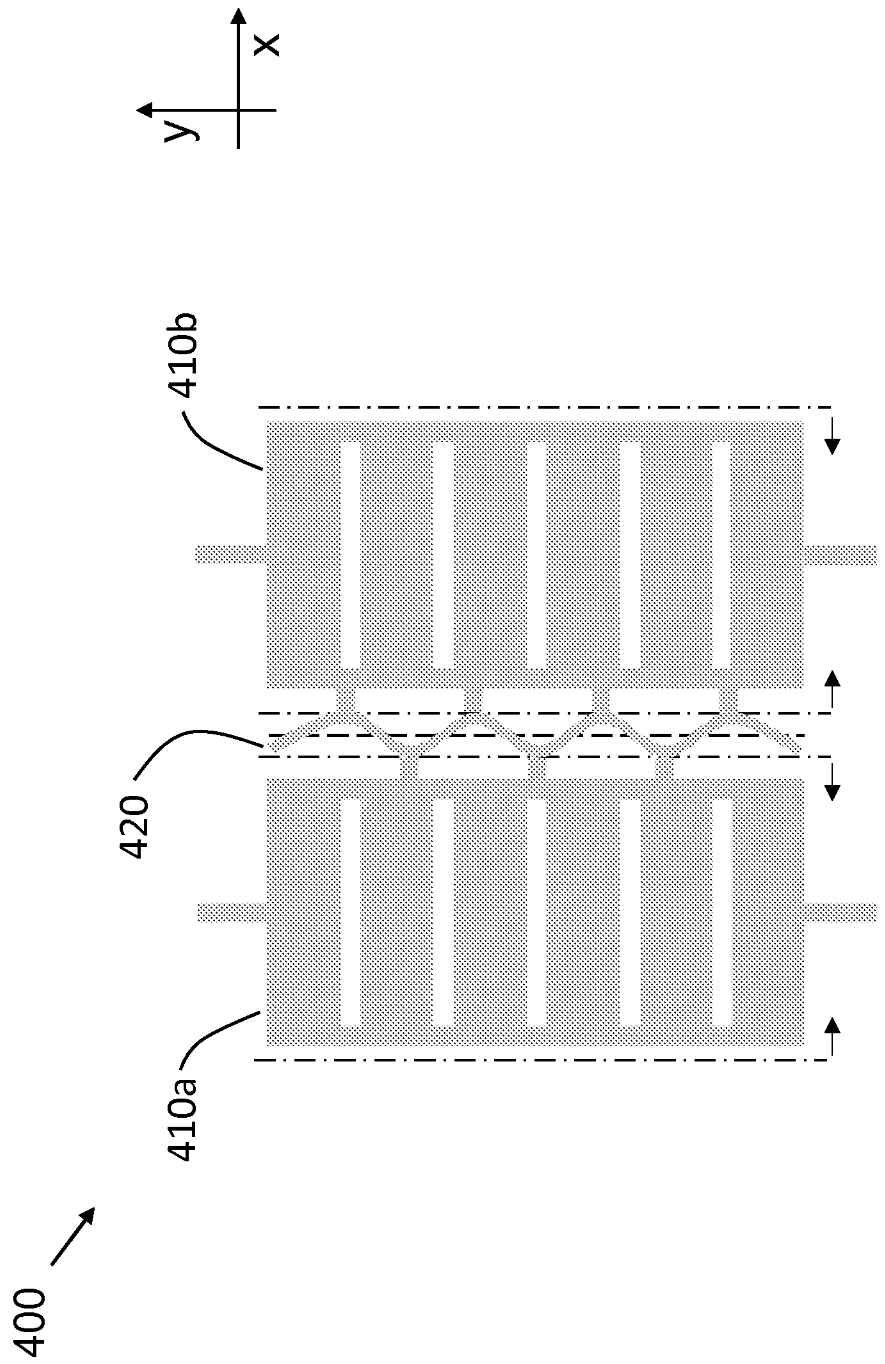
FIG. 7B shows the embodiment of FIG. 7A at maximum displacement of a vibration cycle.

FIG. 7B illustrates the embodiment of FIG. 7A at the maximum displacement of a vibration cycle. The dash-dotted lines represent the resting positions of the interconnected LE resonator assemblies 410*a*, 410*b*. At the 7$^{th}$ overtone resonance of the flexural resonator 420, the anti-nodal point position at the connector elements 431*a*, 432*a*, 433*a* move in the opposite direction with respect to the anti-nodal points positions at the connector elements 434*b*, 435*b*, 436*b*, 437*b*. The width W and length L of the resonator 420 are such that its $7^{th}$ overtone resonance frequency substantially equals to the resonance frequencies of the interconnected LE resonator assemblies 410*a*, 410*b*. The whole MEMS resonator assembly 400 of FIGS. 7A, 7B vibrates in a collective resonance mode in which the motions of the extensional-mode resonators (here: interconnected LE resonator assemblies) 410*a*, 410*b* are substantially in the same phase with respect to each other. In this embodiment, the two anti-nodal points at both ends of the resonator 420 are not populated with connector elements.

Figure 8A:
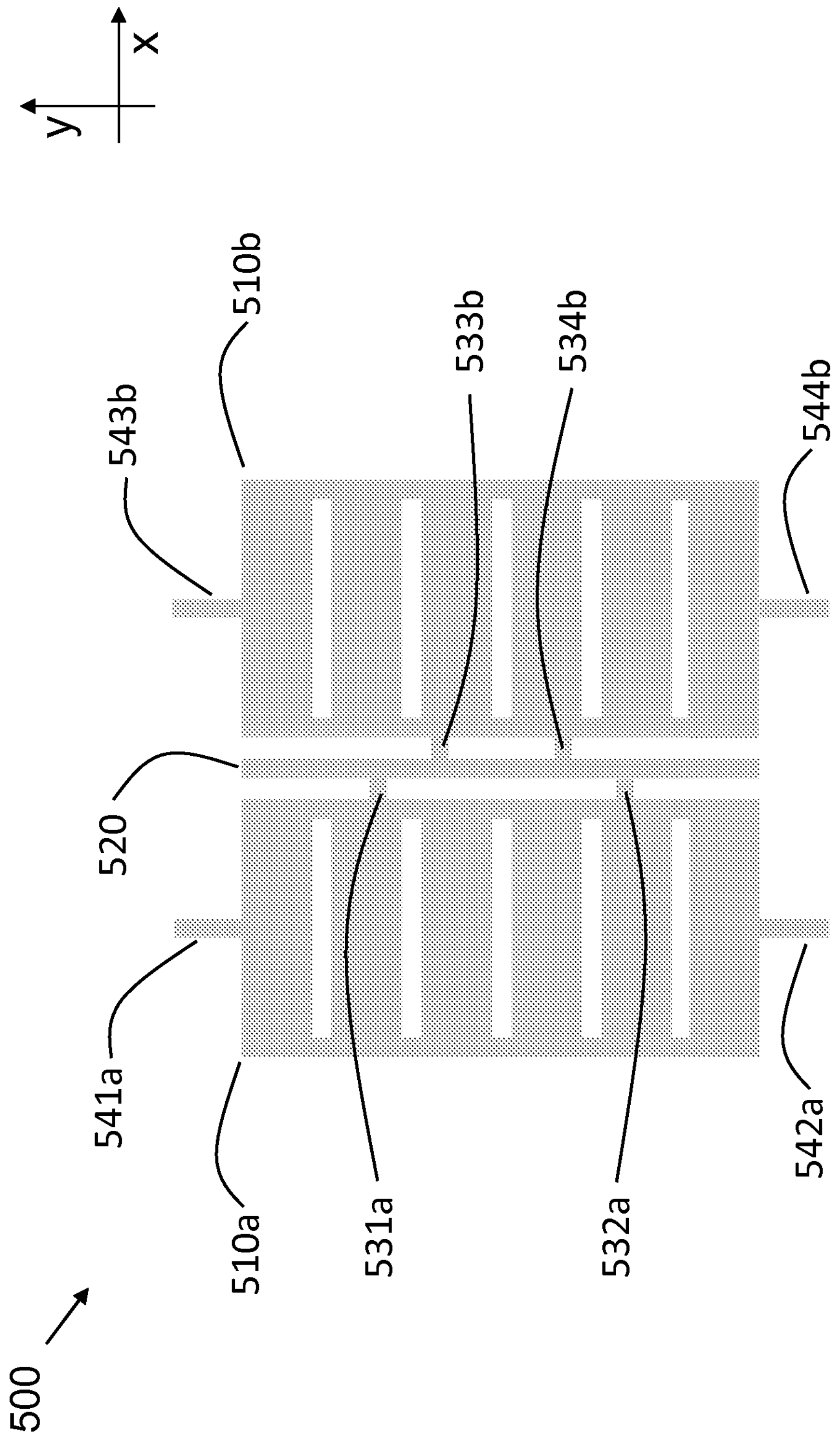
FIG. 8A shows another embodiment composed of two interconnected LE resonator assemblies and one in-plane flexural resonator designed to vibrate in its $7^{th}$ overtone.

FIG. 8A shows an embodiment composed of two interconnected LE resonator assemblies 510*a*, 510*b* and one (in-plane) flexural mode resonator 520 designed to vibrate in its $7^{th}$ overtone. The whole shown structure is a suspended structure, tethered to the support structure by the suspension elements 541*a*, 542*a*, 543*b*, 544*b*. Four connector elements 531*a*, 532*a*, 533*b*, 534*b* couple anti-nodal points of the flexural mode resonator 520 to the adjacent side walls of the interconnected LE resonator assemblies 510*a*, 510*b*.

Figure 8B:
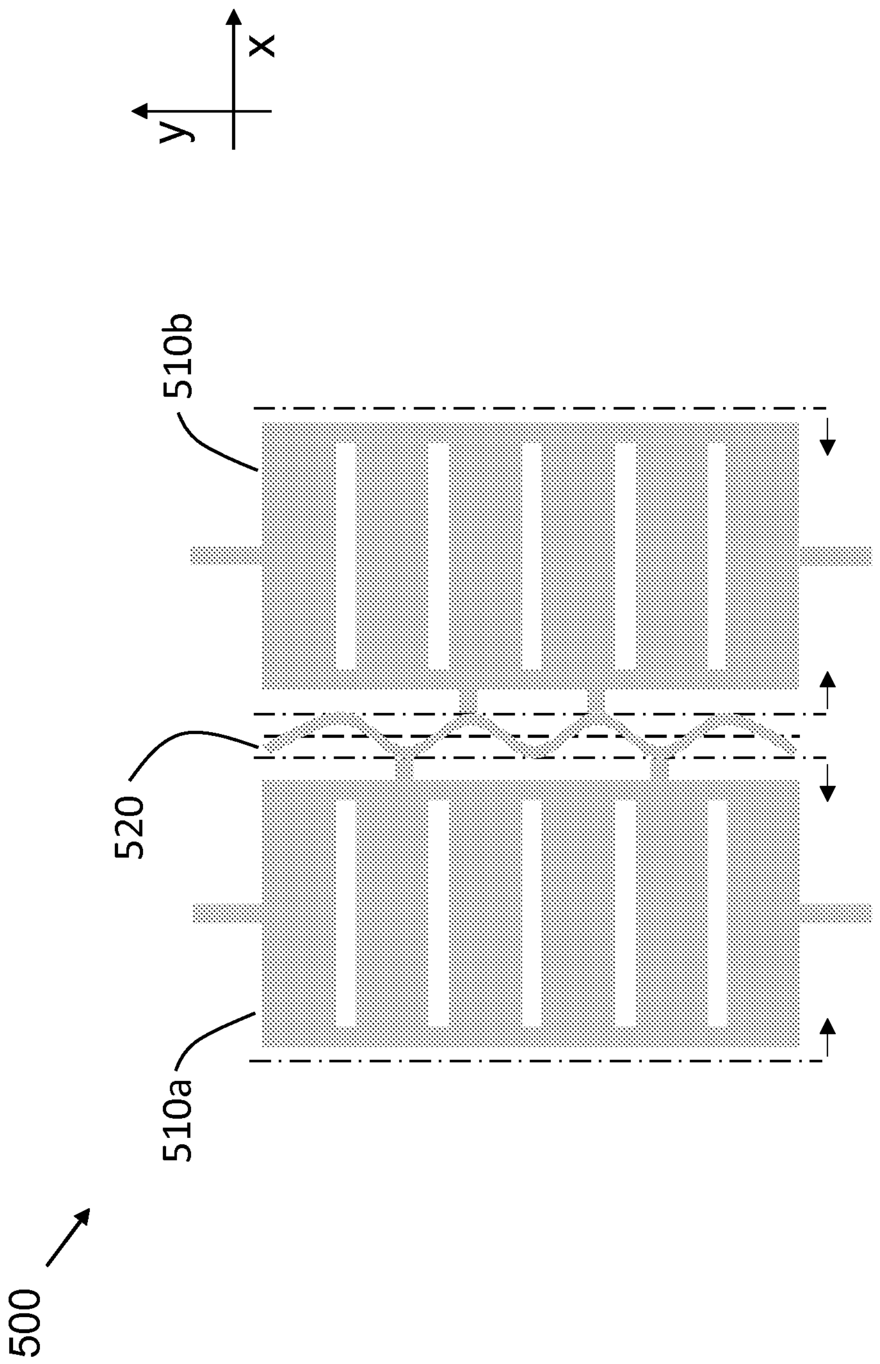
FIG. 8B shows the embodiment of FIG. 8A at maximum displacement of a vibration cycle.

FIG. 8B illustrates the embodiment of FIG. 8A at the maximum displacement of a vibration cycle. The dash-dotted lines represent the resting positions of the interconnected LE resonator assemblies 510*a*, 510*b*. At the $7^{th}$ overtone resonance of the flexural resonator 520, the anti-nodal point position at the connector elements 531*a*, 532*a* move in the opposite direction with respect to the anti-nodal points positions at the connector elements 533*b*, 534*b*. The width W and length L of the resonator 520 are such that its $7^{th}$ overtone resonance frequency substantially equals to the resonance frequencies of the interconnected LE resonator assemblies 510*a*, 510*b*. The whole MEMS resonator assembly 500 of FIGS. 8A,B vibrates in a collective resonance mode in which the motions of the extensional-mode resonators (here: interconnected LE resonator assemblies) 510*a*, 510*b* are substantially in the same phase with respect to each other. In this embodiment, only four of the nine anti-nodal points of the resonator 520 are populated.

The width of the flexural resonator and the lengths of connector elements define how closely spaced the extensional-mode resonators (in the embodiment of FIGS. 8A, 8B: interconnected LE resonator assemblies) can be. In certain embodiments, these dimensions, together with the corresponding length of the flexural resonator according to Eq. (1), are as small as the technology allows. In advantageous embodiments, the distance between the first extensional-mode resonator and the second extensional-mode resonator is less than 50 μm. In preferable embodiments, the distance between the first extensional-mode resonator and the second extensional-mode resonator is less than 20 μm.

The dimensions of the connector elements define the coupling strength between an extensional-mode resonator and the flexural resonator. In certain embodiments, the lengths of the connector elements are made as small as the technology allows and their widths are chosen as a tradeoff between coupling strength and disturbance of the flexural mode shape. In advantageous embodiments, the connector elements are placed at anti-nodal points of the flexural resonator.

Not all anti-nodes of the flexural resonators are necessarily connected to an extensional-mode resonator via a connector element. In some embodiments, such as the ones of FIGS. 3A-3B, 5A-5B, 7A-7B, 8A-8B, the anti-nodes at the two ends of the flexural resonators are not connected in order to preserve free-free boundary conditions.

In some embodiments (such as the one in FIGS. 5A-5B), the number of extensional-mode resonators is three of more and the number of flexural resonators is two or more. In some embodiments, the flexural resonators and the connector elements coupled to them are either identical to each other or mirror images of each other.

In some embodiments (such as the one in FIGS. 5A-5B), one of the extensional-mode resonators has no suspension elements connecting it to the support structure but it has connector elements connecting it to two adjacent extensional-mode resonators through flexural resonators.

In certain embodiments, at least one of the extensional-mode resonators which is a member of the MEMS resonator assembly vibrates at an overtone frequency. For example, the intercoupled LE mode resonators illustrated in FIGS. 3A and 3B (or those illustrated in FIGS. 5A-5B, 6A-6B, 7A-7B, 8A-8B) could be vibrating (ignoring changes in the scales of the x and y axes) in its $3^{rd}$ overtone or in another odd-numbered overtone (or the fundamental frequency) as long as the resonance frequencies of the flexural resonator and the intercoupled LE mode resonators are substantially equal (which is then the frequency of the collective resonance mode). In certain other exemplary embodiments, one of the extensional-mode resonators vibrates in its fundamental mode while another extensional-mode resonator vibrates in an overtone mode and the respective two frequencies and the resonance frequency of the flexural mode resonator coupled to the two extensional-mode resonators are substantially equal to each other.

Figure 9A:
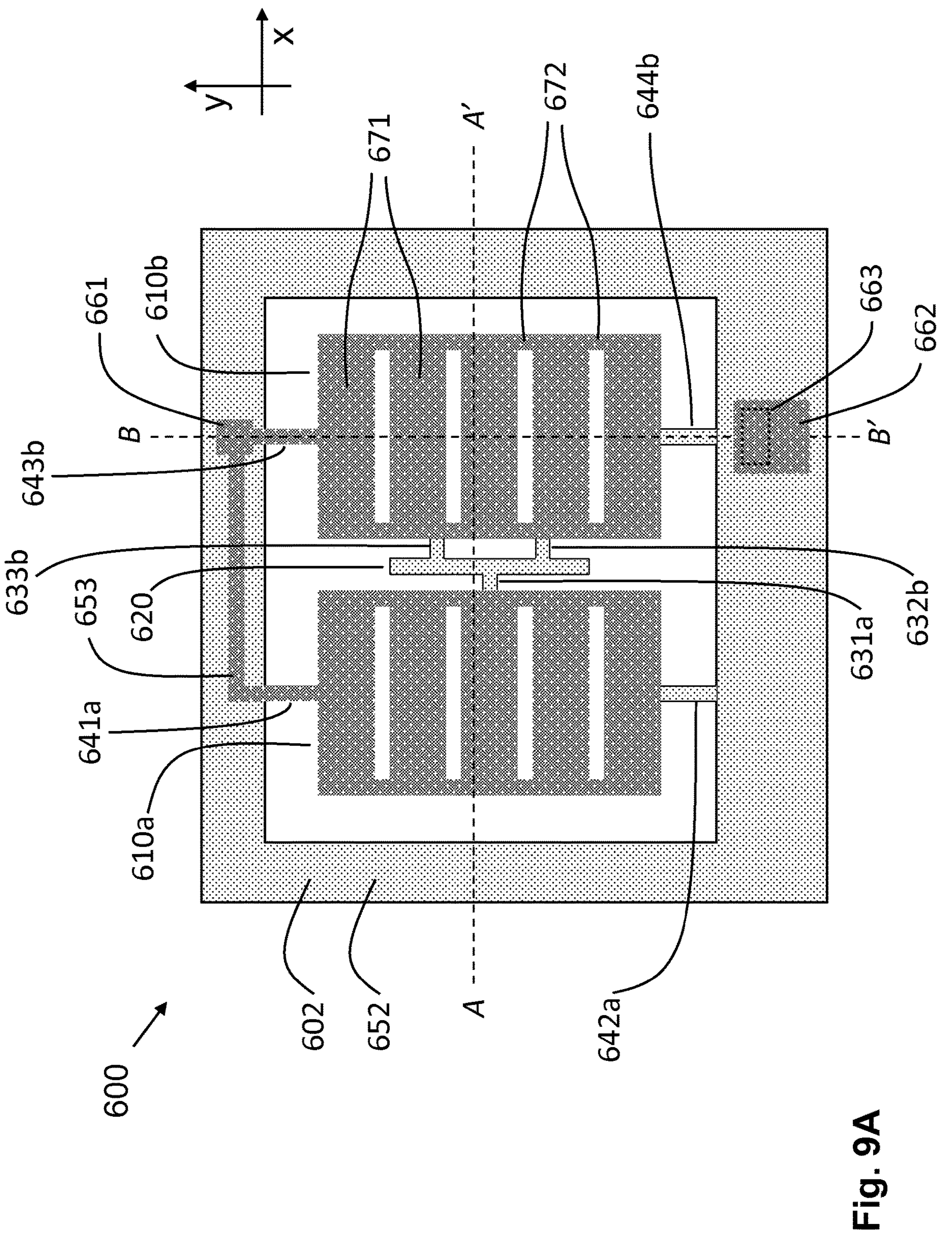
FIG. 9A shows an exemplary embodiment of a MEMS resonator assembly comprising a piezoelectric actuator.
Figure 9B:
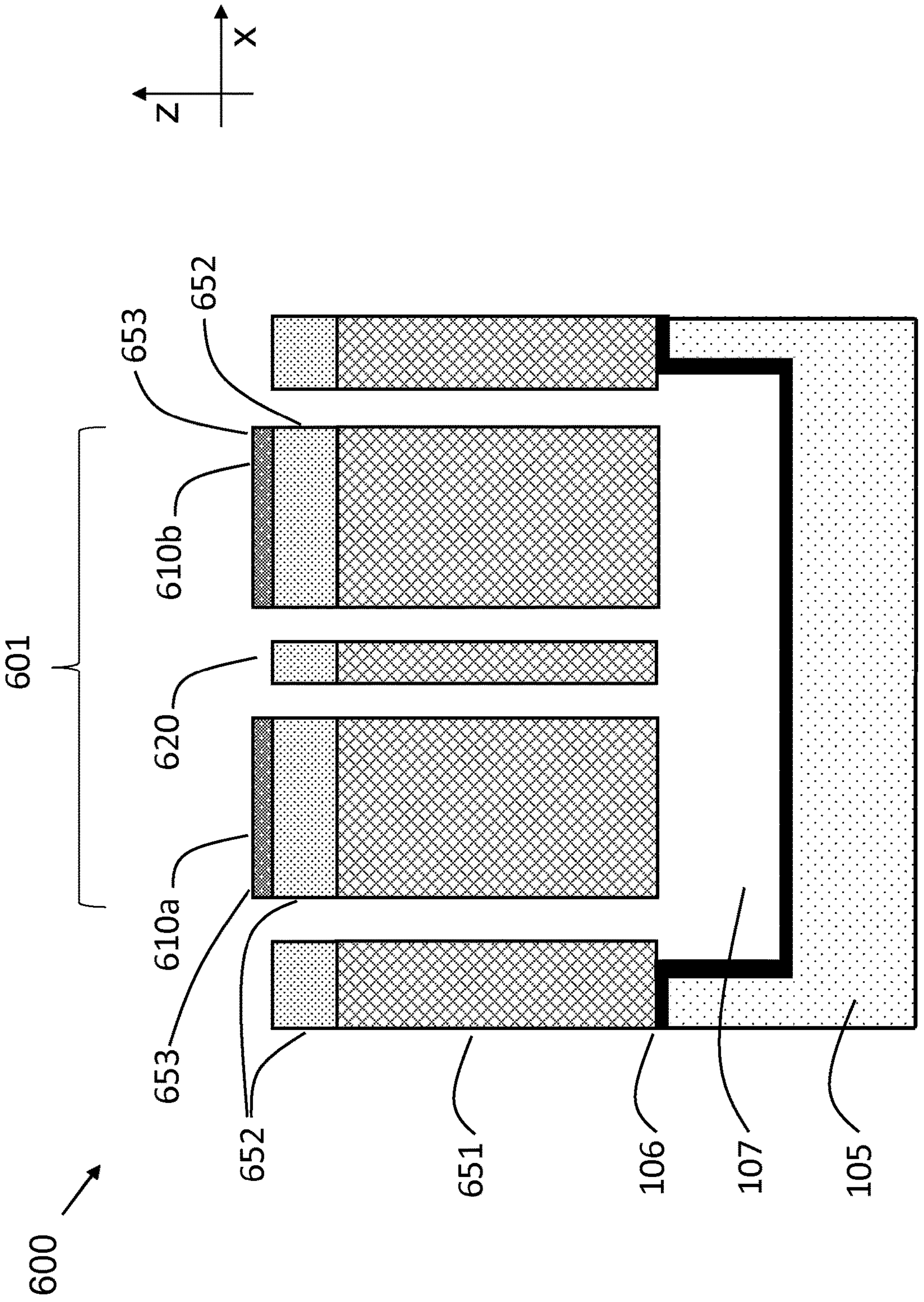
FIG. 9B shows an example of a cross section of the MEMS resonator assembly of FIG. 9A along the line AA'.
Figure 9C:
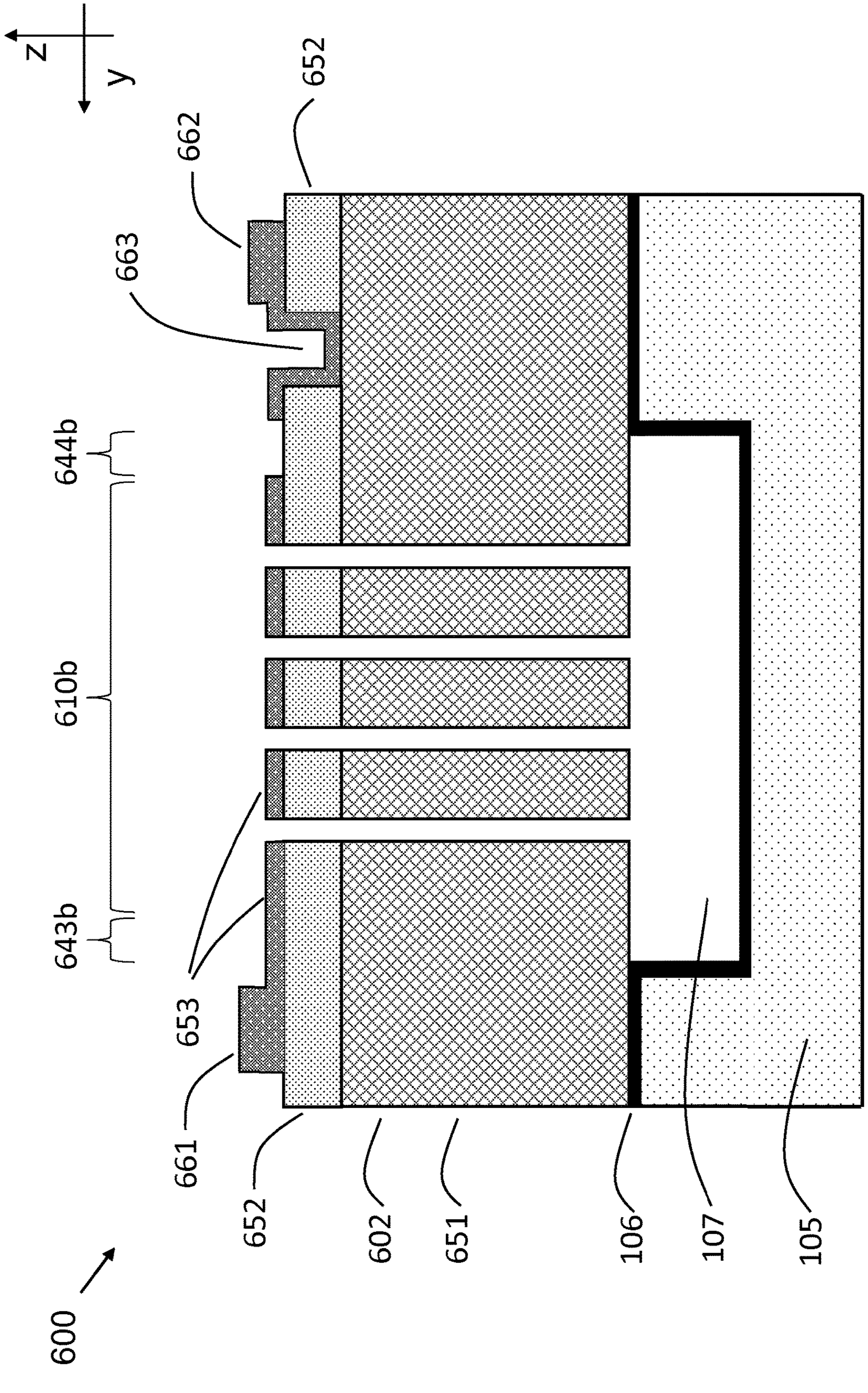
FIG. 9C shows an example of a cross section of the MEMS resonator assembly of FIG. 9A along the line BB'.

In certain embodiments, the resonator element 101 of the MEMS resonator assembly 100 comprises a piezoelectric actuator for exciting the resonator element to a resonance mode. An exemplary embodiment of such a MEMS resonator assembly is illustrated in FIGS. 9A-9C. The resonator assembly 600 comprises a resonator element 601, a support structure 602 (102), and suspension elements 641*a*, 642*a*, 643*b*, and 644*b* which tether the resonator element 601 to the support structure 602. The resonator element 601 comprises two extensional-mode resonators (610*a*, 610*b*), a flexural mode resonator 620, a connector element 631*a* which connects the flexural resonator 620 to the extensional-mode resonator 610*a*, and connector elements 632*b* and 633*b* which connect the flexural resonator 620 to the extensional-mode resonator 610*b*. The extensional-mode resonators 610*a*, 610*b* illustrated in FIG. 9A are interconnected LE resonator assemblies which both comprise five elongated beam-shaped LE-mode resonators 671. Each LE resonator 671 is connected to its adjacent LE resonator(s) at its distal ends via substantially rigid material portions (interconnection elements) 672.

FIG. 9B illustrates the cross section of the MEMS resonator assembly of FIG. 9A along the line AA'. The interconnected LE resonator assemblies 610*a*, 610*b* are actuated using piezoelectric thin-film actuators which comprise a layer of piezoelectric material 652 formed on the single-crystalline silicon layer 651 in certain regions of the interconnected LE resonator assemblies 610*a*, 610*b*, and a top electrode layer 653 formed on the piezoelectric layer 652 in certain other regions of the interconnected LE resonator assemblies 610*a*, 610*b*. In some embodiments, the whole top surface of the single-crystalline silicon layer 651 within interconnected LE resonator assemblies 610*a*, 610*b* is covered by the piezoelectric layer 652 and the top electrode layer 653 as in the exemplary embodiment of FIGS. 9A-9B. In certain embodiments, as illustrated by FIGS. 9A-9B, the flexural resonator 620 and the connector elements 631*a*, 632*b*, and 633*b* comprise the piezoelectric layer 652 but do not comprise the top electrode layer 653. In certain alternative embodiments, the flexural resonator 620 and the connector elements 631*a*, 632*b*, and 633*b* comprise the piezoelectric layer 652 and the top electrode layer 653. The principal driving force which sets the flexural resonator 620 into resonance motion originates from piezoelectric actuation of LE resonator assemblies 610*a*, 610*b* and is mechanically mediated by the connector elements 631*a*, 632*b*, and 633*b*.

In certain embodiments, the single-crystalline silicon layer 651 is doped with phosphorus dopants and the average phosphorus dopant concentration is at least $2\times10^{19}$ $cm^{-3}$. The thickness of the single-crystalline silicon layer 651 in certain embodiments is in the range from 2 μm to 40 μm such as from 5 μm to 20 μm. In certain embodiments, the crystalline directions in the single-crystalline silicon layer 651 are such that a <100> direction is in the plane of the respective layer. In certain embodiments, a principal direction of the vibration of the two extensional-mode resonators (610*a*, 610*b*) is substantially parallel to the said <100> direction and the average phosphorus dopant concentration of the single-crystalline silicon layer (or layers in case the top electrode comprises single-crystalline silicon as discussed below) within the resonator element has (have) a value larger than $2\times10^{19}$ $cm^{-3}$ to increase thermal stability of the resonance frequency. (In the case of embodiments illustrated in FIGS. 3B, 5B, 6B, 7B, and 8B, the said principal direction of the vibration is along the x axis.)

The material of the piezoelectric layer 652 may be, e.g., AlN, Sc-doped AlN, ZnO, $LiNbO_3$, or $LiTaO_3$. The thickness of the piezoelectric layer in certain embodiments is in the range from 500 nm to 4 μm such as from 1 μm to 2 μm.

The material of the top electrode layer 653 in certain embodiments comprises metal such as gold, molybdenum, aluminum or tungsten, a metal alloy, degenerately doped polycrystalline silicon, degenerately doped single-crystalline silicon, another semiconducting material, or any other suitable material that is electrically conductive. The thickness of the top electrode layer in certain embodiments is in the range from 50 nm to 1000 nm such as from 150 nm to 400 nm. In certain embodiments, the material of the top electrode layer 653 comprises degenerately doped single-crystalline silicon and the thickness of the layer 653 is in the range from 2 μm to 40 μm, such as from 5 μm to 20 μm which makes the material layer stack more symmetric and may thereby significantly increase the quality factor of the resonance by reducing energy leakage to the support structure.

In certain alternative embodiments, the material stack illustrated in FIG. 9B may contain other layers such as one or two layers of silicon oxide. In certain embodiments, there is a silicon oxide layer on the bottom surface of the single-crystalline layer 651 facing the cavity 107. In certain other embodiments, there may be a silicon oxide layer between the single-crystalline layer 651 and the piezoelectric layer 652, between the piezoelectric layer 652 and the top electrode layer 653, or on top of the top electrode layer 653. These silicon oxide layers may be used to modify the temperature dependency of the resonance frequency.

FIG. 9C illustrates the cross section of the MEMS resonator assembly of FIG. 9A along the line BB'. A contact pad 661 on the (electrically insulating) piezoelectric layer 652 on the single-crystalline layer 651 (on the support structure 602) is provided for making a galvanic connection to the top electrode 653 of the extensional-mode resonator 610*b* through an electrical conductor on one of the suspension elements of the resonator 610*b* (the element 643*b* of FIGS. 9A,C). As illustrated by the layout of the MEMS resonator assembly 600 shown in FIG. 9A and the cross section of FIG. 9C, the contact pad 661 is galvanically connected also to the top electrode 653 of the extensional-mode resonators 610*a* and 610*b* through electrical conductors formed on the suspension elements 641*a* and 643*b* which are electrically isolated from the doped single-crystalline silicon layer 651 by the piezoelectric layer 652. Another contact pad 662 on the support structure 602 is provided for making a galvanic connection to the single-crystalline silicon layer 651 which is used as the bottom electrode in the exemplary embodiment of FIGS. 9A-9C. An opening 663 in the piezoelectric layer 652 is formed and the top electrode 653 material is deposited on the opening 663 to provide a galvanic contact between the contact pad 662 and the single-crystalline silicon bottom electrode 651. In the embodiment illustrated in FIGS. 9A-9C, the single-crystalline silicon layer 651 is degenerately doped with dopants such as phosphorus or arsenic. Therefore, single-crystalline silicon material portions within the extensional-mode resonators 610*a*, 610*b* and the support structure 602 are galvanically connected through the single-crystalline silicon material portions within the suspension elements (641*a*, 642*a*, 643*b*, 644*b*) and through the single-crystalline silicon material portions within the flexural resonator 620 and the connector elements 631*a*, 632*b*, 633*b*. The extensional-mode resonator 610*b* (and 610*a*) can be excited to the extensional-mode resonance by applying an alternating voltage at the resonance frequency between the contact pads 661 and 662 and thereby creating an alternating electric field across the piezoelectric layer 652. Electrical interconnects for the piezoelectric actuation of the MEMS resonator assembly 600 can be realized in a several alternative ways such as using through-silicon-vias and wafer-level packaging.

In certain alternative embodiments, the MEMS resonator assembly comprises two extensional-mode resonators and a flexural mode resonator mechanically connecting the two extensional-mode resonators, wherein the first extensional-mode resonator comprises a piezoelectric actuator and the second extensional-mode resonator does not comprise a piezoelectric actuator (one exemplary embodiment of such a MEMS resonator assembly is an assembly otherwise the same as the assembly 600 of FIGS. 9A-9C but with the difference that there is no electrically conducting pathway on the suspension element 641*a* to the top electrode 653 layer on the extensional-mode resonator 610*a* so that only the extensional-mode resonator 610*b* comprises a piezoelectric actuator which can be used to excite the corresponding extensional-mode resonator, and thereby the resonator element, to a resonance mode). Although the ESR of the whole resonator assembly is increased by reduced electromechanical coupling, the power-handling of the resonator assembly may be improved because the motional energy is shared between the mechanically connected extensional-mode resonators vibrating in a collective resonance mode.

Figure 10A:
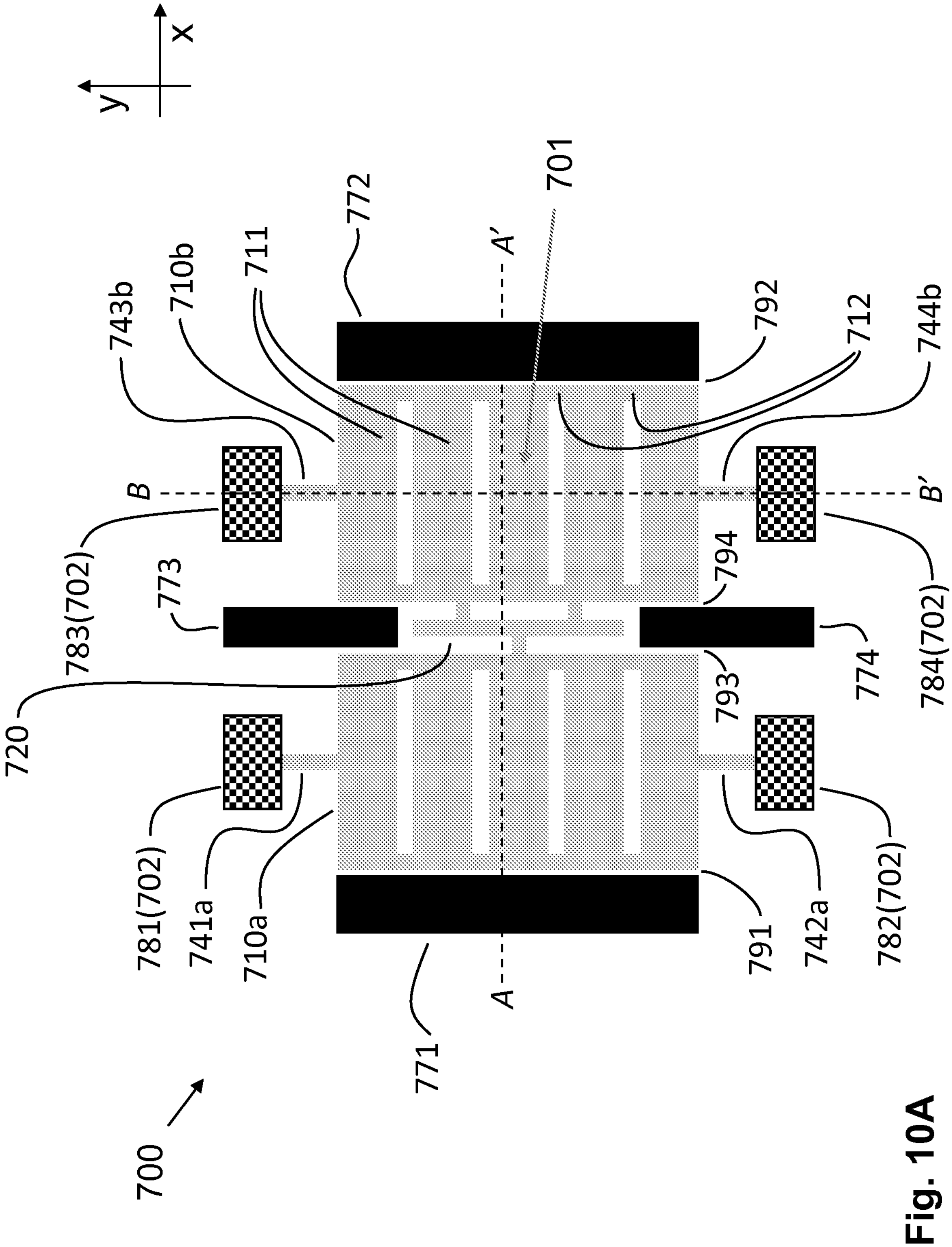
FIG. 10A shows an embodiment using electrostatic actuation.
Figure 10B:
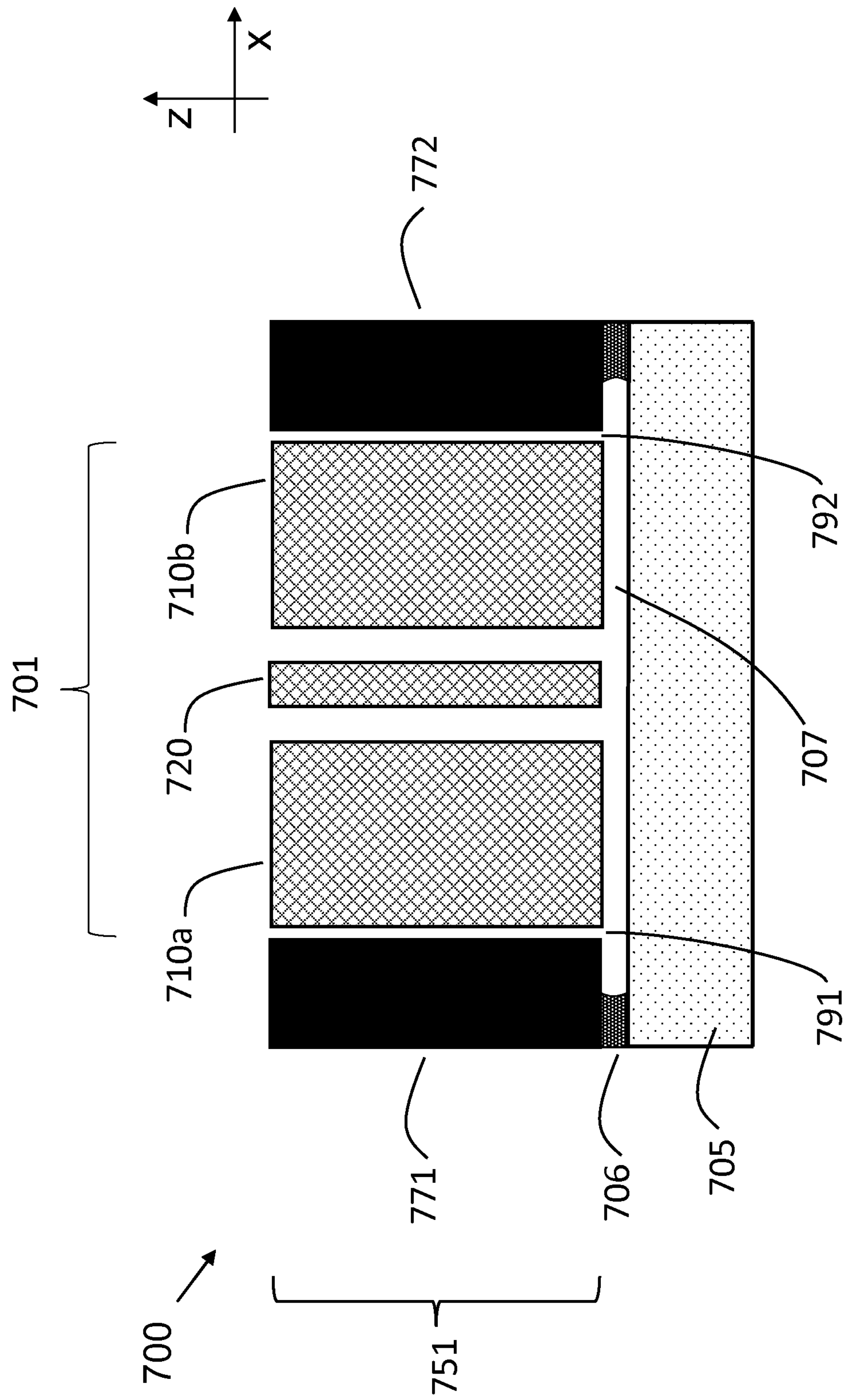
FIG. 10B shows an example of a cross section of the MEMS resonator assembly of FIG. 10A along the line AA'.
Figure 10C:
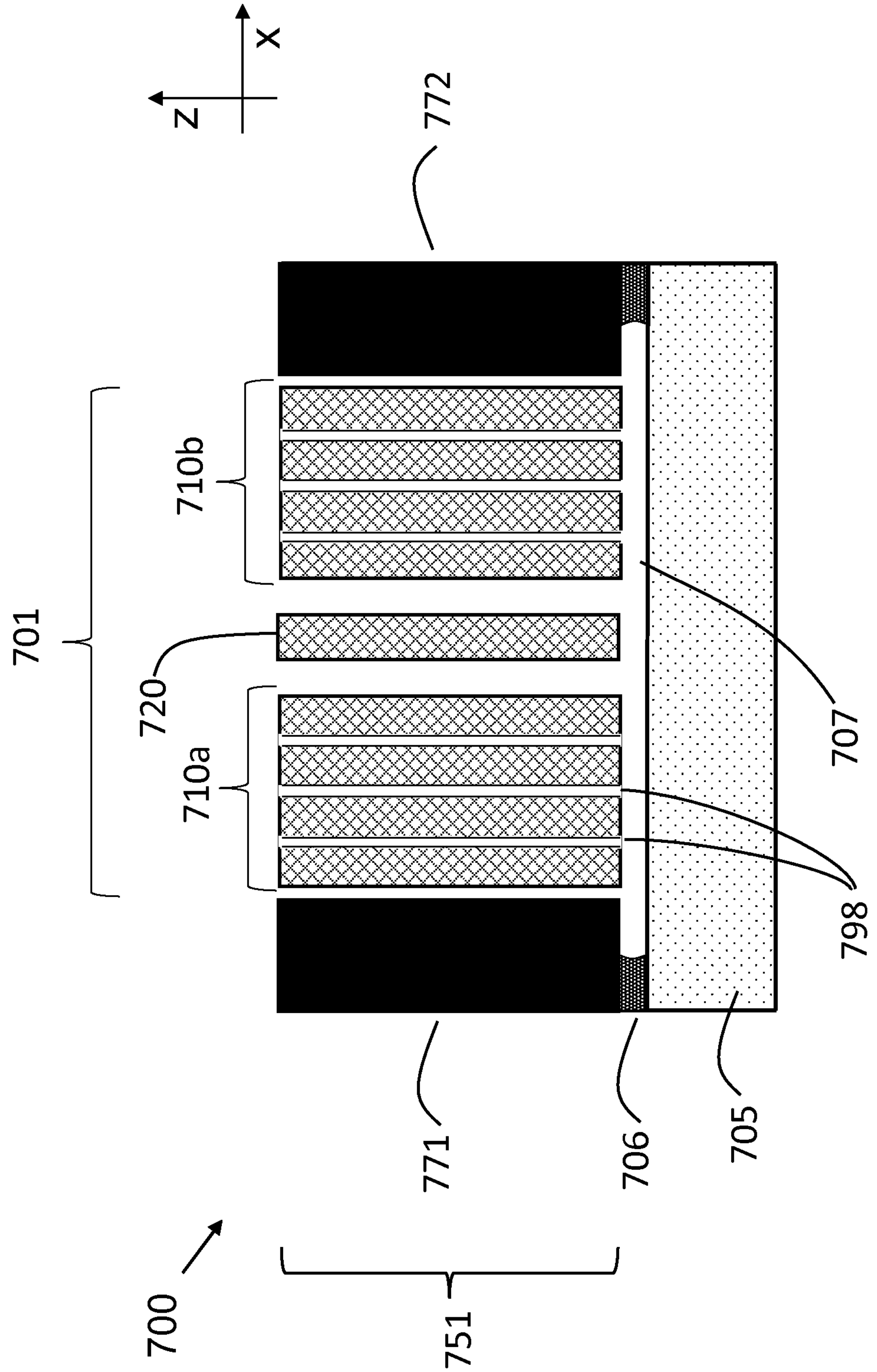
FIG. 10C shows an example of a cross section of the MEMS resonator assembly of FIG. 10A with etch holes according to certain embodiments.

In certain embodiments, the MEMS resonator assembly comprises an electrostatic actuator for exciting the resonator element to a resonance mode. An exemplary embodiment of such a MEMS resonator 700, formed on a silicon-on-insulator substrate (SOI), is illustrated in FIGS. 10A-10D. The SOI substrate comprises or consists of the single-crystalline silicon device layer 751, the silicon oxide layer 706, and the single-crystalline silicon handle layer 705 (shown in FIGS. 10B-10D). The device layer 751 is doped with impurities to make it electrically conductive. In certain embodiments, the single-crystalline silicon device layer 751 is doped with phosphorus dopants and the average phosphorus dopant concentration is at least $2\times10^{19}$ $cm^{-3}$. The MEMS resonator assembly 700 of FIG. 10A comprises a resonator element 701, a support structure 702 (represented by support structure portions 781-784), four suspension elements 741*a*, 742*a*, 743*b*, 744*b* which tether the resonator element 701 to the support structure 702, and four fixed electrodes 771-774 which are used for electrostatic actuation. The resonator element 701 comprises two extensional-mode resonators (710*a*, 710*b*), a flexural mode resonator 720, and three connector elements, one of which connects the flexural resonator 720 to the extensional-mode resonator 710*a*, and two of which connect the flexural resonator 720 to the extensional-mode resonator 710*b*. The extensional-mode resonators 710*a*, 710*b* illustrated in FIG. 10A are interconnected LE resonator assemblies which both comprise five elongated beam-shaped LE-mode resonators 711. Each LE resonator 711 is connected to its adjacent LE resonator(s) at its distal ends via substantially rigid material portions (interconnection elements) 712. The resonator element 701, the suspension elements 741*a*, 742*a*, 743*b*, 744*b*, and the fixed electrodes 771-774 are formed in the single-crystalline silicon device layer 751, as illustrated in FIG. 10B which is the AA' cross-section of FIG. 10A. Two electrodes 771, 772 are formed opposite to the outermost sidewalls of the interconnected LE resonator assemblies. A narrow gap 791 (or 792) separates the electrode 771 (or 772) from the opposing sidewall of the interconnected LE resonator assembly 710*a* (or 710*b*). The gap is typically less than 500 nm wide and preferably less than 100 nm wide. There may be electrodes also facing the innermost sidewalls of the interconnected LE resonator assemblies as illustrated in FIG. 10A. Narrow gaps separate electrodes 773, 774, formed in the device layer of the SOI substrate, from the opposing sidewalls of the interconnected LE resonator assemblies 710*a*, 710*b* (such as the gaps 793 and 794 separating the electrode 774 from the interconnected LE resonator assemblies 710*a* and 710*b*, respectively).

The resonator element 701 is separated from the handle layer 705 by a cavity 707. The cavity may be formed for example by using hydrofluoric (HF) acid vapor etching to remove the silicon oxide from the cavity. Release of the resonator element may require etching holes 798, illustrated in FIG. 10C, through the device layer using deep reactive ion etching (DRIE) to provide a flow channel for HF vapor down to the silicon oxide layer 706. Some etch holes 798 have been illustrated in FIG. 10C which represents the same AA' cross-section of FIG. 10A as FIG. 10B but with etch holes 798 shown.

Figure 10D:
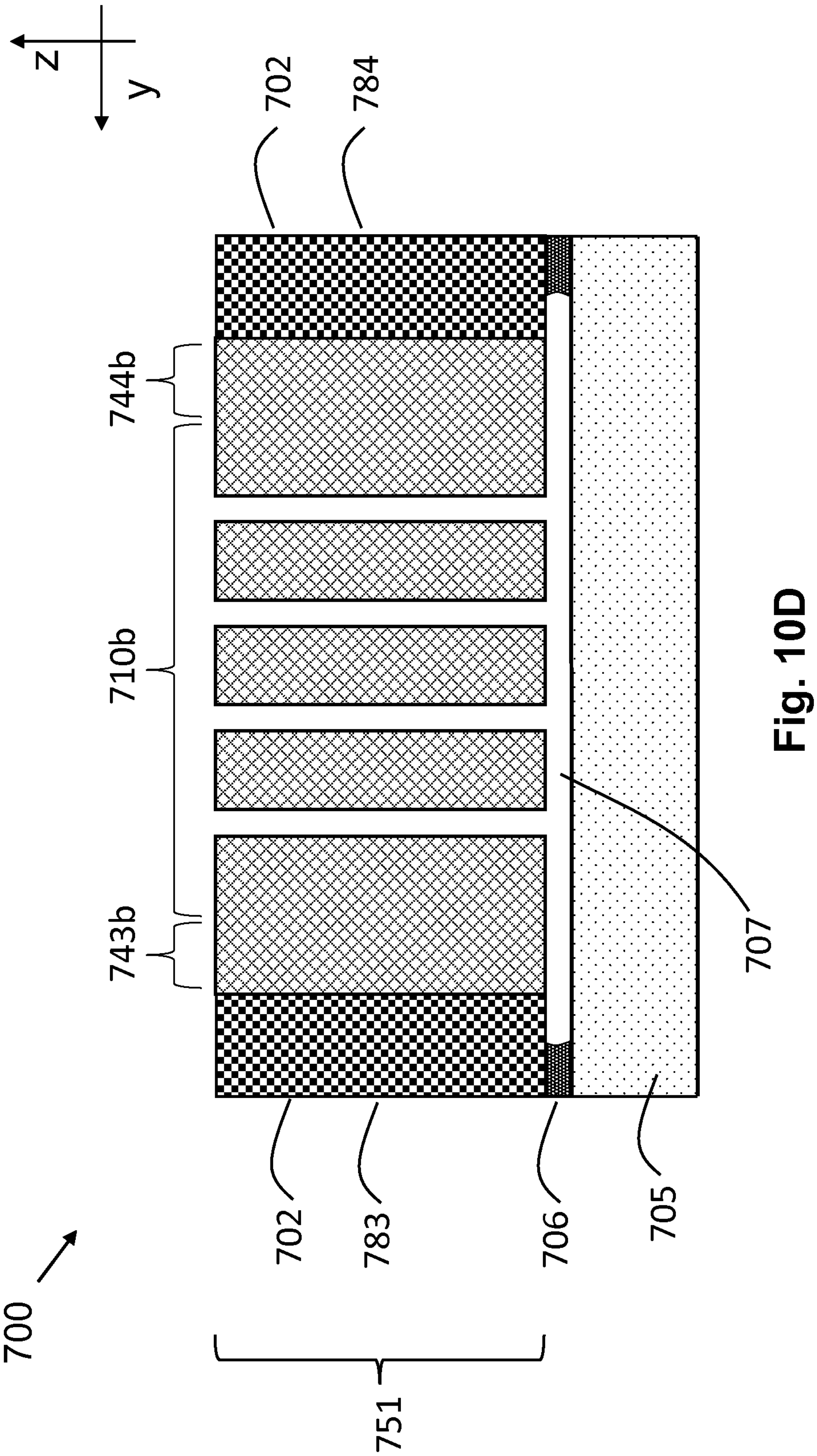
FIG. 10D shows an example of a cross section of the MEMS resonator assembly of FIG. 10A along the line BB'.

The BB' cross-section of FIG. 10A is illustrated in FIG. 10D. Suspension elements 743*b* and 744*b* tether the interconnected LE resonator assembly 710*b* to the support structures 783 (702) and 784 (702), respectively, which are formed in the device layer 751 of the SOI substrate.

The MEMS resonator element 701 can be excited to the collective extensional-mode resonance illustrated in FIG. 3B by electrostatic actuation. To achieve this, the (fixed) electrodes 771-774 may be galvanically connected to the same terminal (say, X1). These galvanic connections may be realized by etching trenches through the device layer 751 of SOI substrate to pattern electrically conducting structures and/or by forming electrically conducting structures in the package of the MEMS resonator assembly 700 (such a ceramic package or a wafer-level package). The support structures 781-784, which are galvanically connected to the resonator element, are galvanically connected to another terminal (say, X2) (for example by using conductors formed in the device layer 751 and/or by electrically conducting structures in the package of the MEMS resonator assembly 700). A DC bias voltage may then be connected to one of the terminals (such as X1) through a large impedance to create a sufficient electromechanical coupling to the resonator element 701 while the other terminal (such as X2) stays at zero DC potential. The extensional-mode resonance can then be excited by applying an alternating voltage at the resonance frequency between the terminals X1 and X2 and the MEMS resonator element 701 will then vibrate in a collective extensional-mode resonance illustrated by FIG. 3B.

Figure 11A:
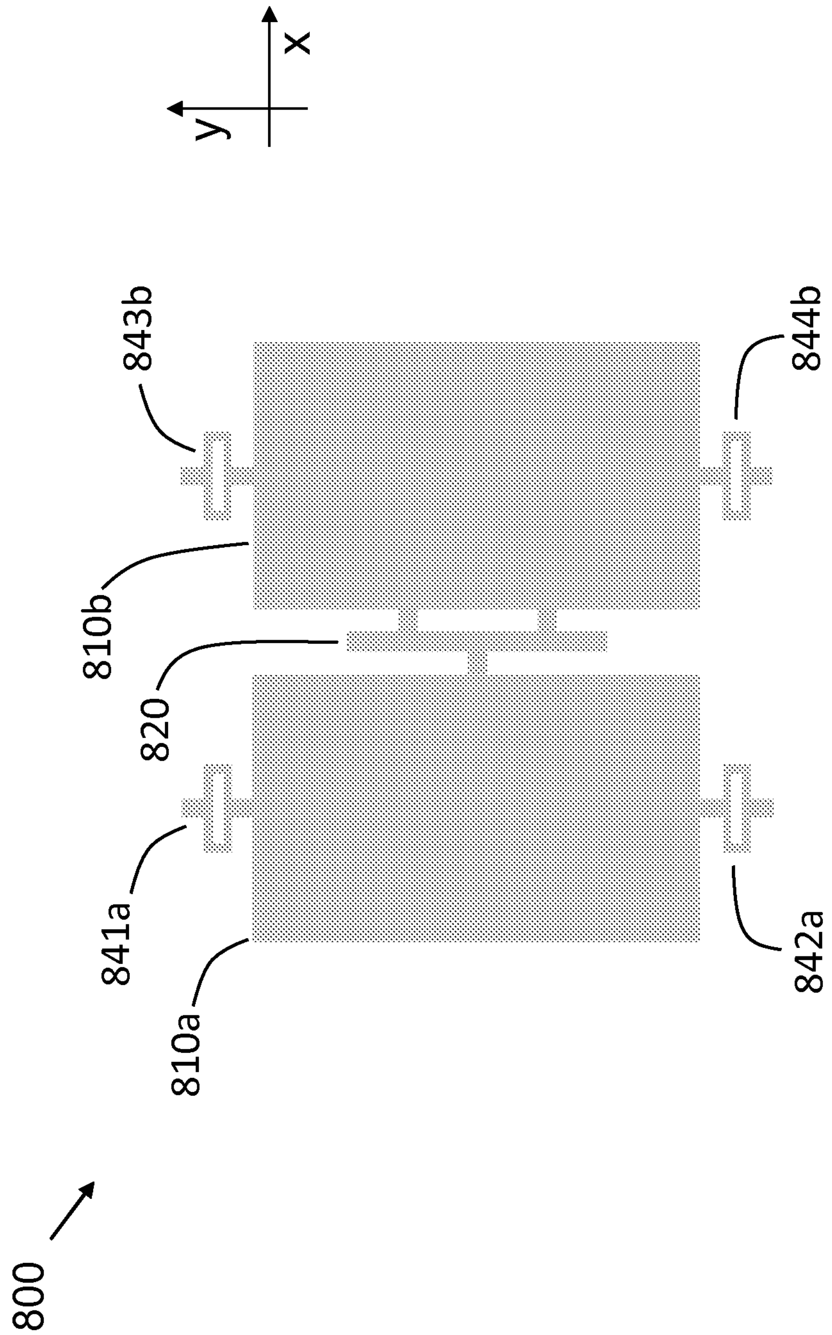
FIG. 11A shows an embodiment composed of two WE resonators and one in-plane flexural resonator designed to vibrate in its $3^{rd}$ overtone.

FIG. 11A shows an embodiment composed of two width-extensional (WE) mode resonators 810*a*,810*b* and a (in-plane) flexural mode resonator 820 designed to vibrate in its $3^{rd}$ overtone. The whole shown structure is a suspended structure. The WE mode resonators 810*a*,810*b* are tethered to a support structure (not shown) via suspension elements 841*a*, 842*a*, 843*b*, 844*b*. In the exemplary embodiment illustrated in FIG. 11A, the suspension elements have a meander-shaped structure which may be useful for example to relax stresses in the y direction. The three centermost anti-nodal points of the flexural resonator 820 are populated with connector elements which couple these anti-nodal points to the adjacent side walls of the WE mode resonators 810*a*,810*b*. The width W and length L of the flexural resonator 820 are such that its third overtone resonance substantially equals to the resonance frequencies of the extensional-mode resonators (here: WE mode resonators) 810*a*, 810*b*.

Figure 11B:
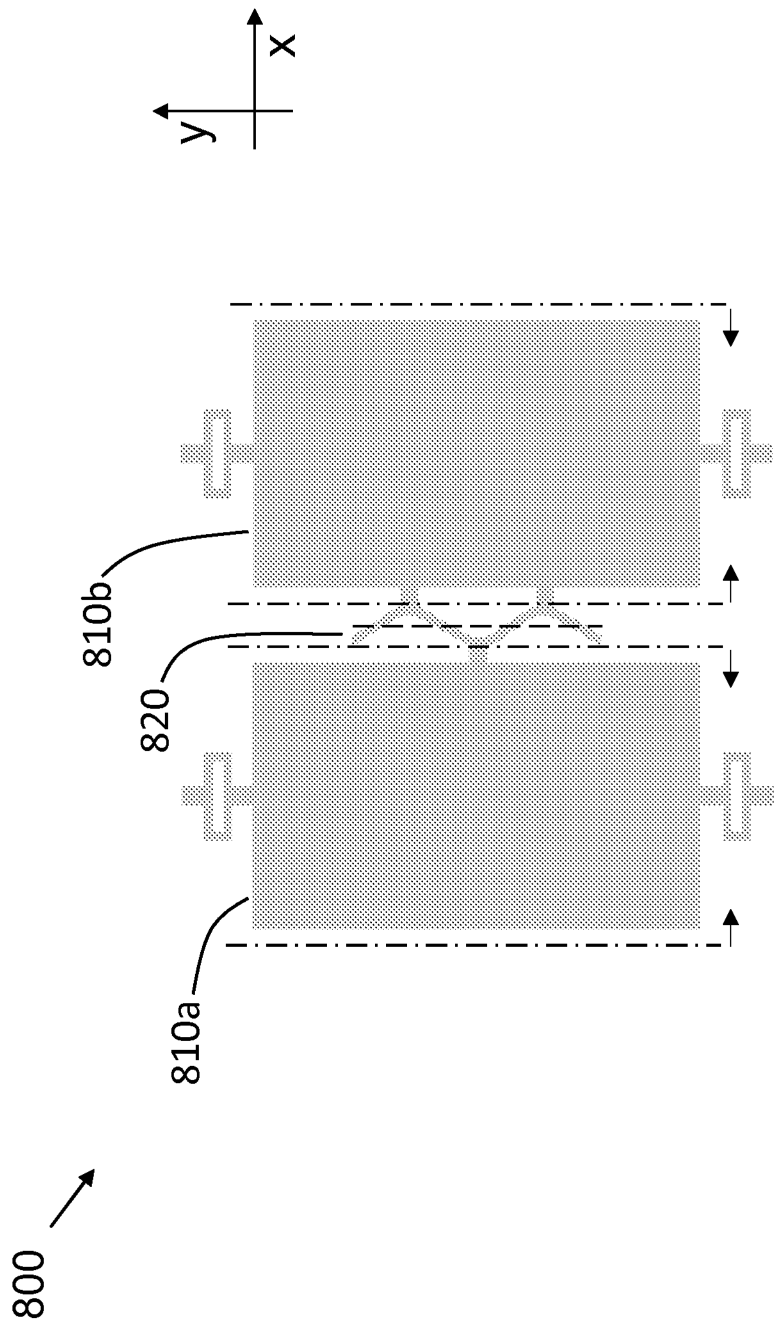
FIG. 11B shows the embodiment of FIG. 11A at maximum displacement of a vibration cycle.

FIG. 11B shows the same embodiment as depicted in FIG. 11A at maximum displacement of a vibration cycle. The dash-dotted lines represent the initial resting position of the WE mode resonators 810*a*, 810*b*. The flexural mode resonator 820 is shown vibrating at its $3^{rd}$ overtone. The displacement scale is magnified for illustrative purposes. The whole MEMS resonator assembly illustrated in FIG. 11B vibrates in a collective resonance mode in which the motions of the extensional-mode resonators 810*a*, 810*b* are substantially in the same phase with respect to each other.

Figure 12A:
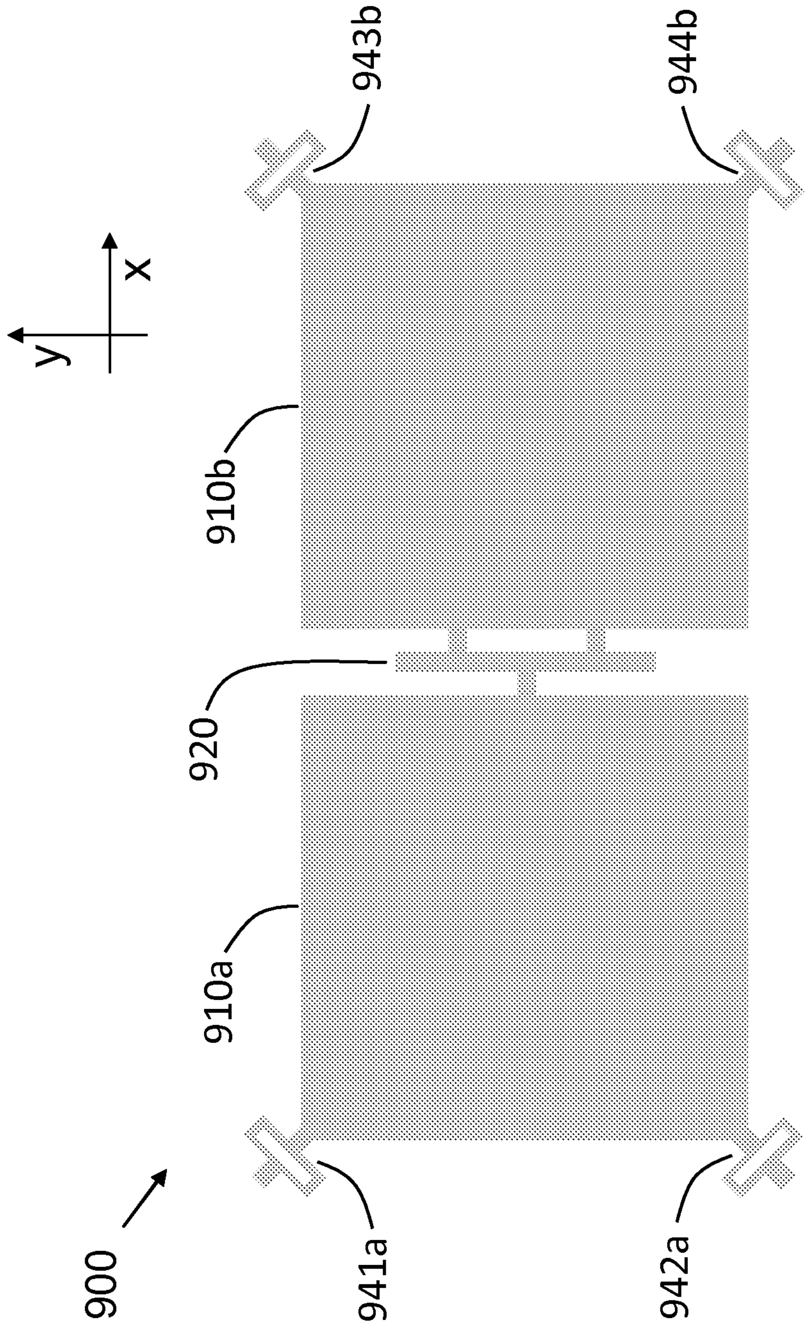
FIG. 12A shows an embodiment composed of two SE resonators and one in-plane flexural resonator designed to vibrate in its $3^{rd}$ overtone.

In certain embodiments, as illustrated in FIG. 12A, the MEMS resonator assembly comprises two square-extensional (SE) mode resonators 910*a*, 910*b* and a flexural mode resonator 920 designed to vibrate in its $3^{rd}$ overtone in the xy-plane. The whole shown structure is a suspended structure. The SE mode resonators 910*a*, 910*b* are tethered to a support structure (not shown) via suspension elements 941*a*, 942*a*, 943*b*, 944*b*. In the exemplary embodiment illustrated in FIG. 12A, the meander-shaped structures of the suspension elements are mechanically compliant to allow for alternating contraction and expansion of the square-extensional mode resonators 910*a*, 910*b* during the mechanical resonance motion. The three centermost anti-nodal points of the flexural mode resonator 920 are populated with connector elements which couple these anti-nodal points to the adjacent side walls of the SE mode resonators 910*a*, 910*b*. The width W and length L of the flexural resonator 920 are such that its third overtone resonance substantially equals to the resonance frequencies of the extensional-mode resonators (here: square-extensional (SE) mode resonators) 910*a*, 910*b*.

Figure 12B:
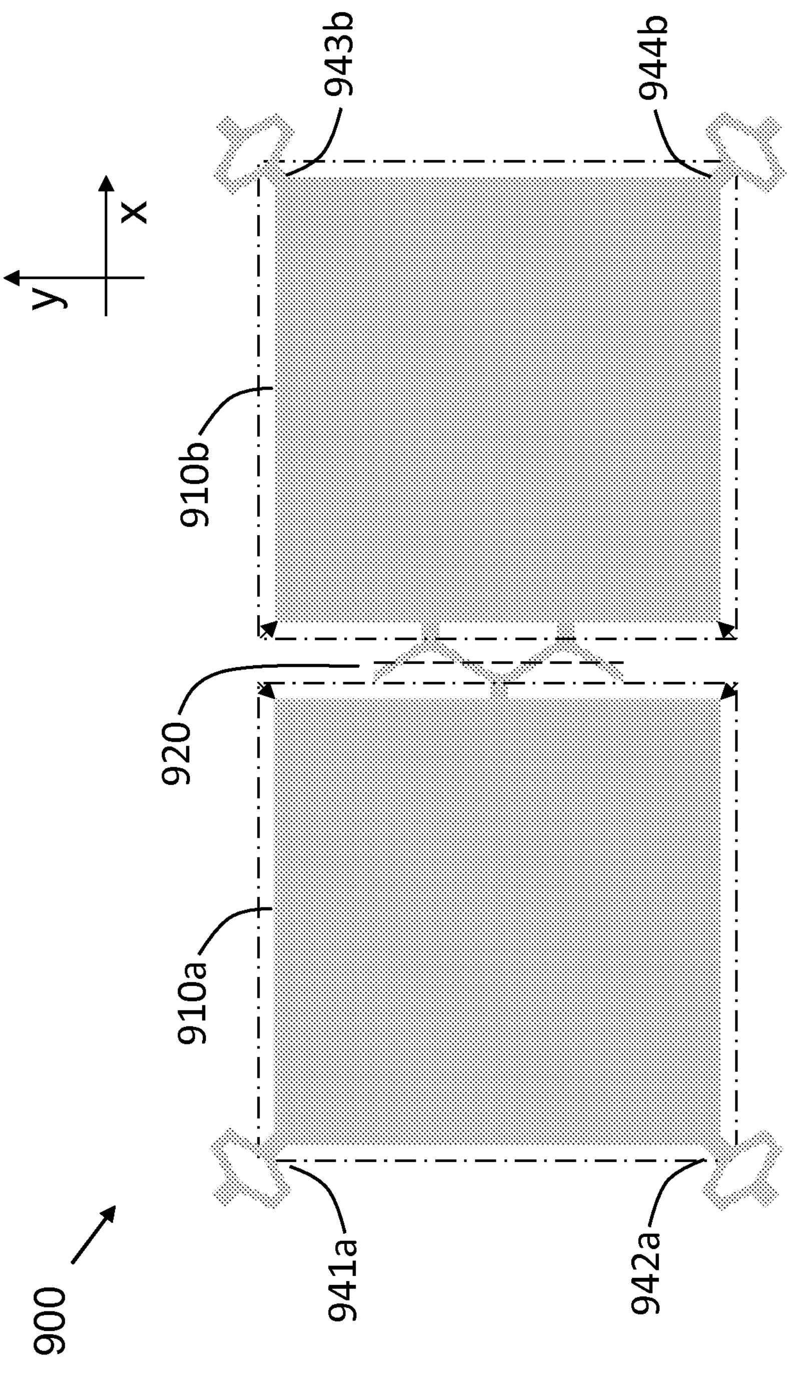
FIG. 12B shows the embodiment of FIG. 12A at maximum inward displacement of a vibration cycle.

In certain other embodiments comprising a SE mode resonator, a suspension element of the SE resonator is connected on another position than in the exemplary embodiment of FIGS. 12A-12B. For example, the suspension element may comprise a structure positioned at the center of the SE resonator (a central pillar) which is a nodal point for the square-extensional vibration mode. The suspension element may be formed by a material portion within a cavity of a CSOI structure between the device layer and the handle layer. The suspension element may comprise single-crystalline silicon, polycrystalline silicon, and/or silicon oxide.

FIG. 12B shows the same embodiment as depicted in FIG. 12A at the maximum inward displacement of a vibration cycle. The dash-dotted lines represent the initial resting position of the SE mode resonators 910*a*, 910*b*. The flexural mode resonator 920 is shown vibrating at its 3rd overtone. The displacement scale is magnified for illustrative purposes. The whole MEMS resonator assembly illustrated in FIG. 12B vibrates in a collective resonance mode in which the motions of the extensional-mode resonators 910*a*, 910*b* are substantially in the same phase with respect to each other.

Figure 13:
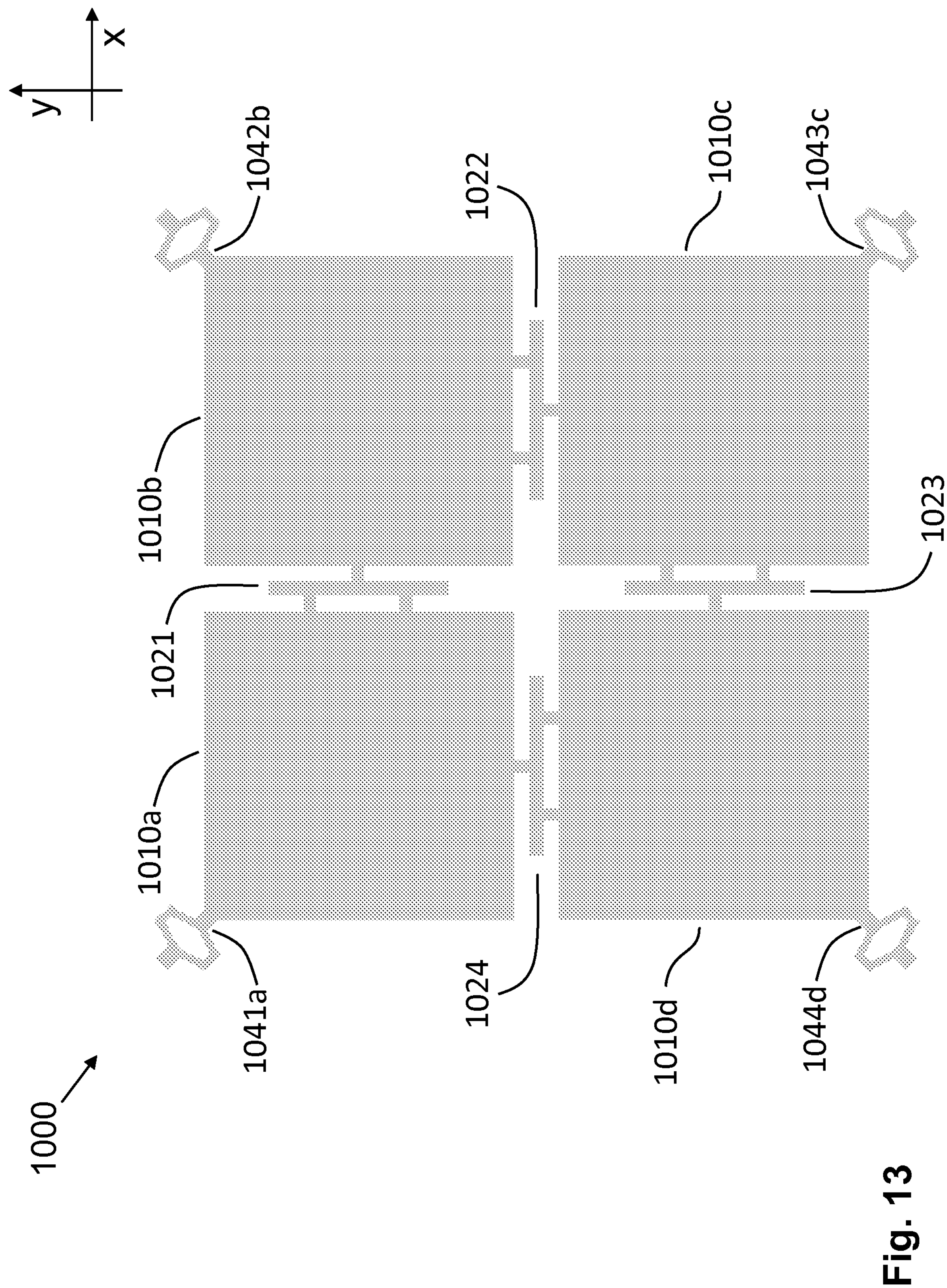
FIG. 13 shows a MEMS resonator assembly comprising four SE resonators positioned in a 2×2 array configuration.

In certain embodiments, as illustrated in FIG. 13, the MEMS resonator assembly comprises several SE mode resonators (here: four SE resonators 1010*a*, 1010*b*, 1010*c*, 1010*d* positioned in a 2×2 array configuration) and several flexural mode resonators (here: four flexural resonators 1021-1024). In the exemplary embodiment of FIG. 13, each flexural mode resonator is connected to two adjacent SE resonators. The flexural mode resonators 1021-1024 have their respective widths W and lengths L such that their third overtone resonance frequencies substantially equal to the resonance frequencies of the extensional-mode (SE) resonators 1010*a*, 1010*b*, 1010*c*, 1010*d*. The three centermost anti-nodal points of the flexural mode resonators 1021-1024 are populated with connector elements which couple these anti-nodal points to the adjacent side walls of the SE mode resonators 1010*a*, 1010*b*, 1010*c*, 1010*d*. The 2×2 array illustrated in FIG. 13 is a suspended structure in which meander-shaped suspension elements 1041*a*, 1042*b*, 1043*c*, 1044*d* tether the resonator element to the support structure (not shown). In certain alternative embodiments, the four SE resonators are suspended by suspension elements which mechanically connect the nodal point at the center of the respective SE resonator to the handle layer, as discussed above. The MEMS resonator assembly 1000 vibrates in a collective resonance mode in which the motions of the extensional-mode resonators 1010*a*, 1010*b*, 1010*c*, 1010*d* are substantially in the same phase with respect to each other.

Figure 14A:
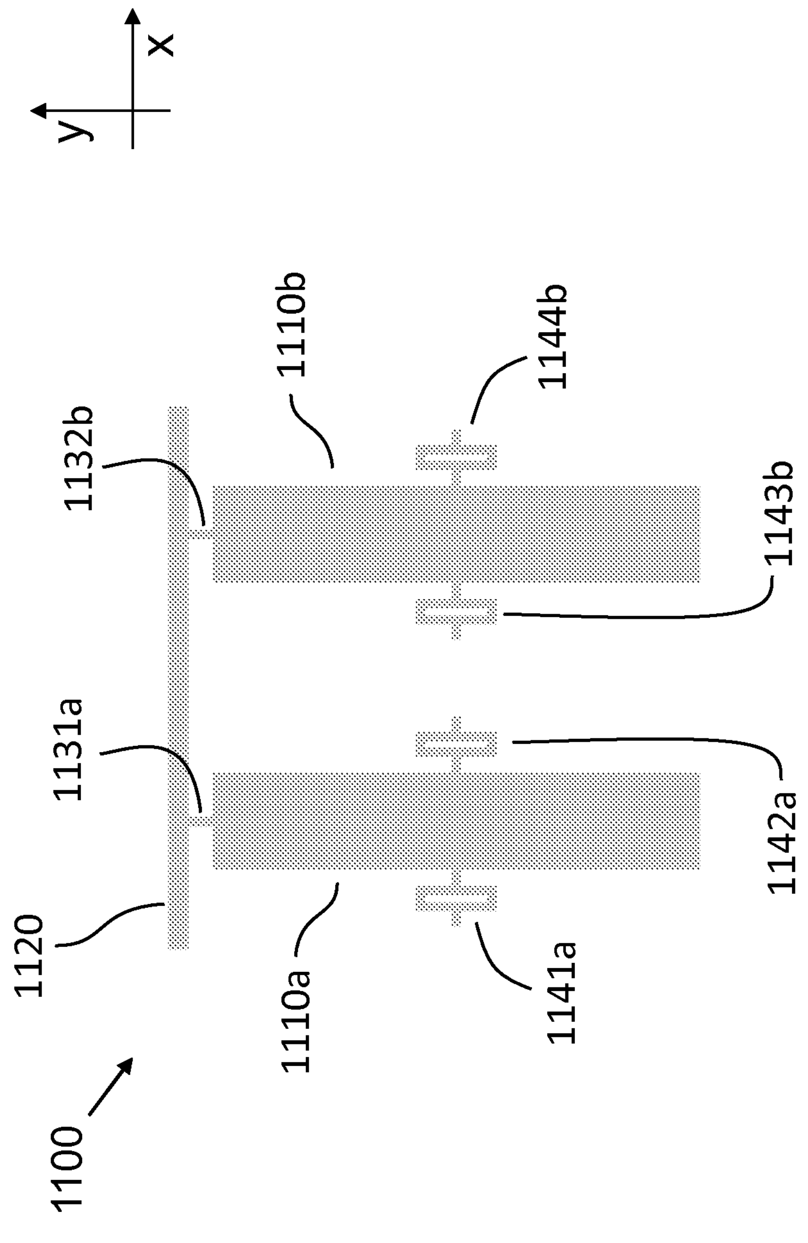
FIG. 14A shows another MEMS resonator assembly comprising two LE resonators and a flexural resonator designed to vibrate in its $3^{rd}$ overtone.

FIG. 14A shows a MEMS resonator assembly 1100 comprising two length-extensional (LE) mode resonators 1110*a*, 1110*b* and a (in-plane) flexural mode resonator 1120 designed to vibrate in its $3^{rd}$ overtone. The whole shown structure is a suspended structure. The LE mode resonators 1110*a*, 1110*b* are tethered to a support structure (not shown) via suspension elements 1141*a*, 1142*a*, 1143*b*, 1144*b*. In the exemplary embodiment illustrated in FIG. 14A, the suspension elements have a meander-shaped structure which may be useful for example to relax stresses in the x direction. Two anti-nodal points 1131*a*, 1132*b* of the flexural resonator 1120 are populated with connector elements which couple these anti-nodal points to the distal-end side walls of the LE mode resonators 1110*a*, 1110*b*. The width W and length L of the flexural resonator 1120 are such that its third overtone resonance substantially equals to the resonance frequencies of the extensional-mode resonators (here: LE mode resonators) 1110*a*, 1110*b*.

Figure 14B:
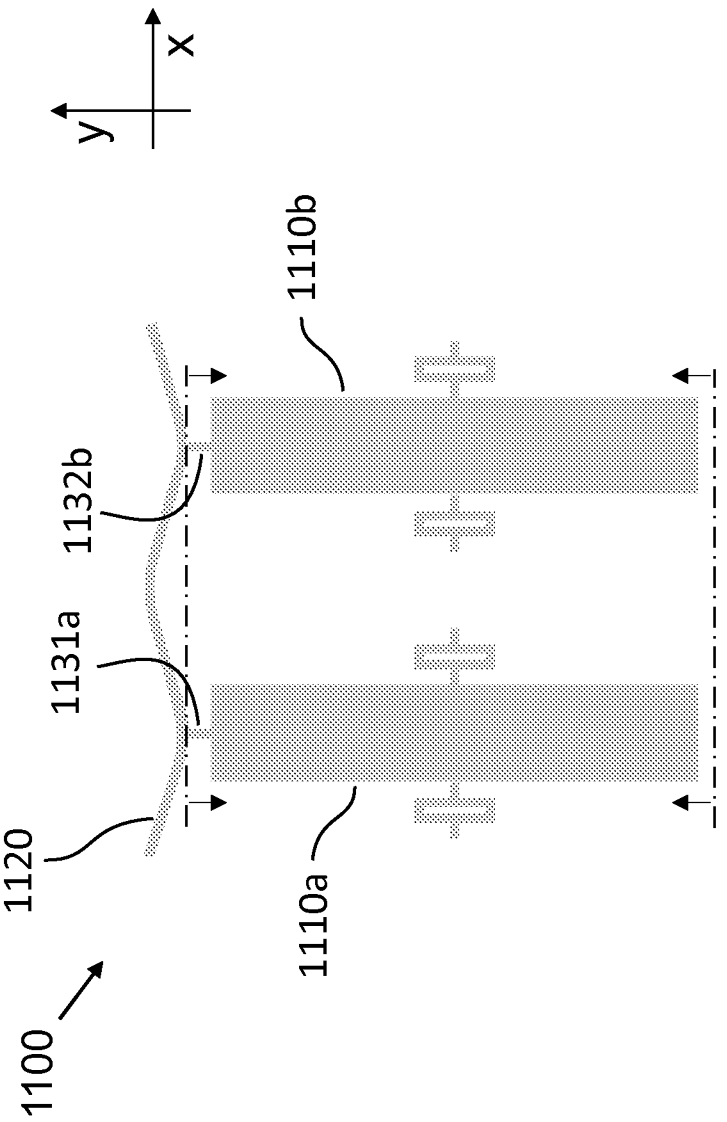
FIG. 14B shows the embodiment of FIG. 14A at maximum displacement of a vibration cycle.

FIG. 14B shows the same embodiment as depicted in FIG. 14A at a maximum displacement of a vibration cycle (at the maximum contraction of the LE mode resonators 1110*a*, 1110*b*). The dash-dotted lines represent the initial resting position of the distal ends of the LE mode resonators 1110*a*, 1110*b*. The flexural mode resonator 1120 is shown vibrating at its $3^{rd}$ overtone. The displacement scale is magnified for illustrative purposes.

At the maximum contraction position illustrated in FIG. 14B, the distal ends of the LE resonators 1110*a*, 1110*b* have moved in the y direction towards their (central) symmetry axes as illustrated by the four arrows next to the two dash-dot lines in FIG. 14B. At the maximum extension position of the vibration which is 180 degrees off in phase with respect to the maximum contraction, the distal ends of the LE resonators 1110*a*, 1110*b* extend in the y direction outwards from their central symmetry axes. At the maximum contraction position illustrated in FIG. 14B, the shape of the flexural resonator 1120 is such that the material portions close to the connector element 1131*a* connecting the flexural resonator 1120 to the extensional-mode resonator 1110*a*, and the material portions close to the connector elements 1132*b* connecting the flexural resonator 1120 to the extensional-mode resonator 1110*b*, move in the same direction along the y axis and follow the motion of the adjacent distal ends of the LE resonators 1110*a*, 1110*b*. The flexural resonator 1120 has an anti-nodal position in the middle of the anti-nodal connection points to the connector elements 1131*a* and 1132*b*, and two anti-nodal positions at its both ends. In the embodiment illustrated in FIG. 14B, these three anti-nodal positions do not have connector elements attached to them and they move during the vibration in the opposite direction with respect to the two anti-nodal positions connected to the connector elements 1131*a* and 1132*b*. The whole MEMS resonator assembly illustrated in FIG. 14B vibrates in a collective resonance mode in which the motions of the extensional-mode resonators 1110*a*, 1110*b* are substantially in the same phase with respect to each other.

Figure 15A:
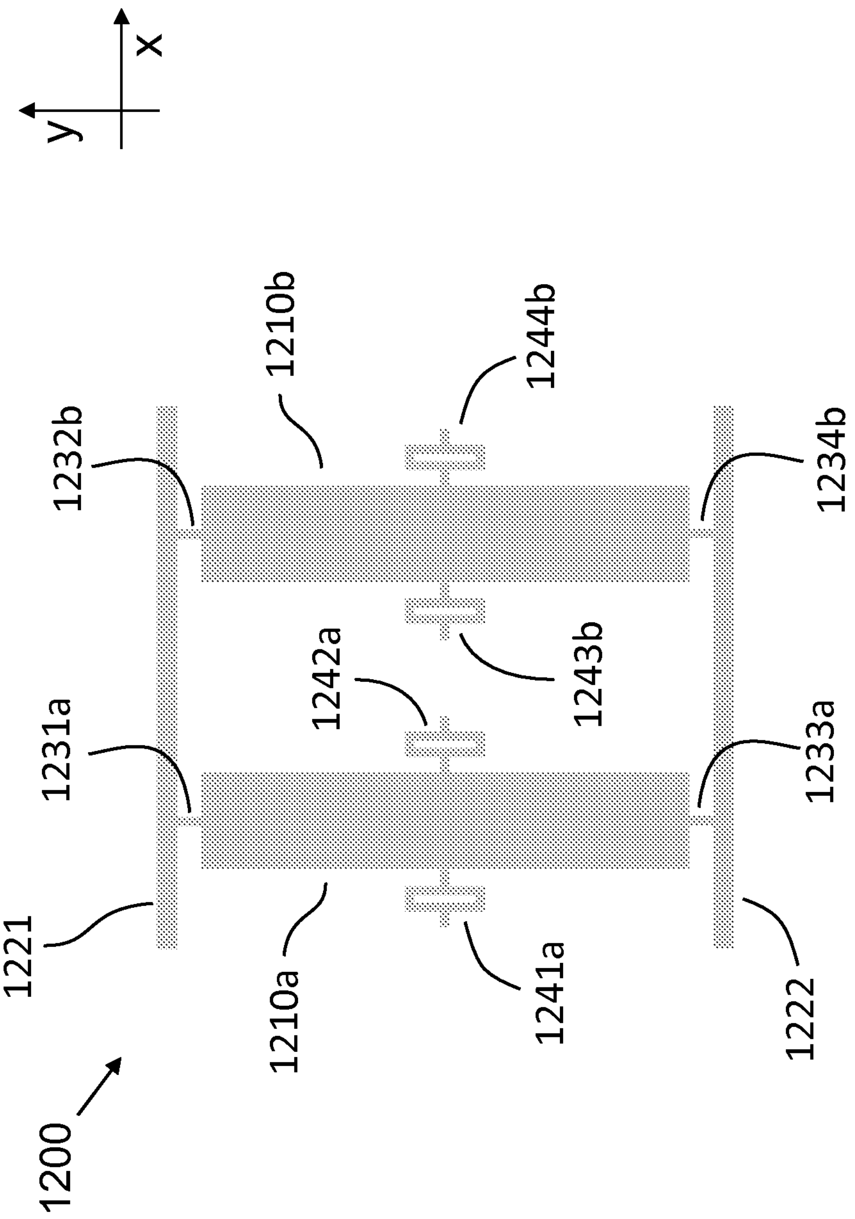
FIG. 15A shows a MEMS resonator assembly comprising two LE resonators and two flexural resonators coupled to both distal ends of the LE resonators.

FIG. 15A shows a MEMS resonator assembly 1200 comprising two length-extensional (LE) mode resonators 1210*a*, 1210*b*, arranged in a row along the x axis with the longitudinal axes of the LE resonators aligned along the y direction, and two (in-plane) flexural mode resonators 1221, 1222. The distal ends of the LE resonators 1210*a*, 1210*b* in the positive y direction are coupled via the flexural mode resonator 1221 and the distal ends in the negative y direction are coupled via the flexural mode resonator 1222. The whole shown structure is a suspended structure. The LE mode resonators 1210*a*, 1210*b* are tethered to a support structure 120 (not shown) via suspension elements 1241*a*, 1242*a*, 1243*b*, 1244*b*. Two anti-nodal points of the flexural resonator 1221 are populated with connector elements 1231*a*, 1232*b* which couple these anti-nodal points to the adjacent distal-end side walls of the LE mode resonators 1210*a*, 1210*b*. Two anti-nodal points of the flexural resonator 1222 are populated with connector elements 1233*a*, 1234*b* which couple these anti-nodal points to the adjacent distal-end side walls of the LE mode resonators 1210*a*, 1210*b*. The widths W and lengths L of the flexural resonators 1221, 1222 are such that their third overtone frequencies substantially equal to the resonance frequencies of the extensional-mode resonators (here: LE mode resonators) 1210*a*, 1210*b*.

Figure 15B:
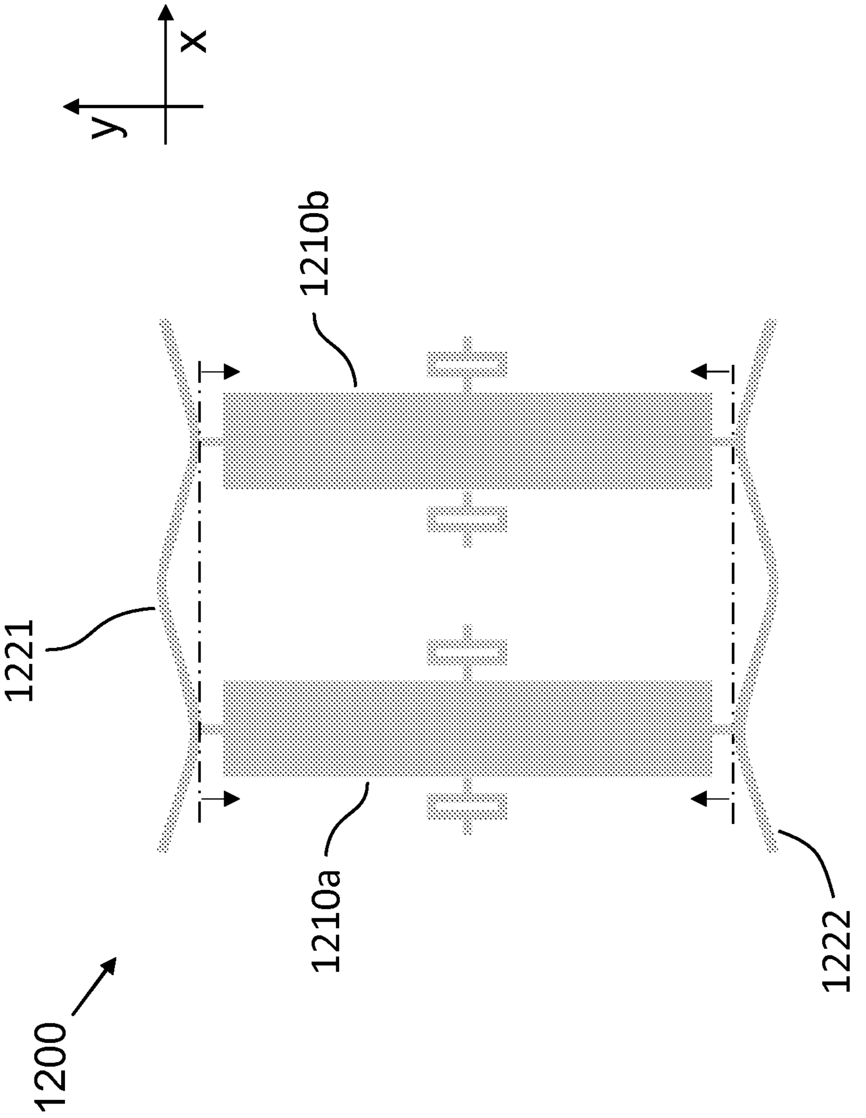
FIG. 15B shows the embodiment of FIG. 15A at maximum contraction of the LE resonators during a vibration cycle.

FIG. 15B shows the same embodiment as depicted in FIG. 15A at the maximum contraction of the LE mode resonators 1210*a*, 1210*b* during the vibration cycle. The dash-dotted lines represent the initial resting position of the distal ends of the LE mode resonators 1210*a*, 1210*b*. The displacement scale is magnified for illustrative purposes. The whole MEMS resonator assembly 1200 vibrates in a collective resonance mode in which the motions of the extensional-mode resonators 1210_a_, 1210_b_ are substantially in the same phase with respect to each other.

Figure 16A:
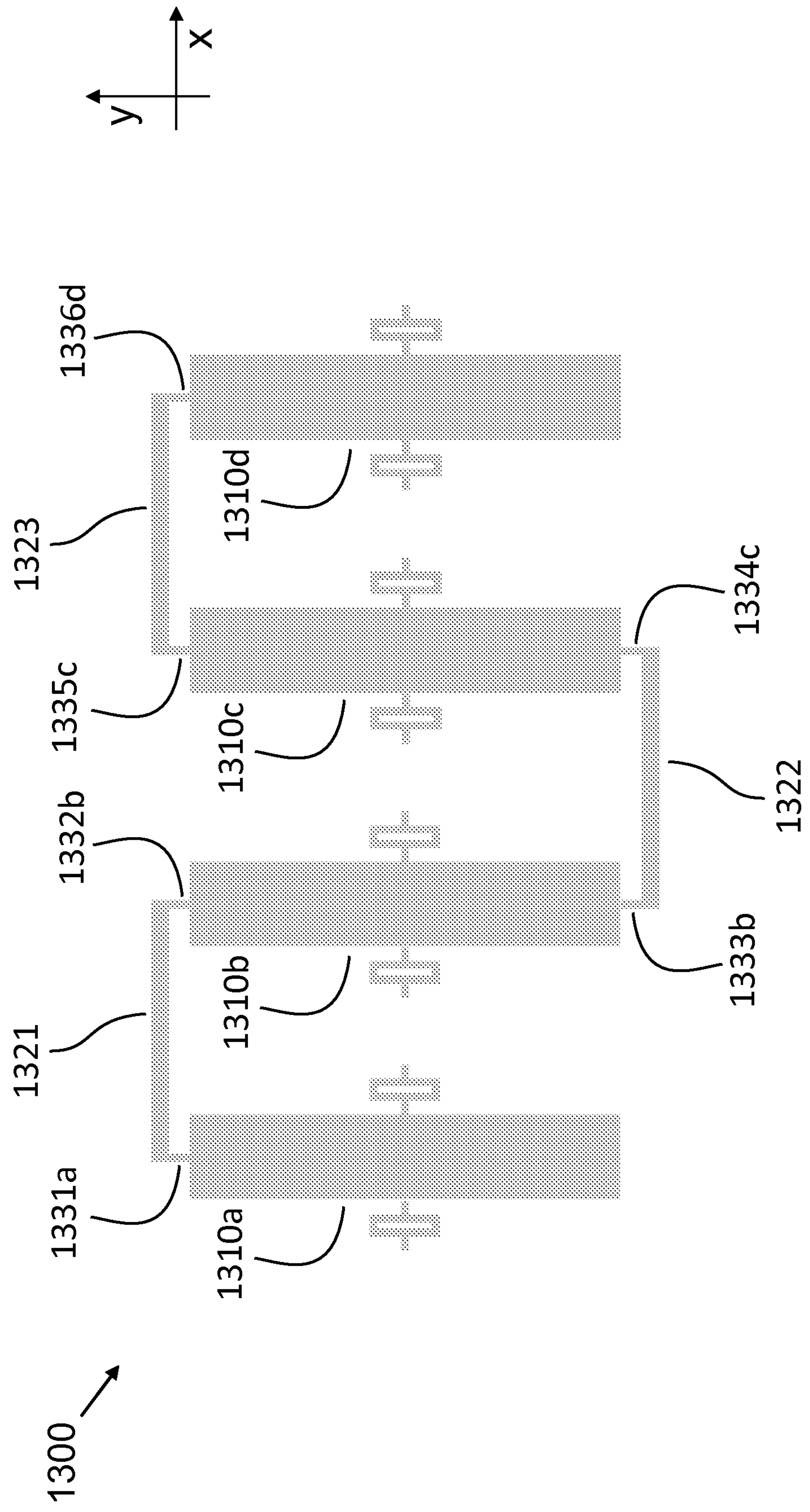
FIG. 16A shows a MEMS resonator assembly comprising four LE resonators and three flexural resonators coupled to distal ends of the LE resonators.

FIG. 16A shows a MEMS resonator assembly 1300 comprising four length-extensional (LE) mode resonators 1310_a_, 1310_b_, 1310_c_, 1310_d_ and three (in-plane) flexural mode resonators 1321, 1322, 1323 coupled to the distal ends of the LE resonators. The LE mode resonators have been arranged in a row along the x axis so that the longitudinal axes of the LE resonators are aligned along the y direction. The widths W and lengths L of the flexural mode resonators 1321, 1322, 1323 are such that their $1^{st}$ overtone frequencies substantially equal to the resonance frequencies of the extensional-mode resonators (here: LE mode resonators) 1310_a_, 1310_b_, 1310_c_, 1310_d_. The outermost anti-nodal positions of the flexural resonators 1321, 1322, 1323 are connected to connector elements (1331_a_, 1332_b_, 1333_b_, 1334_c_, 1335_c_, 1336_d_). The other ends of these connector elements are connected to the adjacent distal-end sidewalls of the LE mode resonators. The flexural resonator 1321 (or 1323) is connected to the distal ends of LE resonators 1310_a_ and 1310_b_ (or 1310_c_ and 1310_d_), in the direction of the positive y axis with respect to the center line of the LE resonators. The flexural resonator 1322 is connected to the distal ends of LE resonators 1310_b_ and 1310_c_ in the direction of the negative y axis with respect to the center line of the LE resonators.

Figure 16B:
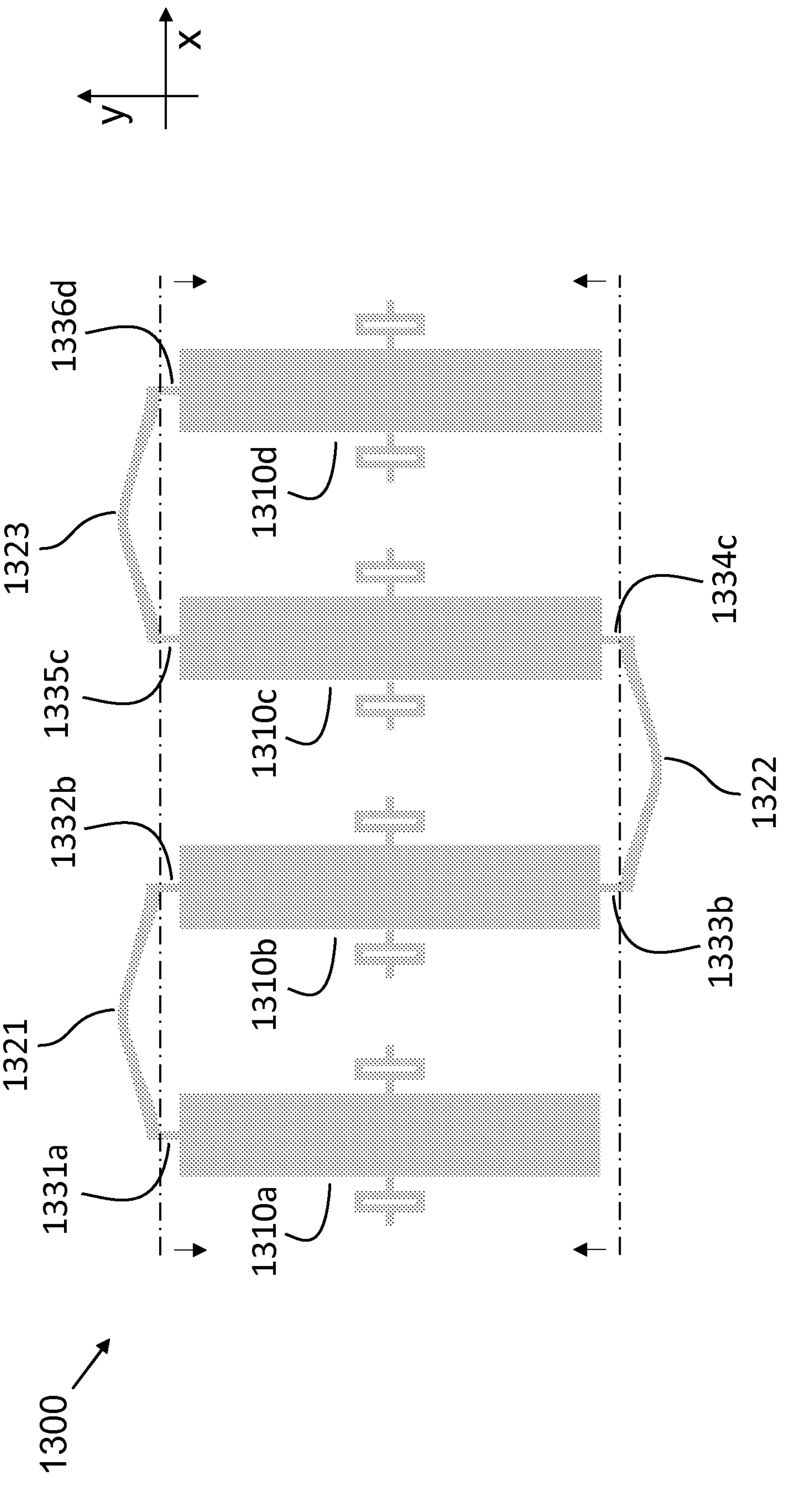
FIG. 16B shows the embodiment of FIG. 16A at maximum contraction of the LE resonators during a vibration cycle

FIG. 16B shows the same embodiment as depicted in FIG. 16A at the maximum contraction of the LE mode resonators 1310_a_, 1310_b_, 1310_c_, 1310_d_ during the vibration cycle. The dash-dotted lines represent the initial resting position of the distal ends of the LE mode resonators 1310_a_, 1310_b_, 1310_c_, 1310_d_. The displacement scale is magnified for illustrative purposes. The whole MEMS resonator assembly 1300 vibrates in a collective resonance mode in which the motions of the extensional-mode resonators 1310_a_, 1310_b_, 1310_c_, 1310_d_ are substantially in the same phase with respect to each other.

Further to the advantages discussed above, embodiments illustrated in FIGS. 14A-14B, FIGS. 15A-15B, and FIGS. 16A-16B have certain other advantages. Firstly, the electrical resistance for the AC current passing through the MEMS resonator assembly is low. The ohmic losses within the resonator element are minimized because each LE resonator member of the MEMS resonator assembly has a low electrical resistance to the support structure where ohmic losses are low. Secondly, thermomechanical stresses within the resonator element are low because the suspension elements for each LE resonator are close to each other. This increases thermal and long-term stability of the resonance frequency.

Figure 17:
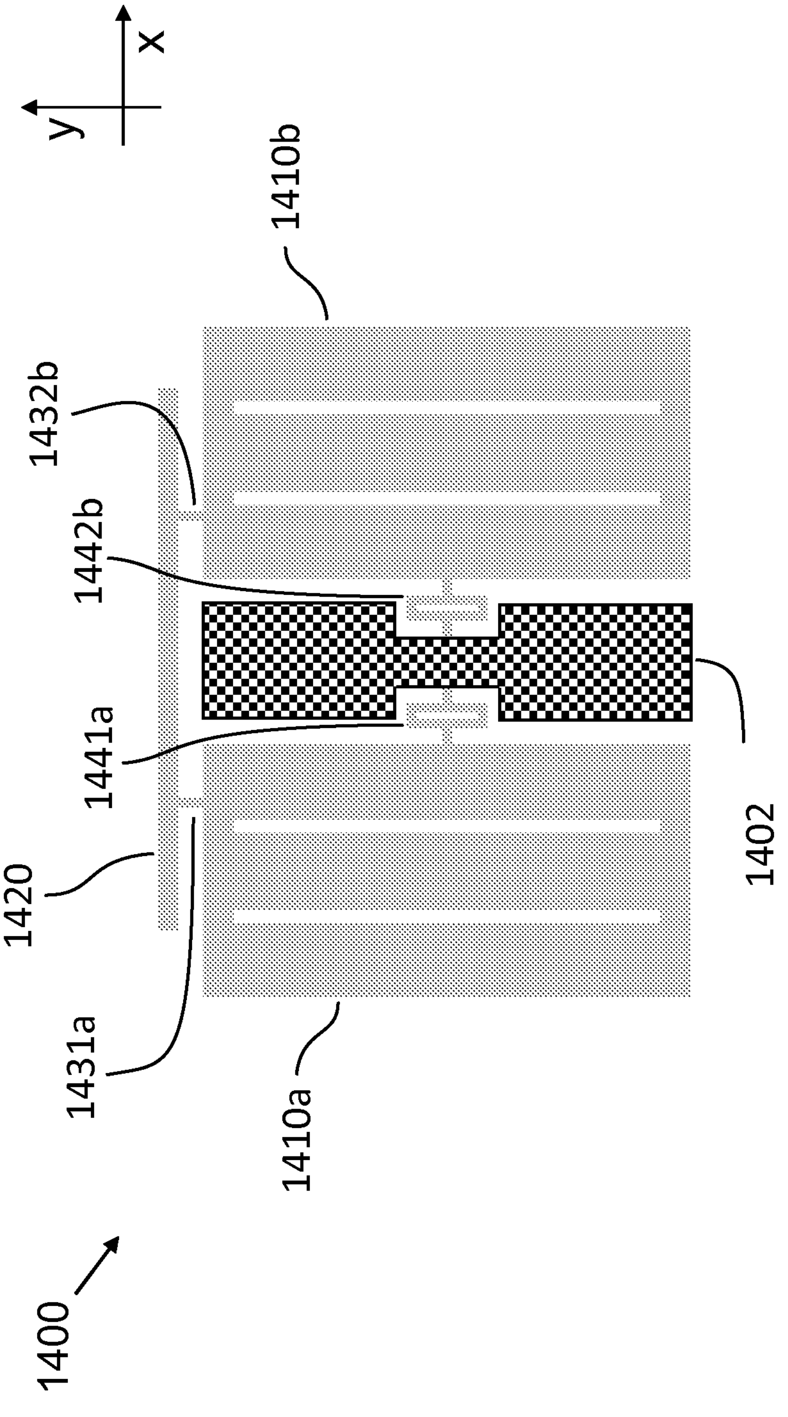
FIG. 17 shows a MEMS resonator assembly comprising two interconnected LE resonator assemblies and a flexural mode resonator coupled to distal ends of the interconnected LE resonator assemblies.

FIG. 17 shows a MEMS resonator assembly 1400 comprising two interconnected LE resonator assemblies 1410_a_, 1410_b_ and a (in-plane) flexural mode resonator 1420 coupled to the distal ends of the interconnected LE resonator assemblies. The two interconnected LE resonator assemblies have been arranged in a row along the x axis so that the longitudinal axes of the interconnected LE resonator assemblies are aligned along the y direction. The width W and length L of the flexural mode resonator 1420 is such that its third overtone frequency substantially equals to the resonance frequencies of the extensional-mode resonators (here: interconnected LE resonator assemblies) 1410_a_, 1410_b_. Two anti-nodal points of the flexural resonator 1420 are populated with connector elements 1431_a_, 1432_b_ which couple these anti-nodal points to the adjacent distal-end side walls of the interconnected LE resonator assemblies 1410_a_, 1410_b_. The interconnected LE resonator assemblies 1410_a_, 1410_b_ are tethered to the same support structure 1402 in the middle of the two interconnected LE resonator assemblies via suspension elements 1441_a_ and 1442_b_. The whole MEMS resonator assembly 1400 vibrates in a collective resonance mode in which the motions of the extensional-mode resonators 1410_a_, 1410_b_ are substantially in the same phase with respect to each other.

The support structure 1402 and suspension elements 1441_a_ and 1442_b_ which are symmetric about the center line parallel to the y axis have several advantages. First, such a central support structure reduces leakage of the vibration energy through suspension elements to the support structure because there is no vibrational motion along the x directing during the vibration unlike in the situation illustrated in FIGS. 3C-3D in which the small alternating contraction and extension of LE resonators 151 at their center lines causes some (albeit small) motion at both connection points of the two suspension elements 141_a_ and 142_a_ and the support structure. Therefore, in MEMS resonators with a central support structure the quality factor of the resonance is increased and ESR (equivalent series resistance) is decreased. Second, a central support structure decreases thermomechanical stresses experienced by the resonator element because the connection points of the suspension elements 1441_a_ and 1442_b_ and the support structure 1402 are close to each other. Third, a central support structure together with its low thermomechanical stresses tend to improve thermal and long-term stability of the resonance frequency.

Figure 18:
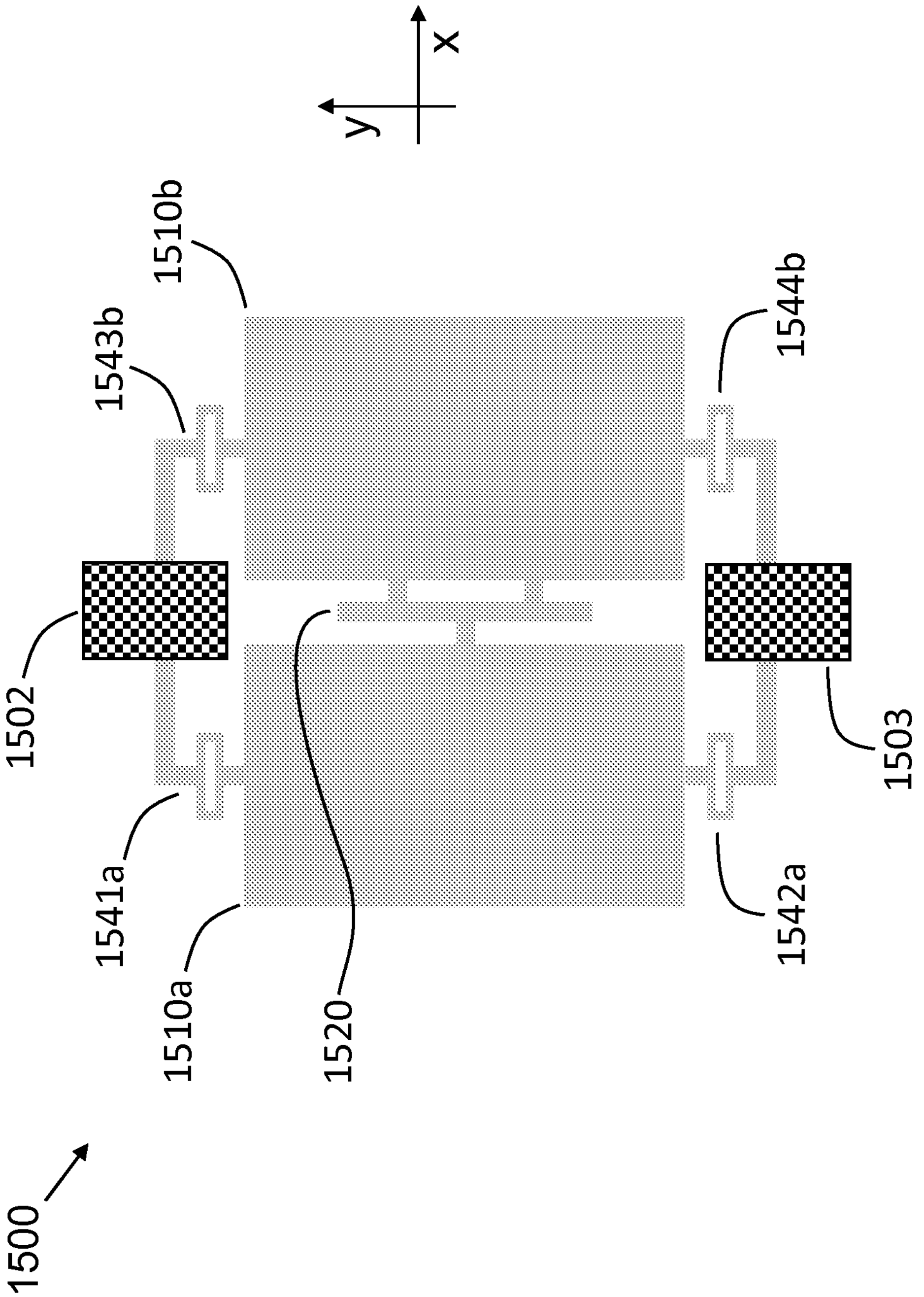
FIG. 18 shows two WE resonators tethered to central support structures.

There are also other embodiments which have a central support structure. The term central support structure means herein a support structure (102) which is placed within the plane, and/or below or above the plane (like the central pillar structure of the SE resonator discussed above), of the resonator element along a line which is in the middle of the extensional-mode resonators of the MEMS resonator assembly either in the x-direction or in the y-direction or in both x and y directions. In certain other embodiments, two LE resonators, connected via a flexural resonator, are both tethered to the same central support structure. An example of such an embodiment would be a MEMS resonator assembly like the one illustrated in FIG. 17 but with only one LE resonator within each interconnected LE resonator assembly. Another embodiment with a central support structure is illustrated in FIG. 18. In this embodiment, suspension elements 1541_a_, 1542_a_, 1543_b_, and 1544_b_ tether width-extensional mode resonators 1510_a_ and 1510_b_, connected via a flexural resonator 1520, to central support structures 1502 and 1503, placed along the line which is in the middle of the width-extensional mode resonators 1510_a_ and 1510_b_. Otherwise the embodiment of FIG. 18 is like the one discussed with reference to FIG. 11A-11B.

Figure 19:
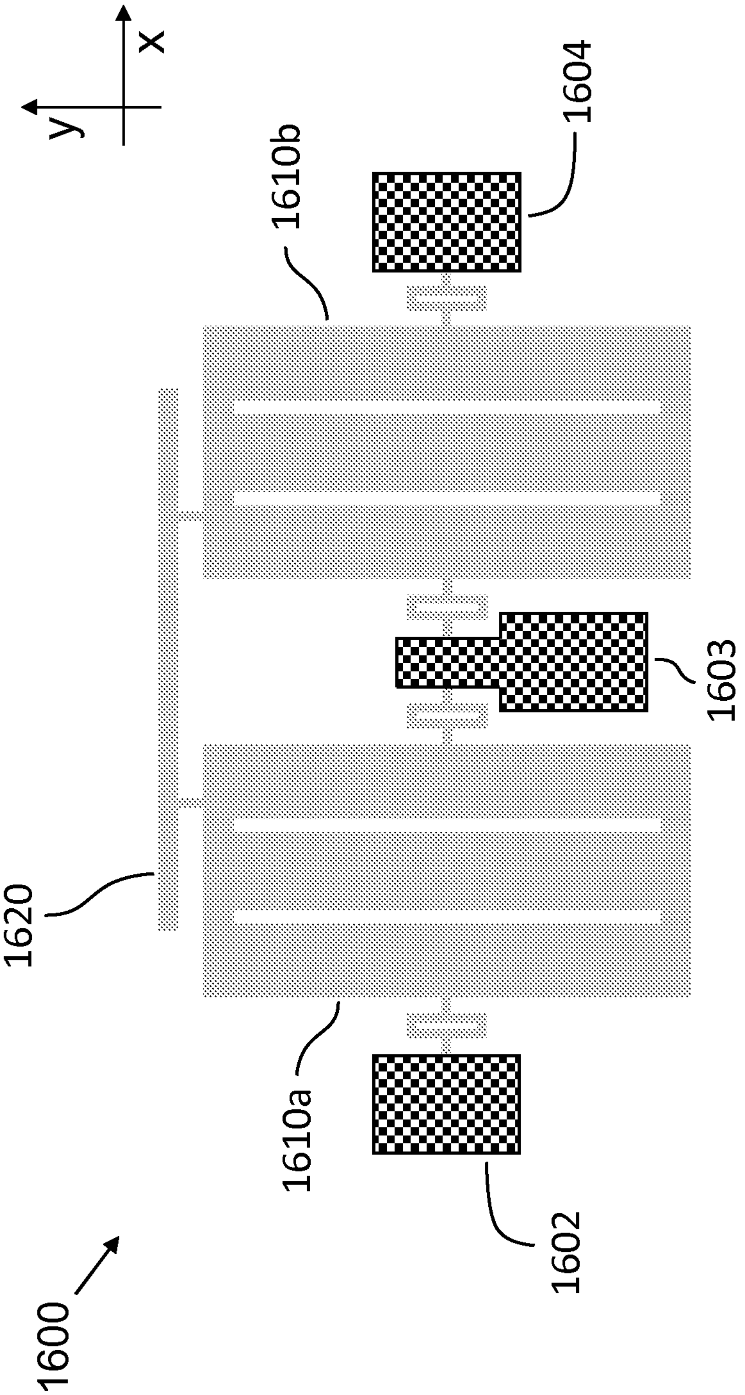
FIG. 19 shows yet another embodiment with a central support structure.

FIG. 19 illustrates yet another embodiment with a central support structure. In this embodiment, there are two interconnected LE resonator assemblies 1610_a_ and 1610_b_ which are coupled via a flexural mode resonator 1620. The resonator element of the MEMS resonator assembly 1600 is tethered to three support structures 1602, 1603, and 1604 one of which (1603) is a central support structure. Apart from the support structures and the associated suspension elements, the MEMS resonator assembly 1600 is like the assembly 1400 of FIG. 17. Use of several support structures in the MEMS resonator assembly 1600 reduces alternating current ohmic losses within the suspended structure because electrical resistance to the support structure is lowered (due to the short distance). Another advantage of several support structures (such as the central support structure) is the decreased sensitivity to g forces in the z-direction.

In some embodiments, the central support structure has an area (in the xy-plane of the resonator element) which is less than 0.04 $mm^2$. For example, the x and y dimensions of the central support structure may be 0.19 mm×0.19 mm or 0.1 mm×0.39 mm.

In certain embodiments which use piezoelectric actuation, galvanic contacts to the single-crystalline layer (including an opening in the piezoelectric layer and a contact pad illustrated by features 663 and 662 in FIG. 9C) and to the top electrode (including a contact pad illustrated by the feature 661 in FIG. 9C) are formed within the central support structure. The two contact pads 661 and 662 may be further connected to a through-silicon-via (TSV) structure through the cap wafer 108 in a wafer-level-packaged resonator (see FIG. 2B) or to bond wires within a ceramic package (see the discussion related to FIG. 2B).

Figure 20:
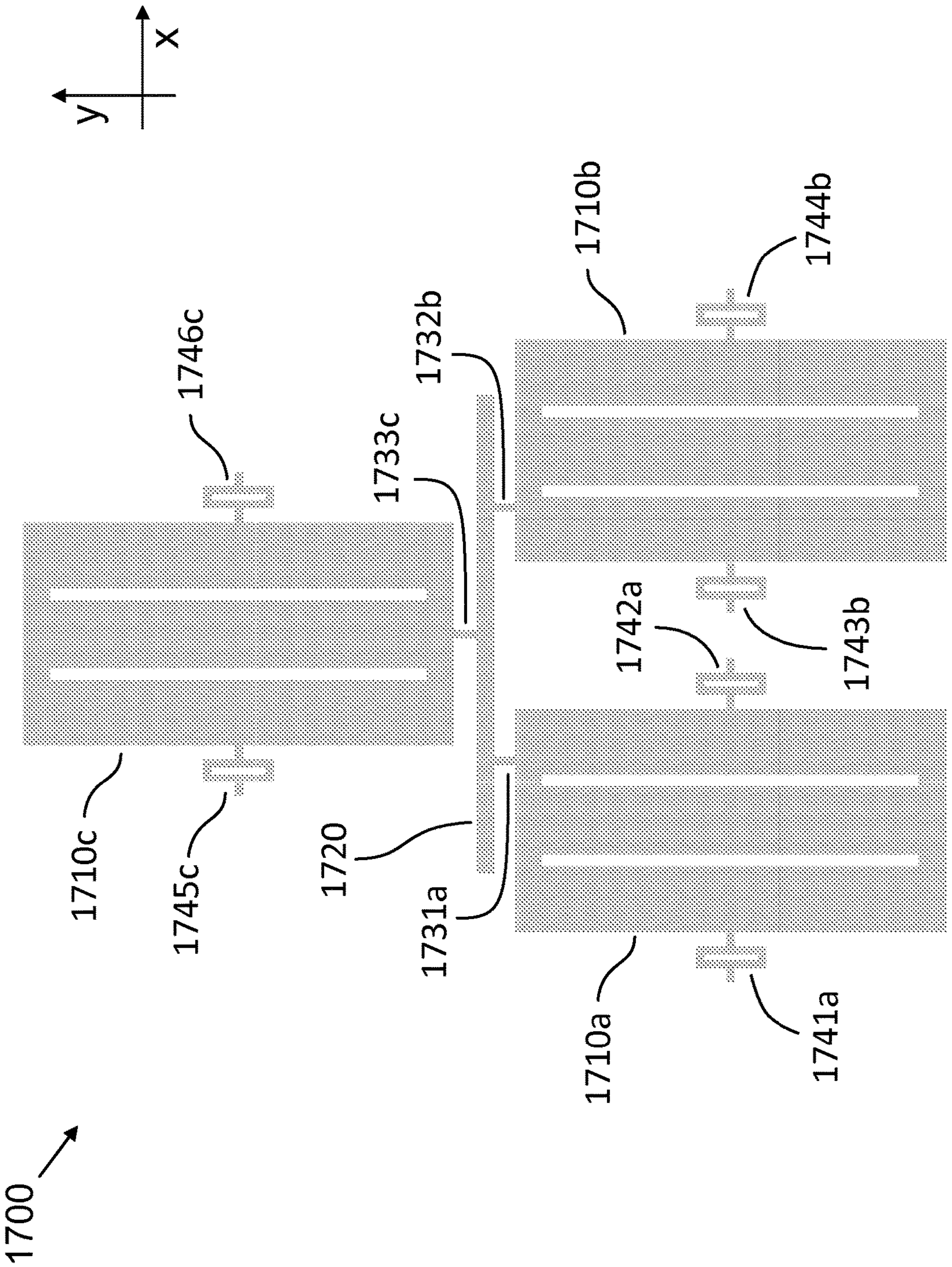
FIG. 20 shows a MEMS resonator assembly comprising three interconnected LE resonator assemblies and a flexural mode resonator coupled to distal ends of the interconnected LE resonator assemblies.

FIG. 20 shows a MEMS resonator assembly 1700 comprising three interconnected LE resonator assemblies 1710*a*, 1710*b*, 1710*c* and a (in-plane) flexural mode resonator 1720 coupled to the distal ends of the interconnected LE resonator assemblies. The three LE resonator assemblies have been arranged in two rows along the x axis so that the longitudinal axes of the interconnected LE resonator assemblies are aligned along the y direction. The assemblies 1710*a* and 1710*b* are in a lower row (i.e., in the row towards the negative y direction from the flexural resonator 1720) while the assembly 1710*c* is in the upper row (i.e., in the row towards the positive y direction from the flexural resonator 1720). The width W and length L of the flexural mode resonator 1720 are such that its third overtone resonance frequency substantially equals to the resonance frequencies of the extensional-mode resonators (here: interconnected LE resonator assemblies) 1710*a*, 1710*b*, 1710*c*. The three centermost anti-nodal points of the flexural resonator 1720 are populated with connector elements 1731*a*, 1732*b*, 1733*c* which couple these anti-nodal points to the adjacent distal-end side walls of the interconnected LE resonator assemblies 1710*a*, 1710*b*, 1710*c*, respectively. The interconnected LE resonator assemblies 1710*a*, 1710*b*, 1710*c* are tethered to a support structure (not shown) via suspension elements 1741*a*, 1742*a*, 1743*b*, 1744*b*, 1745*c*, 1746*c*. The whole MEMS resonator assembly 1700 vibrates in a collective resonance mode in which the motions of the extensional-mode resonators 1710*a*, 1710*b*, 1710*c* are substantially in the same phase with respect to each other.

In certain embodiments, the extensional-mode resonators have their principal axes of vibrations perpendicular to each other. An example of such an embodiment has been illustrated in FIGS. 21A-21B. The MEMS resonator assembly 1800 of FIG. 21A comprises two interconnected LE resonator assemblies 1810*a* and 1810*b* which have their principal directions of vibrations perpendicular to each other (the y direction for 1810*a* and the x direction for 1810*b*). The layout of the assembly 1800 is symmetric about the y axis. A first flexural mode resonator 1821 is coupled to the left distal end (in the negative x direction) of the interconnected LE resonator assembly 1810*b* and to the upper distal end (in the positive y direction) of the interconnected LE resonator 1810*a* using connector elements 1831*b* and 1831*a*, respectively. A second flexural mode resonator 1822 is coupled to the right distal end (in the positive x direction) of the interconnected LE resonator assembly 1810*b* and to the upper distal end (in the positive y direction) of the interconnected LE resonator 1810*a* using connector elements 1832*b* and 1832*a*, respectively. Both flexural mode resonators 1821 and 1822 consist of two rectangular frames (in this case: two identical square-shaped frames) and a substantially rigid connecting element between the two frames.

Figures 21A, 21B:
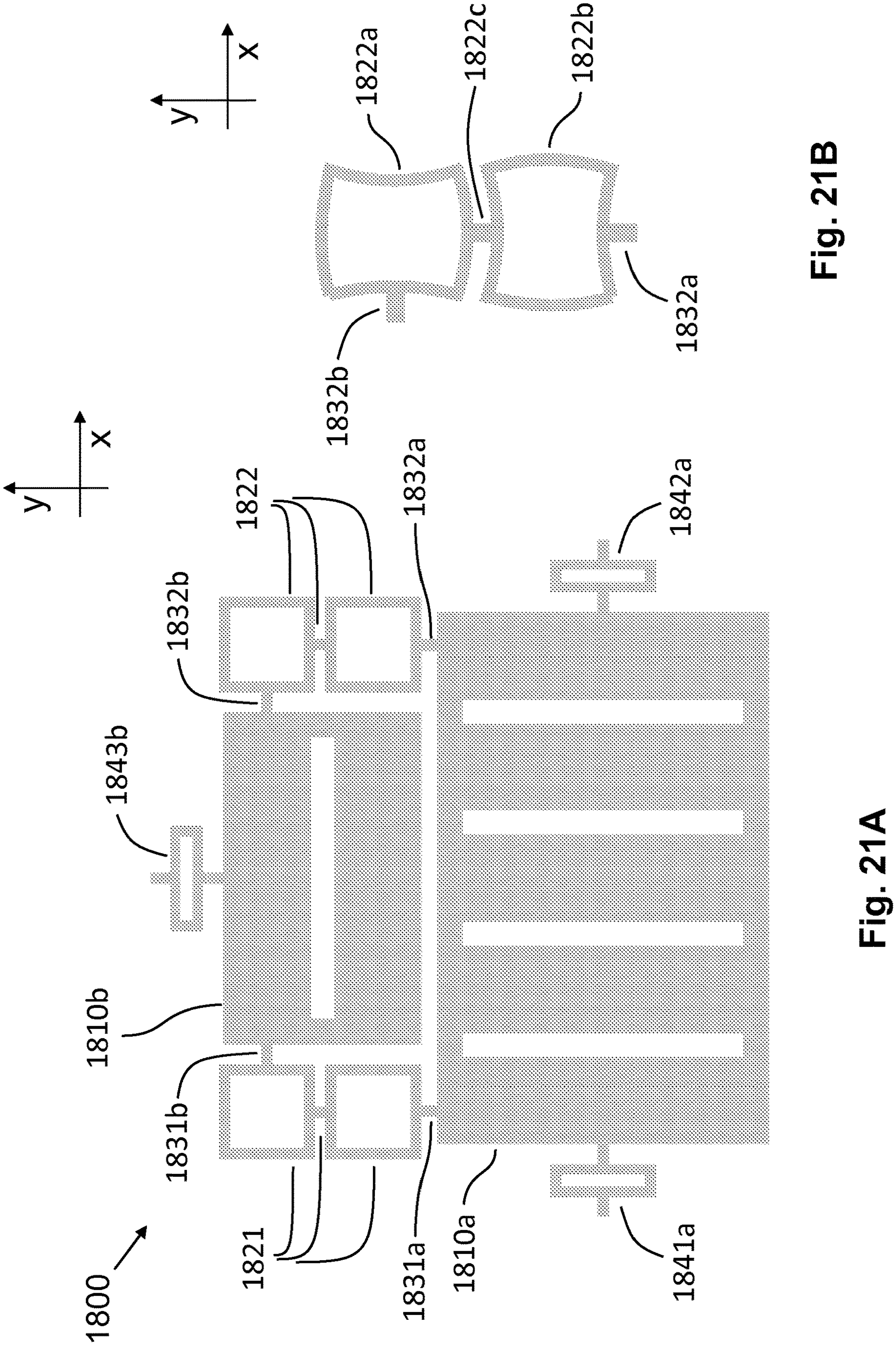
FIG. 21A shows extensional-mode resonators having their principal axes of vibrations perpendicular to each other.
FIG. 21B shows a shape of a flexural resonator of the embodiment of FIG. 21A under the resonance.

The shape of the flexural resonator 1822 under the resonance is illustrated in FIG. 21B. The opposite sides of the two frames 1822*a* and 1822*b* move alternatively either inwards or outwards during the resonance vibration and the adjacent sides of the two frames move to different directions with respect to each other (either inwards or outwards). The two sides of the frames 1822*a* and 1822*b* which are connected to the substantially rigid connecting element 1822*c* move in the same direction in the y direction but in opposite directions with respect to the centers of the respective frames (either inwards or outwards). Therefore, the resonance motion of the flexural mode resonator 1822 is such that when the connector element 1832*a* moves in the positive y direction the connector element 1832*b* moves in the positive x direction as illustrated in FIG. 21B. The rectangular frames 1822*a* and 1822*b* are dimensioned so that their resonance frequencies substantially equal each other and the resonance frequencies of the interconnected LE resonator assemblies 1810*a* and 1810*b*. The mode shape of the flexural mode resonator 1822 at the resonance is such that the magnitude of the motion of the connector element 1832*a* in the positive y direction substantially equals the magnitude of the motion of the connector element 1832*b* in the positive x direction. Therefore, the effect of the flexural mode resonator 1822, as well as the flexural mode resonator 1821, is that the whole MEMS resonator assembly 1800 vibrates in a collective resonance mode in which the motions of the extensional-mode resonators (here: interconnected LE resonator assemblies) 1810*a*, 1810*b* having their principal directions of vibrations perpendicular to each other are substantially in the same phase with respect to each other. The resonator element of the MEMS resonator assembly 1800 is tethered by three suspension elements of which two suspension elements 1841*a* and 1842*a* are connected to the extensional-mode resonator 1810*a* and the suspension element 1843*b* is connected to the extensional-mode resonator 1810*b*. The whole structure illustrated in FIG. 21A is a suspended structure.

Figure 21C:
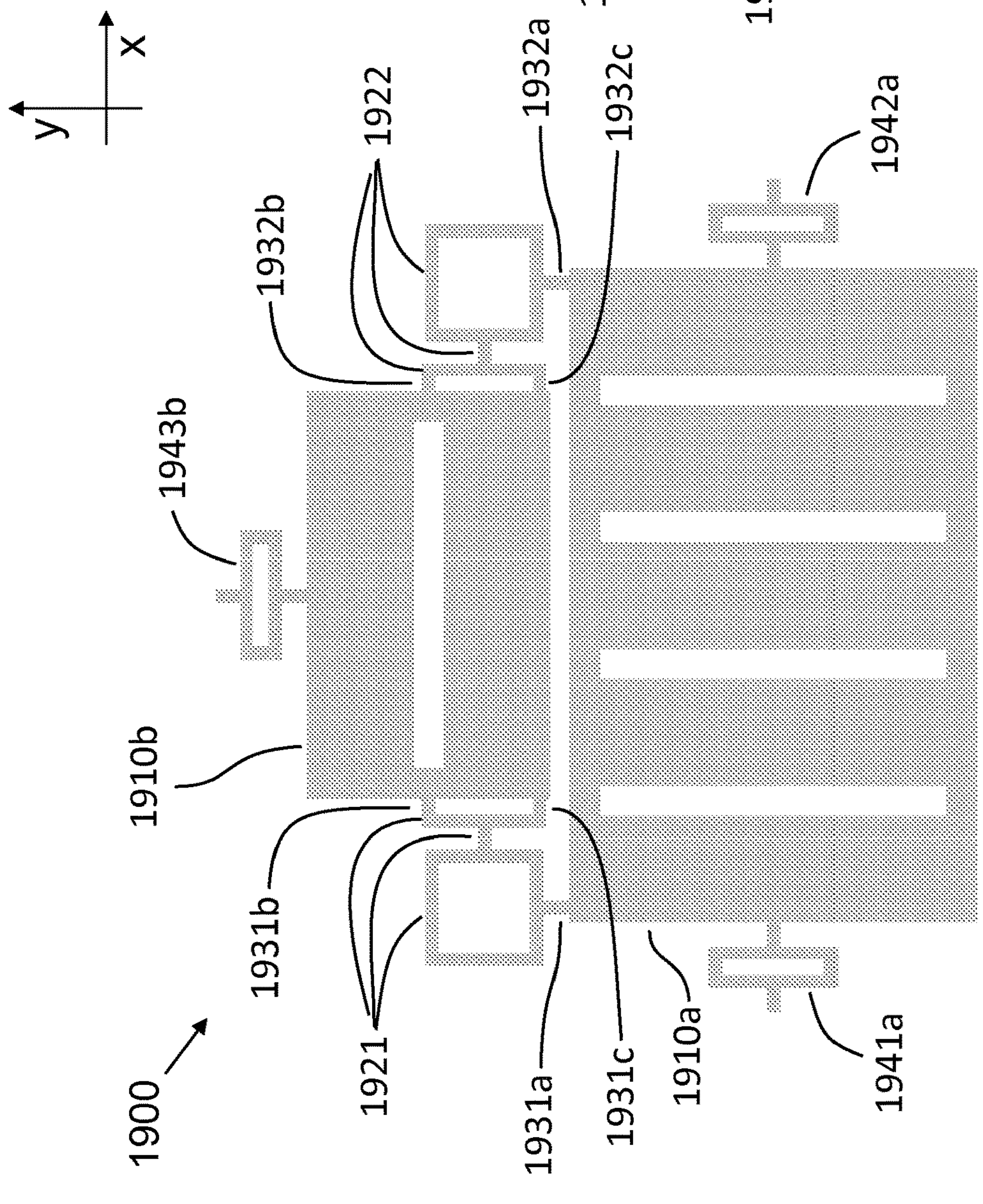
FIG. 21C shows another embodiment of extensional-mode resonators having their principal axes of vibrations perpendicular to each other.
Figure 21D:
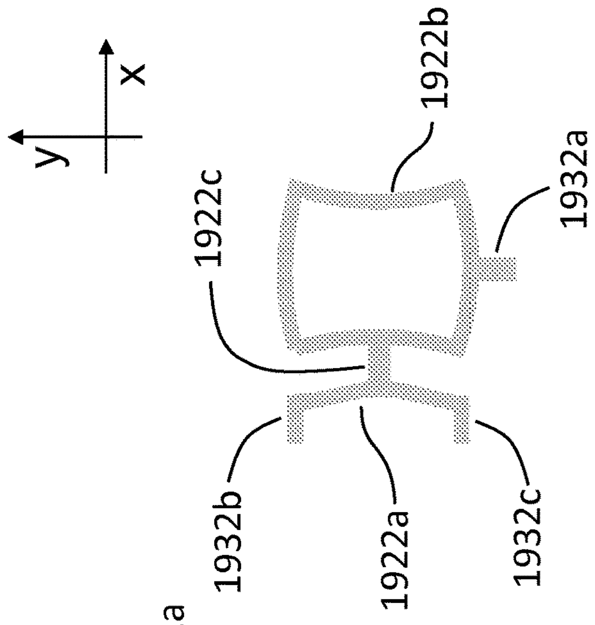
FIG. 21D shows a shape of a flexural resonator of the embodiment of FIG. 21C under the resonance.

Another embodiment with similar technical effects has been illustrated in FIGS. 21C-21D. The MEMS resonator assembly 1900 of FIG. 21C comprises two interconnected LE resonator assemblies 1910*a* and 1910*b* which have their principal directions of vibrations perpendicular to each other (the y direction for 1910*a* and the x direction for 1910*b*). The layout of the assembly 1900 is symmetric about the y axis. A first flexural mode resonator 1921 is coupled to the left distal end (in the negative x direction) of the interconnected LE resonator assembly 1910*b* using connector elements 1931*b* and 1931*c* and to the upper distal end (in the positive y direction) of the interconnected LE resonator 1910*a* using connector element 1931*a*. A second flexural mode resonator 1922 is coupled to the right distal end (in the positive x direction) of the interconnected LE resonator assembly 1910*b* using connector elements 1932*b* and 1932*c* and to the upper distal end (in the positive y direction) of the interconnected LE resonator 1910*a* using connector element 1932*a*. Both flexural mode resonators 1921 and 1922 consist of a flexural beam resonator and a rectangular frame (in this case: a square-shaped frame) and a substantially rigid connecting element between the flexural beam resonator and the rectangular frame. The shape of the flexural resonator 1922 under the resonance is illustrated in FIG. 21D. The opposite sides of the frame 1922*b* move alternatively either inwards or outwards during the resonance vibration and the adjacent sides of the two frames move to different directions with respect to each other (either inwards or outwards). The flexural beam resonator 1922*a*, with its longitudinal axis along the y direction, is connected to the frame 1922*b* at a distance from the resonator 1922*a* towards the positive x direction, using a substantially rigid connecting element 1922*c*. In the exemplary embodiment of FIGS. 21D, the 1st overtone frequency of flexural beam resonator 1922*a* and resonance frequency of the rectangular frame 1922*b* are substantially equal, and equal to the resonance frequencies of the interconnected LE resonator assemblies 1910*a* and 1910*b*. Therefore, the resonance motion of the flexural mode resonator 1922 is such that when the connector element 1932*a* moves in the negative y direction the connector elements 1932*b* and 1932*c* move in the negative x direction as illustrated in FIG. 21D. Therefore, the effect of the flexural mode resonator 1922, as well as the flexural mode resonator 1921, is that the whole MEMS resonator assembly 1900 vibrates in a collective resonance mode in which the motions of the extensional-mode resonators (here: interconnected LE resonator assemblies) 1910*a*, 1910*b* having their principal directions of vibrations perpendicular to each other are substantially in the same phase with respect to each other. The resonator element of the MEMS resonator assembly 1900 is tethered by three suspension elements of which two suspension elements 1941*a* and 1942*a* are connected to the extensional-mode resonator 1910*a* and the suspension element 1943*b* is connected to the extensional-mode resonator 1910*b*. The whole structure illustrated in FIG. 21C is a suspended structure.

Embodiments in which a flexural resonator connects extensional-mode resonators with their principal axes of vibrations perpendicular to each other can be used to minimize the product of the equivalent series resistance and the area needed for the resonator element (ESR*A). In some embodiments, the optimal ESR*A is obtained for a resonator element area which has a form close to a square (like in the exemplary embodiments of FIG. 21A and FIG. 21C). In certain embodiments, the area A of the resonator element is in the range from 0.001 $mm^2$ to 1 $mm^2$.

Figure 21F:
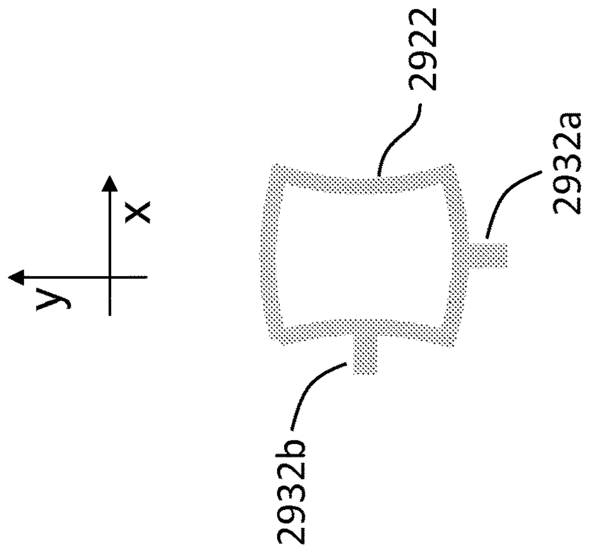
FIG. 21F shows a shape of a flexural resonator of the embodiment of FIG. 21E under the resonance.
Figure 21E:
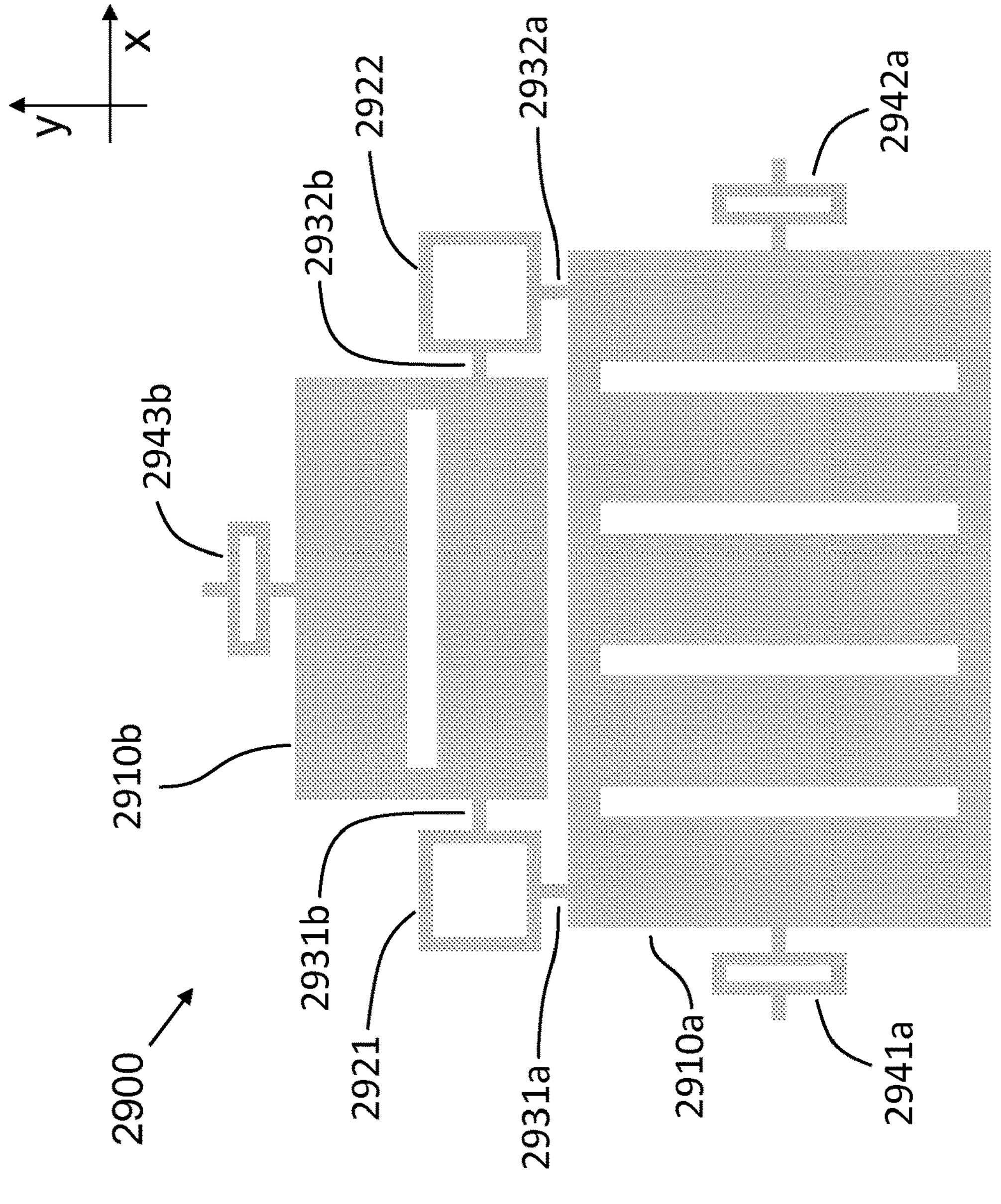
FIG. 21E shows an embodiment of extensional-mode resonators with 180 degrees phase shift and their principal axes of vibrations perpendicular to each other.

The MEMS resonator assembly 2900 of FIG. 21E comprises two interconnected LE resonator assemblies 2910*a* and 2910*b* which have their principal directions of vibrations perpendicular to each other (the y direction for 2910*a* and the x direction for 2910*b*). The layout of the assembly 2900 is symmetric about the y axis. A first flexural mode resonator 2921 is coupled to the left distal end (in the negative x direction) of the interconnected LE resonator assembly 2910*b* using connector element 2931*b* and to the upper distal end (in the positive y direction) of the interconnected LE resonator 2910*a* using connector element 2931*a*. A second flexural mode resonator 2922 is coupled to the right distal end (in the positive x direction) of the interconnected LE resonator assembly 2910*b* using connector element 2932*b* and to the upper distal end (in the positive y direction) of the interconnected LE resonator 2910*a* using connector element 2932*a*. Both flexural mode resonators 2921 and 2922 consist of a rectangular frame (in this case: a square-shaped frame). The shape of the flexural resonator 2922 under the resonance is illustrated in FIG. 21F. The opposite sides of the frame 2922 move alternatively either inwards or outwards during the resonance vibration and the adjacent sides of the two frames move to different directions with respect to each other (either inwards or outwards). In the exemplary embodiment of FIGS. 21F, the resonance frequency of the flexural resonator 2922 is substantially equal to the resonance frequencies of the interconnected LE resonator assemblies 2910*a* and 2910*b*. Therefore, the resonance motion of the flexural mode resonator 2922 is such that when the connector element 2932*a* moves in the negative y direction the connector element 2932*b* moves in the positive x direction as illustrated in FIG. 21F. Therefore, the effect of the flexural mode resonator 2922, as well as the flexural mode resonator 2921, is that the whole MEMS resonator assembly 2900 vibrates in a collective resonance mode in which the motions of the extensional-mode resonators (here: interconnected LE resonator assemblies) 2910*a*, 2910*b* having their principal directions of vibrations perpendicular to each other are substantially in 180 degrees shifted phase with respect to each other so that when the extensional-mode resonator 2910*a* is maximally contracted, the extensional-mode resonator 2910*b* is maximally extended. The resonator element of the MEMS resonator assembly 2900 is tethered by three suspension elements of which two suspension elements 2941*a* and 2942*a* are connected to the extensional-mode resonator 2910*a* and the suspension element 2943*b* is connected to the extensional-mode resonator 2910*b*. The whole structure illustrated in FIG. 21E is a suspended structure.

Figure 22:
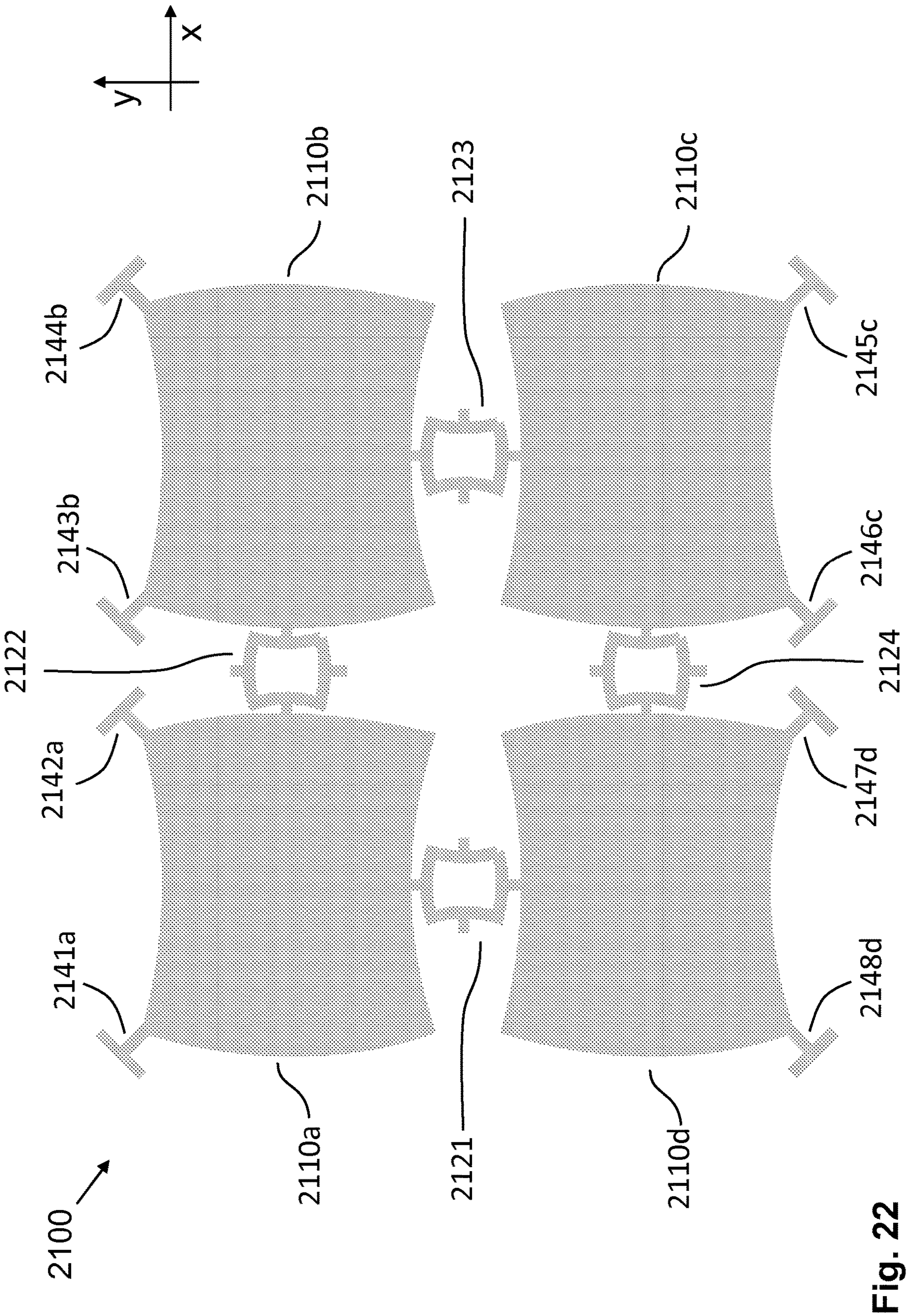
FIG. 22 shows a MEMS resonator assembly comprising Lame mode resonators coupled by flexural resonators.

In certain embodiments, the MEMS resonator assembly comprises a Lame mode resonator. In the MEMS resonator assembly 2100 illustrated in FIG. 22, there are four Lame mode resonators 2110*a*, 2110*b*, 2110*c*, and 2110*d* positioned in a 2×2 array configuration and four flexural mode resonators 2121-2124, each connected to two adjacent Lame mode resonators. The Lame resonators have the form of a square plate in the xy plane. The flexural mode resonators 2121-2124 have of the form of a rectangular frame (in this case: a square-shaped frame). The shape of the resonator assembly 2100 has been illustrated in an exaggerated way in the collective resonance to show the mode shape which consists of the fundamental Lame modes and the fundamental flexural modes of the resonators 2121-2124. In the fundamental Lame mode, adjacent the central side walls of the square plate are moving (either extending or contracting) in 180 degrees shifted phase with respect to each other as illustrated in FIG. 22. The opposite side walls of two adjacent Lame resonators are coupled via a flexural resonator connected to the (anti-nodal) center points of the two side walls. The opposite sides of the frame-shaped flexural resonators 2121-2124 move alternatively either inwards or outwards during the resonance vibration and the adjacent sides of the two frames move to different directions with respect to each other (either inwards or outwards) (similarly to the resonator 2922 of FIG. 21F). The dimensions of the beams forming the rectangular frames 2121-2124 have been chosen so that the resonance frequencies of the flexural resonators 2121-2124 are substantially equal to the resonance frequencies of the Lame mode resonators 2110*a*, 2110*b*, 2110*c*, and 2110*d*. Therefore, the effect of the flexural resonator couplers is to synchronize the Lame resonators so that the MEMS resonator assembly 2100 vibrates in a collective resonance mode in which the motions of the extensional-mode resonators 2110*a*, 2110*b*, 2110*c*, and 2110*d* are substantially in the same phase with respect to each other. The whole structure illustrated in FIG. 22 is a suspended structure. The corner points are nodal points of the fundamental Lame mode and suspension elements are therefore connected to these points (in the illustrated embodiment, only 8 suspension elements 2141*a*, 2142*a*, 2143*b*, 2144*b*, 2145*c*, 2146*c*, 2147*d*, 2148*d* have been connected to the 16 corners).

Figure 23:
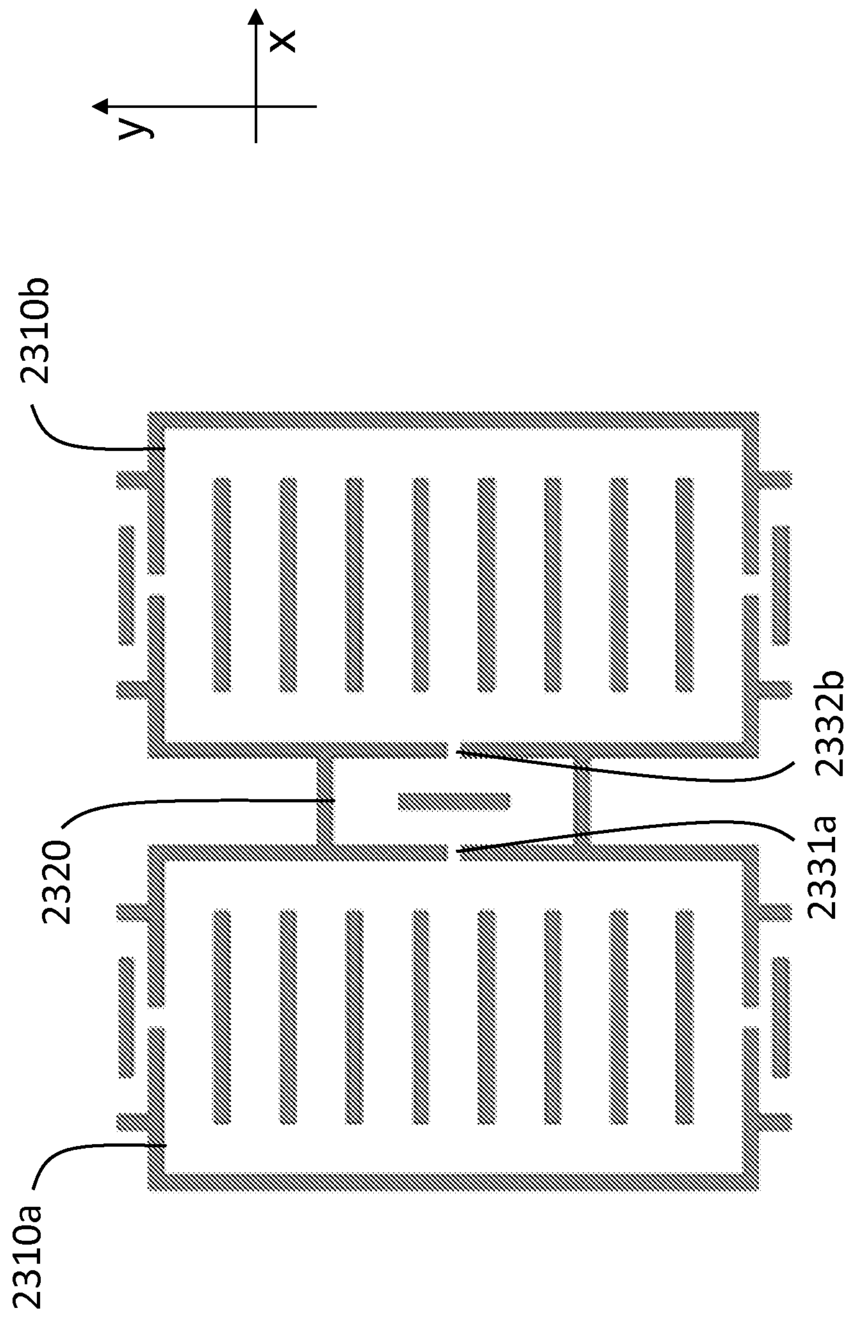
FIG. 23 shows yet an alternative embodiment with a symmetric flexural mode resonator connecting two extensional-mode resonators.

FIG. 23 shows a further embodiment of a MEMS resonator assembly in which a flexural mode resonator (herein:

2320) mechanically connects two bulk acoustic resonators 2310*a* and 3210*b*. The structure and operation of the MEMS resonator assembly of FIG. 23 otherwise corresponds to the structure and operation of the MEMS resonator assemblies described in the preceding embodiments, but the structure differs in the connector elements connecting the flexural resonator 2320 and the bulk acoustic resonators (or extensional-mode resonators) 2310*a* and 3210*b*. The said connector elements in the MEMS resonator assembly of FIG. 23 are symmetrically positioned (instead of asymmetric positioning in certain embodiments in the preceding). Accordingly, the connector element 2331*a* connecting a first bulk acoustic resonator 2310*a* and the flexural mode resonator 2320 is in the y direction at the same position as the connector element 2332*b* that connects a second bulk acoustic resonator 2310*b* and the flexural mode resonator 2320. Further, the flexural mode resonator 2320 is in the example shown in FIG. 23 formed of two parallel (flexurally) resonating beams connected with each other at both ends thereof. The said connector elements 2331*a* and 2332*b* connect the respective beams and the respective bulk acoustic resonators at an anti-nodal point of a respective beam (in the middle point or middle region of a side edge of the beam). Accordingly, in certain embodiments, the middle points or middle regions of the beams of the flexural resonators 2320 are connected with middle points or middle regions of side edges of the respective bulk acoustic resonators. An advantage of such a symmetric structure shown in FIG. 23 is reduced sensitivity to process variations. A parasitic resonance spectrum for structures with symmetrically positioned connector elements is different from the parasitic resonance spectrum for structures with asymmetrically positioned connector elements. Accordingly, when a parasitic resonance occurring in MEMS resonator assemblies having asymmetrically positioned connector elements needs to be avoided, this can be provided e.g. with the structure shown in FIG. 23 or the like.

A person skilled in the art understands in the light of the above exemplary embodiments, that all the above exemplary embodiments of MEMS resonator assemblies may comprise an actuator for exciting the resonator to a resonance mode and the actuator may be piezoelectrical or electrostatic as discussed above in reference to FIGS. 9A-9C and 10A-10D. In certain embodiments, a piezoresistive sensor is used to measure the vibration motion of the resonator element.

The bulk acoustic resonators which are members of the MEMS resonator assembly (100, . . . ) do not need to be of the same type. In some embodiments, for example, the MEMS resonator assembly comprises an interconnected length-extensional (LE) resonator assembly and a square-extensional mode (SE) resonator. In another exemplary embodiment, the MEMS resonator assembly comprises a SE mode resonator and a width-extensional (WE) mode resonator. In yet another exemplary embodiment, the MEMS resonator assembly comprises a LE mode resonator and an interconnected LE resonator assembly. Yet other alternative embodiments are provided when the order of resonance mode is considered. In addition to embodiments in which the bulk acoustic resonators vibrate in the fundamental frequency, there are embodiments in which at least one of the bulk acoustic resonators vibrates at an overtone frequency which is substantially equal to the resonance frequency of the collective resonance mode of the MEMS resonator assembly.

Without limiting the scope and interpretation of the patent claims, certain technical effects of one or more of the example embodiments disclosed herein are listed in the following. A technical effect is a low ESR of the resonator. Another technical effect is the design freedom in the layout of the resonator element on a die. Yet further technical effects include high power-handling capacity and low sensitivity to thermomechanical stresses.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A microelectromechanical system, MEMS, resonator assembly, comprising a support structure;

a resonator element suspended to the support structure; and an actuator for exciting the resonator element to a resonance mode, wherein the resonator element comprises two bulk acoustic resonators and a flexural mode resonator, the said flexural mode resonator mechanically connects the two bulk acoustic resonators, and the MEMS resonator assembly is configured to vibrate in a collective resonance mode in which motions of the two bulk acoustic resonators are substantially in the same or 180 degrees shifted phase with respect to each other, wherein a distance between the two bulk acoustic resonators is 50 μm or less.

2. The MEMS resonator assembly of claim 1, wherein at least one of the two bulk acoustic resonators is a length-extensional resonator, an assembly of interconnected length-extensional resonators, a width-extensional resonator, a square-extensional resonator, or a Lame resonator, and/or wherein the two bulk acoustic resonators are in-plane resonators.

3. The MEMS resonator assembly of claim 1, wherein one extending end or one extending side of a first of the two bulk acoustic resonators is connected by the flexural mode resonator with one extending end or one extending side of a second of the two bulk acoustic resonators.

4. The MEMS resonator assembly of claim 1, wherein the two bulk acoustic resonators resonate in a direction of vibration, and the flexural mode resonator is a beam resonator having a longest dimension, the longest dimension being oriented perpendicular to said direction of vibration.

5. The MEMS resonator assembly of claim 1, wherein a Nth overtone frequency of the flexural mode resonator substantially equals a frequency of the said collective resonance mode, and/or wherein the frequency of the said collective resonance mode substantially equals a fundamental or a Nth overtone frequency of the first bulk acoustic resonator and a fundamental or a Nth overtone frequency of a second bulk acoustic resonator of the two bulk acoustic resonators.

6. The MEMS resonator assembly of claim 1, wherein the flexural mode resonator is an in-plane flexural beam resonator.

7. The MEMS resonator assembly of claim 1, wherein the flexural mode resonator is mechanically connected to the two bulk acoustic resonators at anti-nodal points of the two bulk acoustic resonators, or wherein the two bulk acoustic resonators are mechanically connected to the flexural mode resonator at anti-nodal points of the flexural mode resonator.

8. The MEMS resonator assembly of claim 1, wherein the flexural mode resonator is mechanically connected to a first of the two bulk acoustic resonators at one or more connection points on a first side of the flexural mode resonator and to a second of the two bulk acoustic resonators at one or more connection points on a second, opposite, side of the flexural mode resonator, or wherein the flexural mode resonator is mechanically connected to a first of the two bulk acoustic resonators at one or more connection points on one side of the flexural mode resonator and to a second of the two bulk acoustic resonators at one or more connection points on the same side of the flexural mode resonator.

9. The MEMS resonator assembly of claim 1, wherein a resonance mode shape of the flexural mode resonator has two types of anti-nodal points wherein anti-nodal point(s) of the first type has/have a positive displacement along an axis of vibration and at least one of them is a connection point for a mechanical connection to a first of the two bulk acoustic resonators, and anti-nodal point(s) of the second type has/have a negative displacement along the said axis of vibration and at least one of them is a connection point for a mechanical connection to a second of the two bulk acoustic resonators.

10. The MEMS resonator assembly of claim 1, wherein the actuator is a piezoelectric or an electrostatic actuator.

11. The MEMS resonator assembly of claim 1, wherein more than 50% of a mass of the resonator element consists of single-crystalline silicon.

12. The MEMS resonator assembly of claim 1, wherein a first of the two bulk acoustic resonators and the flexural mode resonator are connected by a first number of connector elements and a second of the two bulk acoustic resonators and the flexural mode resonator are connected by a second number of connector elements, wherein the first number deviates from the second number, or wherein a first of the two bulk acoustic resonators and the flexural mode resonator are connected by a first number of connector elements and a second of the two bulk acoustic resonators and the flexural mode resonator are connected by a second number of connector elements, wherein the first number is equal to the second number.

13. The MEMS resonator assembly of claim 1, wherein a cavity separates the resonator element from the support structure.

14. The MEMS resonator assembly of claim 1, wherein the resonator element comprises a layer of piezoelectric AlN, Sc-doped AlN, ZnO, $LiNbO_3$, or $LiTaO_3$.

15. The MEMS resonator assembly of claim 1, wherein the resonator element comprises a layer of piezoelectric with a thickness in the range from 0.5 μm to 4 μm.

16. The MEMS resonator assembly of claim 1, wherein a first of the two bulk acoustic resonators and a second of the two bulk acoustic resonators are tethered to the same support structure which is formed within a plane of the resonator element along a line which is in the middle of the first and second bulk acoustic resonators.

17. The MEMS resonator assembly of claim 1, wherein a first of the two bulk acoustic resonators resonates in a first direction of vibration and a second of the two bulk acoustic resonators resonates in a second direction of vibration perpendicular to the first direction of vibration.

18. The MEMS resonator assembly of claim 1, wherein the flexural mode resonator comprises a material portion which has a form of a rectangular frame.

19. The MEMS resonator assembly of claim 1, wherein the frequency of the said collective resonance mode is in the range from 7 MHz to 160 MHz.

* * * * *